(12) United States Patent
Campbell et al.

(10) Patent No.: US 11,635,579 B2
(45) Date of Patent: Apr. 25, 2023

(54) BLADED CHASSIS SYSTEMS

(71) Applicant: CommScope Technologies LLC, Hickory, NC (US)

(72) Inventors: Brent Campbell, Minneapolis, MN (US); Jonathan R. Kaml, Shakopee, MN (US); Rodney C. Schoenfelder, Shakopee, MN (US); Dennis Krampotich, Shakopee, MN (US); David J. Johnsen, Plymouth, MN (US); James J. Solheid, Lakeville, MN (US); Matthew J. Holmberg, Le Center, MN (US)

(73) Assignee: COMMSCOPE TECHNOLOGIES LLC, Hickory, NC (US)

( * ) Notice: Subject to any disclaimer, the term of this patent is extended or adjusted under 35 U.S.C. 154(b) by 44 days.

(21) Appl. No.: 17/330,953

(22) Filed: May 26, 2021

(65) Prior Publication Data
US 2021/0349276 A1 Nov. 11, 2021

Related U.S. Application Data

(63) Continuation of application No. 15/748,019, filed as application No. PCT/US2016/044580 on Jul. 28, 2016, now Pat. No. 11,022,770.
(Continued)

(51) Int. Cl.
*G02B 6/44* (2006.01)
*G06F 1/18* (2006.01)
(Continued)

(52) U.S. Cl.
CPC .......... *G02B 6/4452* (2013.01); *G02B 6/445* (2013.01); *G06F 1/183* (2013.01); *G06F 1/187* (2013.01);
(Continued)

(58) Field of Classification Search
CPC ....... G02B 6/4452; G02B 6/445; G02F 1/187; G02F 1/183; G02F 1/189; H04Q 1/02; H04Q 1/023; H05K 7/1489; H05K 7/1487
See application file for complete search history.

(56) References Cited

U.S. PATENT DOCUMENTS 5,823,646 A 10/1998 Arizpe et al.
D466,087 S 11/2002 Cuny et al.
(Continued)

FOREIGN PATENT DOCUMENTS

EP 2 440 027 A1 4/2012
EP 2 534 847 A2 12/2012
WO 2017/083300 A1 5/2017

OTHER PUBLICATIONS

International Search Report and Written Opinion of the International Searching Authority for corresponding International Patent Application No. PCT/US2016/044580 dated Jan. 9, 2017, 20 pages.
(Continued)

*Primary Examiner* — Thomas A Hollweg
*Assistant Examiner* — Mary A El-Shammaa
(74) *Attorney, Agent, or Firm* — Merchant & Gould P.C.

(57) ABSTRACT

A bladed chassis system facilitates installation of the bladed chassis system and replacement of the blades at the chassis. Blades can be inserted and removed from the front and/or the rear of the bladed chassis system at the discretion of the user. Blades can be moved between discrete positions. In examples, blades can be one-handedly released from the chassis to allow movement between discrete positions. In examples, accidental movement past a discrete position is inhibited. Accidental removal of the blades from the chassis is inhibited. The chassis and blades cooperate to manage the optical fiber cables routed through a cable port in the chassis to the blades.

20 Claims, 50 Drawing Sheets

Related U.S. Application Data

(60) Provisional application No. 62/340,269, filed on May 23, 2016, provisional application No. 62/338,226, filed on May 18, 2016, provisional application No. 62/288,339, filed on Jan. 28, 2016, provisional application No. 62/287,805, filed on Jan. 27, 2016, provisional application No. 62/198,456, filed on Jul. 29, 2015.

(51) Int. Cl.
*H05K 7/14* (2006.01)
*H04Q 1/02* (2006.01)

(52) U.S. Cl.
CPC ............ *G06F 1/189* (2013.01); *H04Q 1/02* (2013.01); *H04Q 1/023* (2013.01); *H05K 7/1487* (2013.01); *H05K 7/1489* (2013.01)

(56) References Cited

U.S. PATENT DOCUMENTS

| | | | |
|---|---|---|---|
| 6,621,692 B1 | 9/2003 | Johnson et al. |
| 7,106,596 B1 | 9/2006 | Reznikov |
| 7,570,860 B2 | 8/2009 | Smrha et al. |
| 7,570,861 B2 | 8/2009 | Smrha et al. |
| 7,873,252 B2 | 1/2011 | Smrha et al. |
| 7,873,253 B2 | 1/2011 | Smrha et al. |
| 8,184,938 B2 | 5/2012 | Cooke et al. |
| 8,229,265 B2 | 7/2012 | Solheid et al. |
| 8,340,490 B2 | 12/2012 | Smrha et al. |
| 8,422,847 B2 | 4/2013 | Kowalczyk et al. |
| 8,641,313 B1 | 2/2014 | Crippen et al. |
| 8,798,429 B2 | 8/2014 | Kowalczyk et al. |
| 8,867,884 B2 | 10/2014 | Smrha et al. |
| 8,923,013 B2 | 12/2014 | Anderson et al. |
| 8,934,252 B2 | 1/2015 | Anderson et al. |
| 8,934,253 B2 | 1/2015 | Anderson et al. |
| 8,953,921 B2 | 2/2015 | Smrha et al. |
| 9,020,319 B2 | 4/2015 | Anderson et al. |
| 9,097,871 B2 | 8/2015 | Smrha et al. |
| 9,198,320 B2 | 11/2015 | Anderson et al. |
| 9,213,363 B2 | 12/2015 | Anderson et al. |
| 9,223,105 B2 | 12/2015 | Anderson et al. |
| 9,265,172 B2 | 2/2016 | Anderson et al. |
| 9,448,377 B2 | 9/2016 | Kowalczyk et al. |
| 9,532,481 B2 | 12/2016 | Anderson et al. |
| 9,532,482 B2 | 12/2016 | Anderson et al. |
| 9,549,484 B2 | 1/2017 | Anderson et al. |
| 9,709,765 B2 | 7/2017 | Wells et al. |
| 9,885,846 B2 | 2/2018 | Kowalczyk et al. |
| 2006/0018622 A1 | 1/2006 | Caveney et al. |
| 2006/0269205 A1 | 11/2006 | Zimmel |
| 2007/0189692 A1 | 8/2007 | Zimmel et al. |
| 2008/0079341 A1 | 4/2008 | Anderson et al. |
| 2008/0175552 A1 | 7/2008 | Smrha et al. |
| 2009/0245743 A1 | 10/2009 | Cote |
| 2010/0054684 A1 | 3/2010 | Cooke et al. |
| 2010/0086275 A1 | 4/2010 | Krampotich et al. |
| 2010/0322579 A1 | 12/2010 | Cooke et al. |
| 2011/0267794 A1 | 11/2011 | Anderson et al. |
| 2011/0317974 A1 | 12/2011 | Krampotich et al. |
| 2012/0114295 A1 | 5/2012 | Guzzo et al. |
| 2013/0163218 A1 | 6/2013 | Kostecka |
| 2014/0003782 A1 | 1/2014 | Blackwell, Jr. et al. |
| 2014/0219614 A1 | 8/2014 | Marcouiller et al. |
| 2014/0219615 A1 | 8/2014 | Petersen et al. |
| 2014/0265794 A1 | 9/2014 | Schroeder et al. |
| 2014/0334790 A1 | 11/2014 | Zhang |
| 2014/0374366 A1 | 12/2014 | Tsai |
| 2015/0177780 A1 | 6/2015 | Anderson et al. |
| 2015/0195945 A1 | 7/2015 | Anderson et al. |
| 2015/0219869 A1 | 8/2015 | Anderson et al. |
| 2015/0226926 A1 | 8/2015 | Ogren et al. |
| 2015/0245530 A1 | 8/2015 | Anderson et al. |
| 2015/0286021 A1 | 10/2015 | Smrha et al. |
| 2015/0331214 A1 | 11/2015 | Smrha et al. |
| 2015/0331215 A1 | 11/2015 | Smrha et al. |
| 2015/0331216 A1 | 11/2015 | Smrha et al. |
| 2015/0370025 A1 | 12/2015 | Wells et al. |
| 2016/0187589 A1 | 6/2016 | Fletcher |
| 2016/0309606 A1 | 10/2016 | Anderson et al. |
| 2017/0315320 A1 | 11/2017 | Wells et al. |
| 2017/0315321 A1 | 11/2017 | Wells et al. |
| 2018/0172939 A1 | 6/2018 | Kowalczyk et al. |

OTHER PUBLICATIONS

Partial Supplementary European Search Report for corresponding European Patent Application No. 16831379.9 dated Jan. 24, 2019, 12 pages.

Extended European Search Report for corresponding European Patent Application No. 16831379.9 dated May 14, 2019, 14 pages.

BLADED CHASSIS SYSTEMS

CROSS-REFERENCE TO RELATED APPLICATIONS

This application is a Continuation of U.S. patent application Ser. No. 15/748,019, filed on Jan. 26, 2018, now U.S. Pat. No. 11,022,770, which is a National Stage Application of PCT/US2016/044580, filed on Jul. 28, 2016, which claims the benefit of U.S. Patent Application Ser. No. 62/198,456, filed on Jul. 29, 2015, and claims the benefit of U.S. Patent Application Ser. No. 62/287,805, filed on Jan. 27, 2016, and claims the benefit of U.S. Patent Application Ser. No. 62/288,339, filed on Jan. 28, 2016, and claims the benefit of U.S. Patent Application Ser. No. 62/338,226, filed on May 18, 2016, and claims the benefit of U.S. Patent Application Ser. No. 62/340,269, filed on May 23, 2016, the disclosures of which are incorporated herein by reference in their entireties.

BACKGROUND

In bladed chassis systems, optical adapters are mounted to one or more blades that are disposable within a chassis. The blades can slide forwardly of the chassis to enhance access to the optical adapters. Cable clamps, anchors, or other fasteners can be fixed to the rear of the chassis to secure incoming cables in fixed positions relative to the chassis.

Improvements are desired.

SUMMARY

The present disclosure relates generally to a bladed chassis system at which blades can be inserted and removed from the front and can be inserted and removed from the rear at the discretion of the user. In certain examples, a rear portion of the chassis opens to enable insertion and/or removal of the blades at the rear. In certain examples, a front portion of the chassis opens to enable insertion and/or removal of the blades at the front.

In accordance with some aspects of the disclosure, a chassis system includes a method of moving a blade relative to a chassis housing. The method includes pulling a front handle of a blade to unlock the blade from the chassis housing while the blade is disposed in an operation position relative to the chassis housing; continuing to pull the front handle to move the blade relative to the chassis housing to a first forward position; pushing the front handle of the blade to unlock the blade from the chassis housing while the blade is disposed in the first forward position; and pulling the blade forward relative to the chassis while pushing the front handle. The blade automatically locks to the chassis housing upon reaching the first forward position. Continued pulling on the front handle at the first forward position does not cause forward movement of the blade relative to the chassis.

In certain implementations, the blade automatically locks to the chassis housing at a second forward position that is further forward than the first forward position. In certain examples, continued pulling on the blade from the second forward position does not result in forward movement of the blade relative to the chassis housing regardless of action on the front handle.

In certain implementations, pulling the blade forward comprises pulling a brace member that is coupled to the blade.

In accordance with other aspects of the disclosure, a chassis system includes a chassis housing defining an interior; a first guide member disposed at one side of the chassis housing; and a second guide member disposed at an opposite side of the chassis housing. The first guide member defines a plurality of open-ended slots. The second guide member defines a plurality of slots. The second guide member includes a plurality of deflectable forward latching members and a plurality of deflectable rearward latching members. Each forward latching member defines a rearward tab and each rearward latching member defines a forward tab. Each of the forward and rearward latching members is aligned with one of the slots defined by the second guide member.

In certain implementations, a blade has a first rail configured to slide along one of the open-ended slots of the first guide member. The blade also has a second rail configured to slide along one of the slots of the second guide member. The second rail has a forward end and a rearward end.

In certain implementations, the second rail is coupled to an intermediate guide member, which movably couples to a latching arrangement mounted to the blade.

In certain examples, the latching arrangement is movable relative to the intermediate guide member between a plurality of discrete positions. In examples, the latching arrangement includes a plurality of stop members and an actuator bar, wherein rearward movement of the actuator bar retracts the stop members. In an example, forward movement of the actuator bar retracts less than all of the stop members.

In certain examples, the intermediate guide member is slidable along the latching arrangement. In certain examples, the intermediate guide member is monolithically formed with the second rail.

In certain examples, movement between the latching arrangement and the intermediate guide member is restricted so that the latching arrangement cannot be disconnected from the intermediate guide member during normal operation. In an example, the movement is restricted by engagement between opposing shoulders of the latching arrangement and intermediate guide member.

In certain implementations, the forward end of the second rail engages the rearward tab of the forward latching member when the blade is disposed within the chassis housing to inhibit forward movement of the second rail relative to the chassis housing. The rearward end of the second rail engages the forward tab of the rearward latching member when the blade is disposed within the chassis housing to inhibit rearward movement of the second rail relative to the chassis housing.

In accordance with other aspects of the disclosure, a chassis system includes a housing; first and second rear doors; a rear management arrangement; and a blade disposed within the housing. The housing includes first and second sidewalls extending between a bottom wall and a top wall to define an interior. The first and second sidewalls also extend between an open front of the housing and an open rear of the housing. The first and second rear doors are disposed at the open rear of the housing. The first rear door is configured to extend across part of the open rear from the first sidewall. The second rear door is configured to extend across part of the open rear from the second sidewall. The first and second rear doors are configured to cooperate to define a cable port leading to the open rear of the housing. The rear management arrangement is disposed at the rear doors so that the rear management arrangement is disposed within the interior of the housing. The rear management arrangement is configured to manage an optical fiber cable extending into the interior of the housing through the cable port. The blade has a fanout retention member and a rear cable management tray disposed at a rear of the blade. The rear cable management tray defines a first cable path and a second cable path. The first cable path leads from a side of the rear cable management tray towards the fanout retention member. The second cable path leads from an opposite side of the rear cable management tray towards the fanout retention member.

In certain implementations, the rear management arrangement is a first rear management arrangement. A second rear management arrangement also is disposed at the rear doors. In certain examples, the first and second rear management arrangements are laterally spaced from each other along the first rear door.

In certain examples, a plurality of blades disposed within the housing. The first and second rear management arrangements cooperate to route a plurality of optical fiber cables along pathways between the cable port and the rear cable management trays of the blades.

In certain implementations, the blade includes a cover that releasably locks to the blade to cover optical fibers routed from a rear of the blade to optical adapters mounted towards a front of the blade.

In accordance with other aspects of the disclosure, a chassis system includes a housing; a cable bracket arrangement disposed at the open rear of the housing and configured to extend across part of the open rear from the first sidewall; a bracket cover arrangement disposed at the open rear of the housing and configured to extend across part of the open rear from the second sidewall. A guide arrangement is carried by the cable bracket arrangement so that the guide arrangement is disposed within the interior of the housing when the bracket cover arrangement cooperates with the cable bracket arrangement to define a cable port. The guide arrangement defines at least one fiber path along which the fibers are managed while extending into the interior of the housing through the cable port. The guide arrangement is configured to maintain a minimum bend radius of the optical fibers as the fibers are routed along the guide arrangement.

In certain implementations, a blade disposed within the housing.

In certain implementations, a moving arm arrangement is coupled to the blade. The moving arm arrangement includes a stationary limiter and a moving arm configured to move relative to the stationary limiter.

In certain examples, the moving arm defines a fiber routing path having a concave curvature. In certain examples, the moving arm includes a first arm and a second arm that is movable relative to the first arm.

In an example, the second arm includes a limiting tab that is configured to pivot between two stop members of the first arm to limit travel of the second arm relative to the first arm. In an example, the first arm includes a limiting tab that is configured to engage an abutment surface of the stationary limiter to limit a maximum extension of the moving arm.

In certain implementations, the moving arm arrangement includes a plurality of fiber retaining arms extending outwardly from the stationary limiter and the moving arm.

In certain implementations, the guide arrangement defines a plurality of fiber paths. In certain examples, the guide arrangement defines a fiber path for each blade capable of being loaded in the chassis.

In accordance with other aspects of the disclosure, a bladed chassis system includes a chassis housing defining an interior having an open front and an open rear; a plurality of blades disposed within the interior of the chassis housing; and a cable manager disposed at the open rear of the chassis housing. Each blade is movable relative to the chassis housing. Each blade is installable and removable through either of the open front and the open rear of the chassis housing. Each blade includes an adapter module at a front of the blade and a cable retention structure at a central, rear location on the blade. The cable manager includes a sidewall extending rearwardly from the open rear of the chassis housing, the sidewall defining at least one cable port.

In certain implementations, the cable manager is configured to releasably receive at least one port module at the sidewall, the port module defining the at least one cable port.

In certain examples, the port module defines a plurality of cable ports. In certain examples, the port module carries a gland that anchors one or more cables entering the cable manager at the cable port. In certain examples, the port module carries an adapter that anchors one or more cables entering the cable manager at the cable port. In certain examples, the cable manager is configured to receive a plurality of port modules at the sidewall.

In certain implementations, the sidewall is a first sidewall, the cable manager includes a second sidewall that cooperates with the first sidewall to define a cable management region, the second sidewall being configured to releasably receive at least one port module.

A variety of additional inventive aspects will be set forth in the description that follows. The inventive aspects can relate to individual features and to combinations of features. It is to be understood that both the forgoing general description and the following detailed description are exemplary and explanatory only and are not restrictive of the broad inventive concepts upon which the embodiments disclosed herein are based.

BRIEF DESCRIPTION OF THE DRAWINGS

The accompanying drawings, which are incorporated in and constitute a part of the description, illustrate several aspects of the present disclosure. A brief description of the drawings is as follows.

DETAILED DESCRIPTION

Reference will now be made in detail to exemplary aspects of the present disclosure that are illustrated in the accompanying drawings. Wherever possible, the same reference numbers will be used throughout the drawings to refer to the same or like parts.

The present disclosure relates generally to a bladed chassis system that facilitates installation of the bladed chassis system and replacement of the blades at the chassis. For example, in certain examples, blades can be inserted and removed from the front and/or the rear of the bladed chassis system at the discretion of the user. In certain examples, cables can be routed to the rear of the chassis system from either of two sides at the discretion of the user. In certain examples, the blades can be moved to and releasably locked into one or more extended positions to enhance access to connector ports on the blades.

Figure 1:
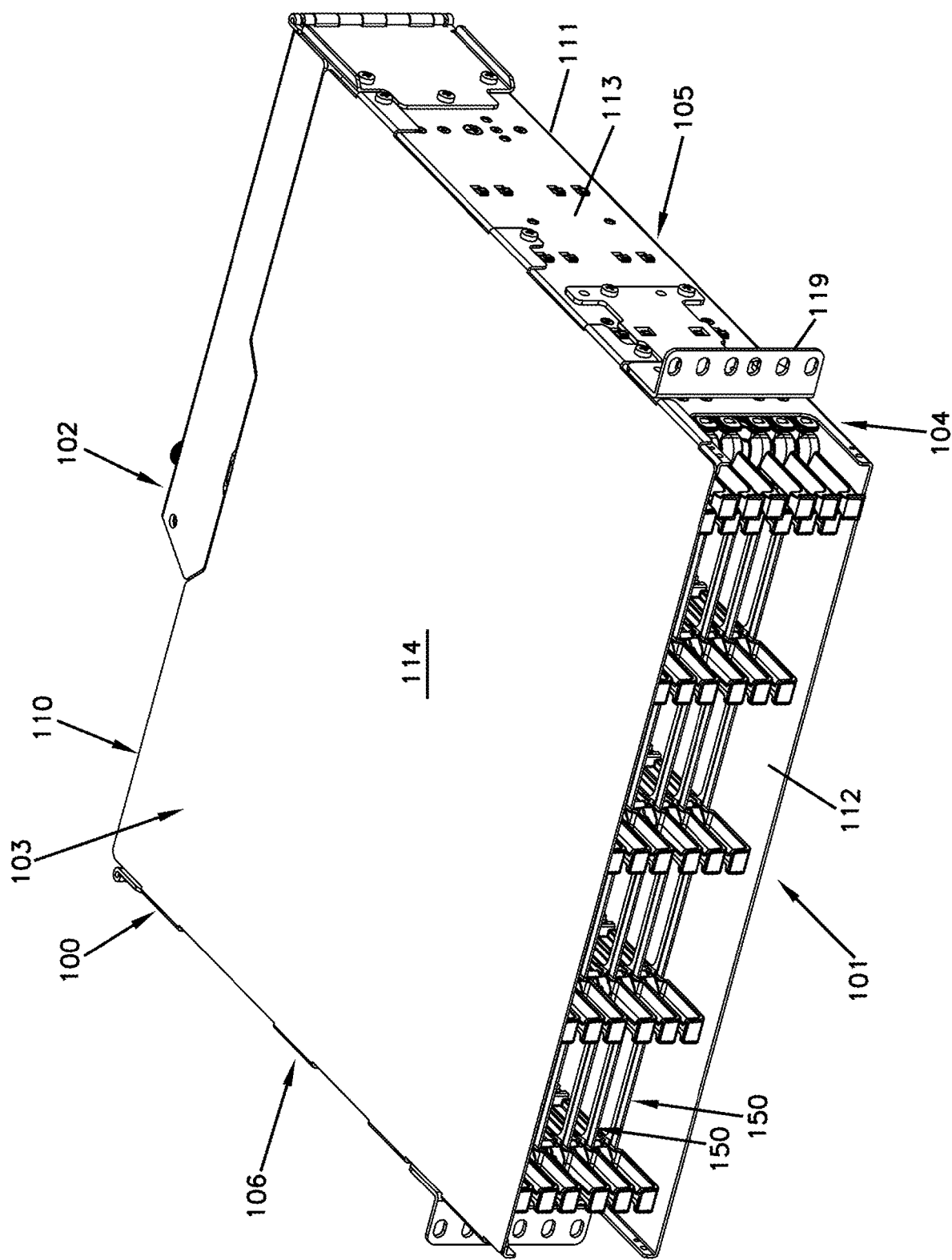
FIG. 1 is a front perspective view of an example bladed chassis system including blades mounted within a chassis and a multi-fiber cable routed to a rear of the chassis.
Figure 2:
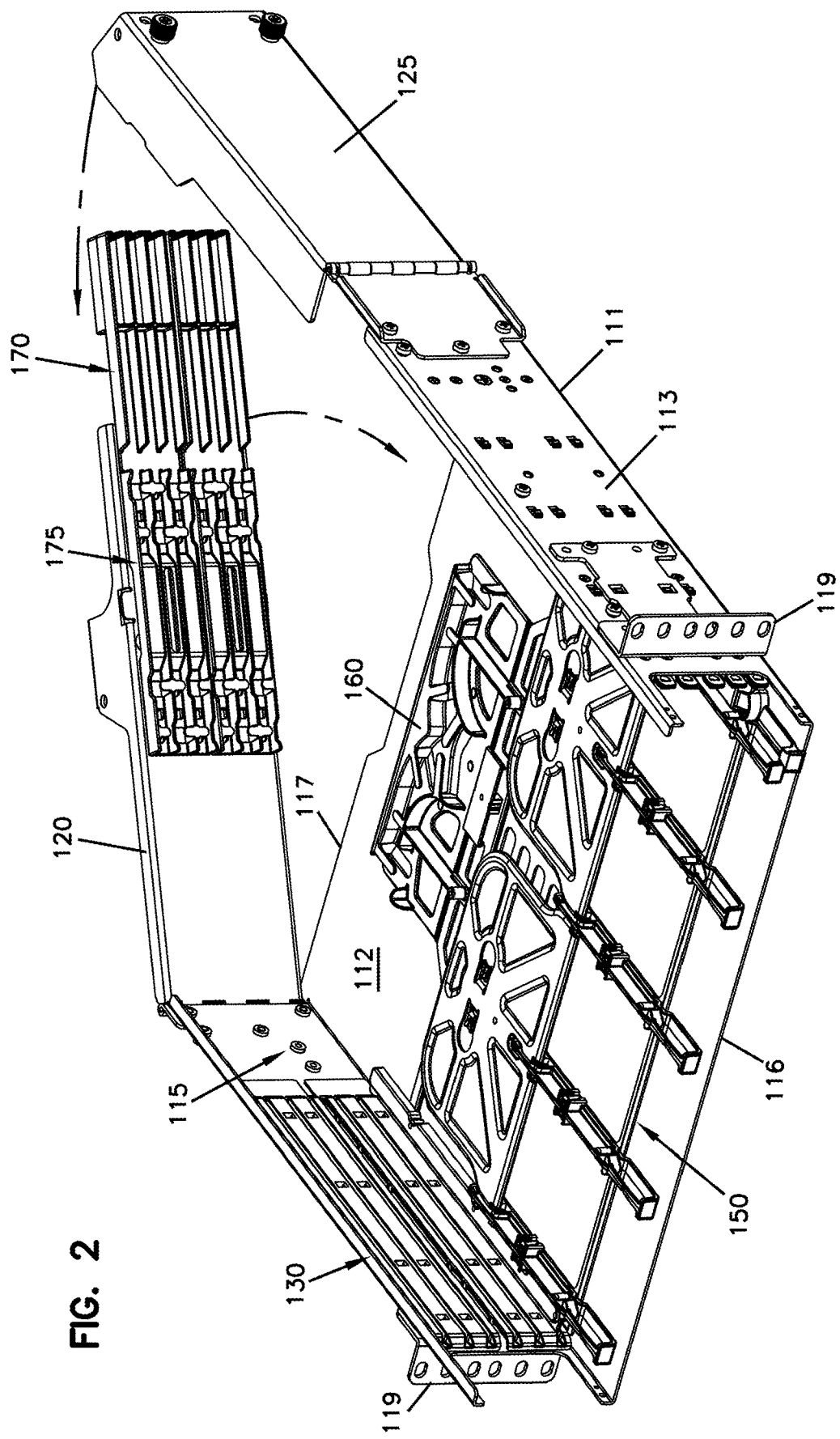
FIG. 2 is a front perspective view of the bladed chassis system of FIG. 1 with a top of the chassis and multiple blades removed for ease in viewing, and with rear doors of the chassis partially opened.
Figure 3:
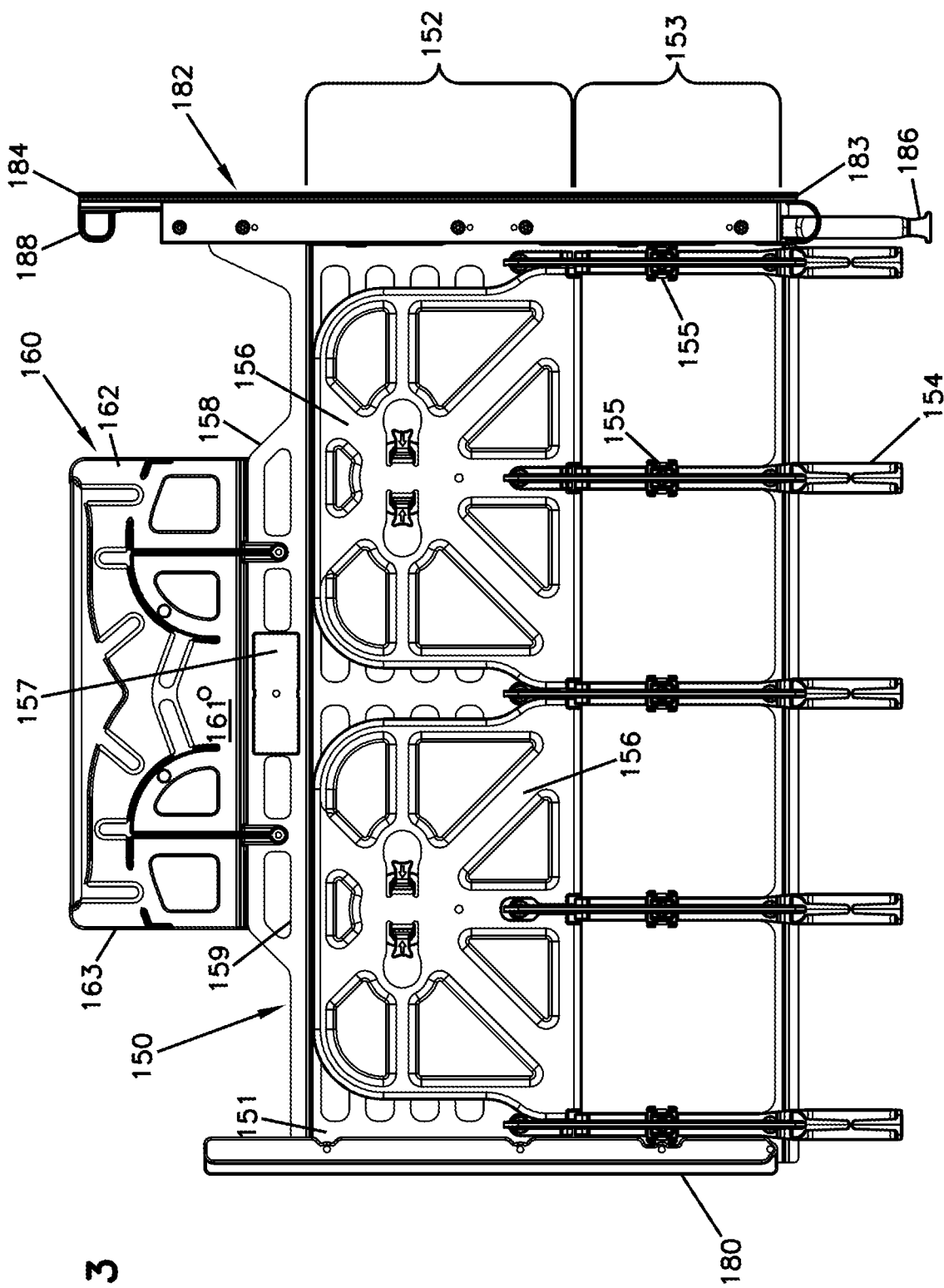
FIG. 3 is a top plan view of an example blade suitable for use in the bladed chassis system of FIG. 1.

FIGS. 1 and 2 illustrate one example bladed chassis system 100 including a chassis 110 and one or more blades 150. The chassis system 100 has a front 101, a rear 102, a first end 103, a second end 104, a first side 105, and a second side 106. The chassis 110 includes a housing 111 having two sidewalls 113 extending between a first end wall 112 and a second end wall 114. The first end wall 112, sidewalls 113, and second end wall 114 define an interior 115 (FIG. 2) having an open front 116 and an open rear 117 (FIG. 2). Mounting brackets 119 are disposed at exterior surfaces of the sidewalls 113.

The chassis system 100 is configured to receive one or more multi-fiber cables at the rear 102 of the chassis system 100. In certain examples, the chassis system 100 defines one or more ports at the rear 102 of the chassis system 100. One or more multi-fiber cables can be received and anchored at one of the ports at the discretion of the user.

Figure 4:
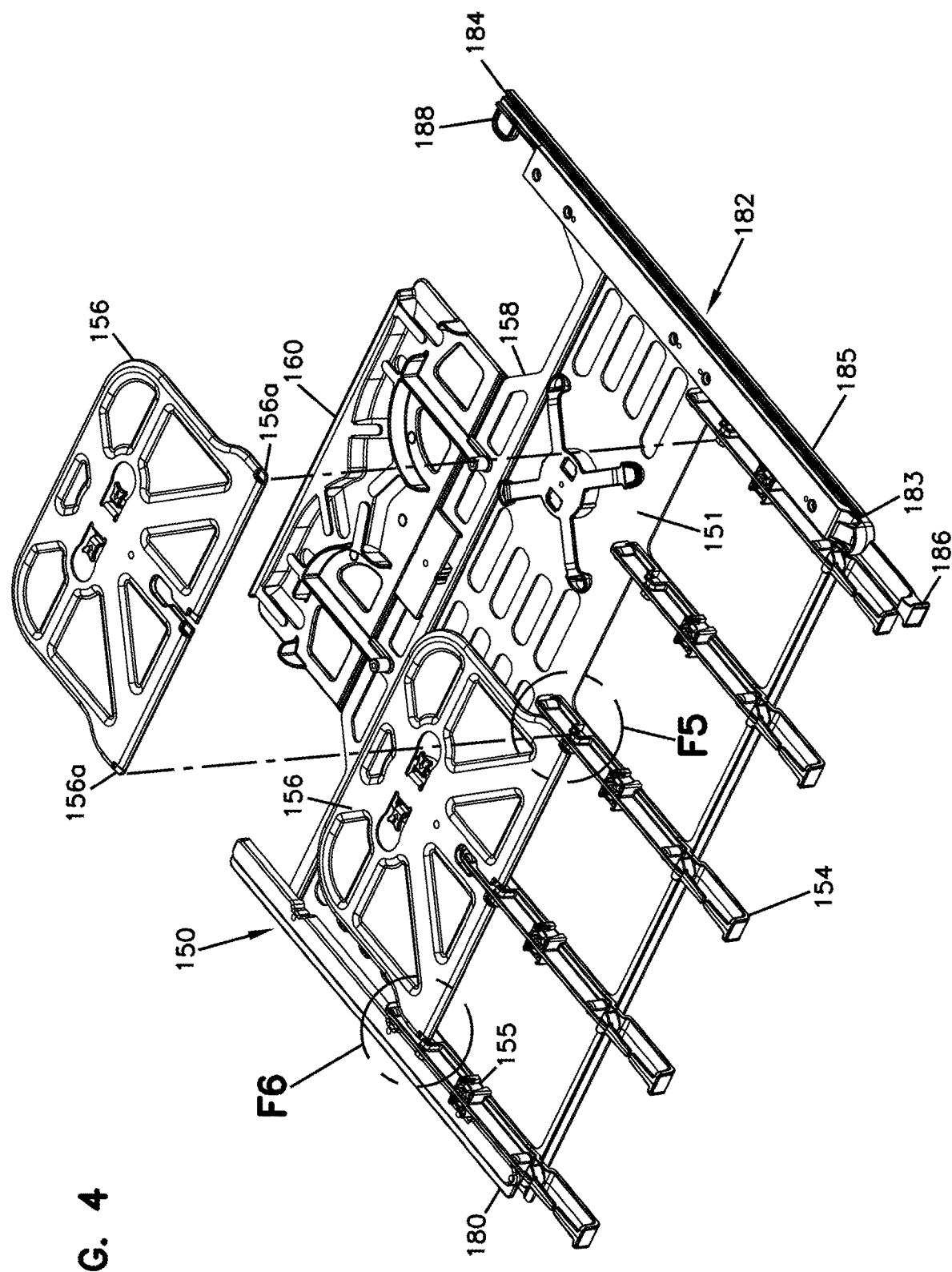
FIG. 4 is a perspective view of the blade of FIG. 3 with one of the covers exploded upwardly.

A cable bracket 120 and a bracket cover 125 are mounted to the chassis housing 111 at the open rear 117. Each of the cable bracket 120 and the bracket cover 125 are movable between an open position and a closed position. The cable bracket 120 and the bracket cover 125 cooperate to close the open rear 117 when both are disposed in the closed positions (see FIG. 1). The cable bracket 120 and the bracket cover 125 also cooperate to define a rear cable port P (FIG. 4) when disposed in the closed positions. Moving both the cable bracket 120 and bracket cover 125 to the open positions reveals the open rear 117 of the housing 111.

In various implementations, the chassis 110 can hold multiple (e.g., two, three, four, five, six, eight, etc.) blades 150. Accordingly, the chassis 110 can be sized at 1 RU (rack unit), 2 RU, 3 RU, 4 RU, 5 RU, 6 RU, etc. In some implementations, the blades 150 to be inserted into the chassis interior 115 through the open front 116. In other implementations, the blades 150 to be inserted into the chassis interior 115 through the open rear 117. In still other implementations, the blades 150 to be inserted into the chassis interior 115 selectively through the open front 116 or the rear 117. For examples, the cable bracket 120 and bracket cover 125 can be pivoted to the open positions. Examples of suitable cable brackets and bracket covers can be found in U.S. application Ser. No. 14/747,854, filed Jun. 23, 2015, and titled "Bladed Chassis System," the disclosure of which is hereby incorporated herein by reference.

FIGS. 3-6 illustrate an example blade 150 configured to mount within the interior 115 of a bladed chassis system 100. Each blade 150 includes a base 151 extending from a front to a rear. The base 151 includes a fiber management section 152 towards the rear and a termination section 153 towards the front. The fiber management section 152 is configured to hold fiber management structures (e.g., spools, bend radius limiters, etc.) to retain and manage the optical fibers routed onto the blade 150. Fiber retainer members 154 extend forwardly of the termination section 153.

One or more optical adapters are disposed at the termination section 153. In certain examples, the blade 150 includes support members 155 configured to receive the optical adapters at the termination section 153. Example support members suitable holding the optical adapters can be found in U.S. application Ser. No. 14/747,854, incorporated herein by reference above. Connectorized ends of the optical fibers managed at the fiber management section 152 can be plugged into rear ports of the optical adapters. In some implementations, the optical adapters include adapter modules that define a plurality of front and rear ports. Example adapter modules suitable for mounting at the termination section can be found in U.S. Publication No. 2014-0219614, U.S. Publication No. 2014-0219615, and U.S. application Ser. No. 14/611,924, the disclosures of which are hereby incorporated herein by reference. In other implementations, simplex optical adapters can be individually mounted at the termination section 153.

In certain implementations, the blade 150 includes or is configured to receive one or more fiber fanouts towards a rear of the base 151. The fiber fanout is configured to facilitate separating out individual fibers of the optical fiber cable. In the example shown, a retention member 157 is disposed on the base 151 to hold one or more fiber fanouts to the blade 150.

In certain implementations, a cover 156 can be disposed over the length of separated optical fibers between the fiber fanout and the rear ports of the optical adapters. In the example shown, a first cover 156 is positioned to be disposed over the separated fibers of a first fiber fanout and a second cover 156 is positioned to be disposed over the separated fibers of a second fiber fanout. In certain examples, each cover 156 is releasably latched to the base 151. For example, latching arms may extend downwardly from the cover 156 to engage latching shoulders defined at the base 151 or a routing structure mounted thereon.

Figure 5:
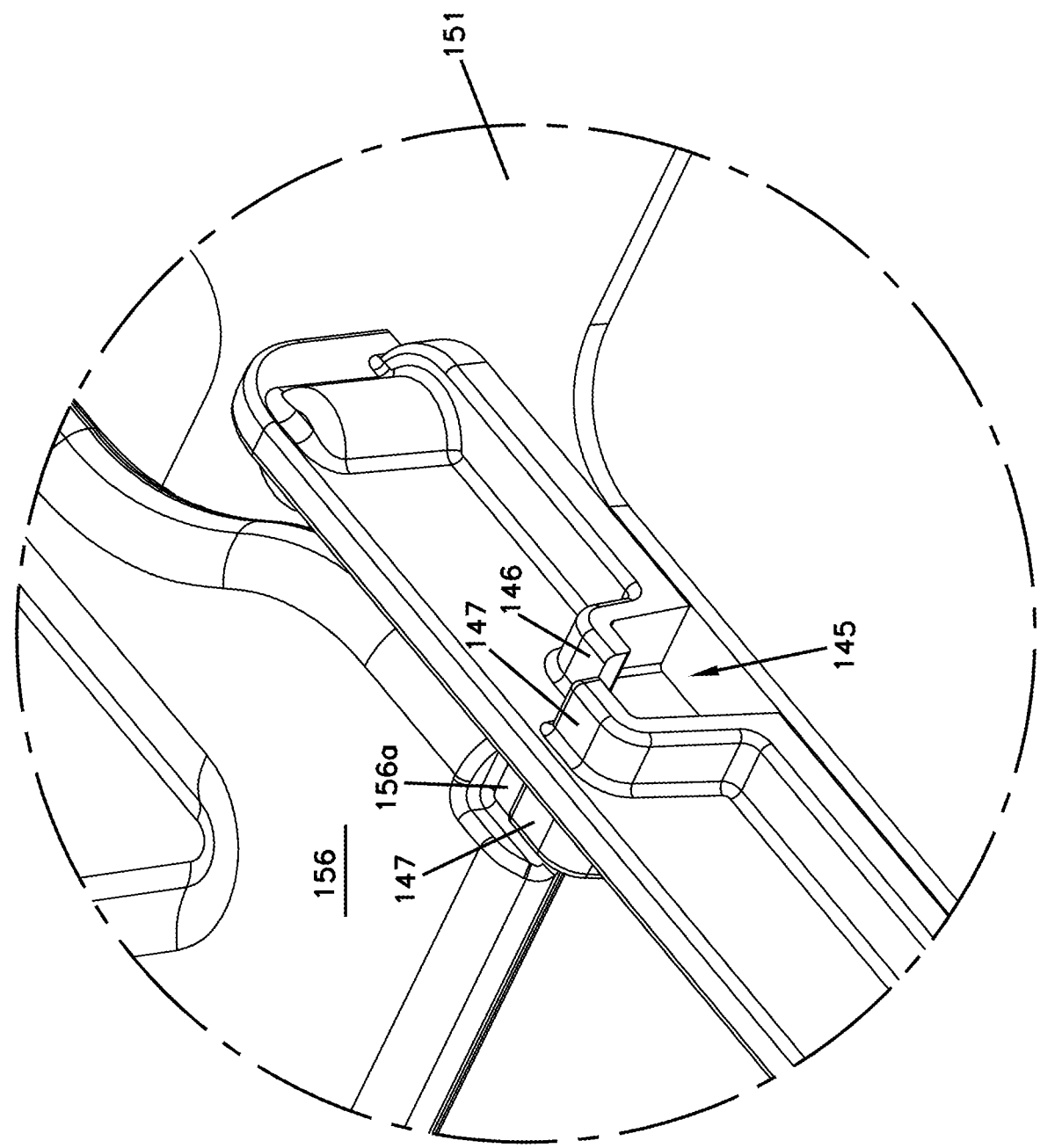
FIG. 5 is an enlarged view of a portion of FIG. 4 labeled F5.
Figure 6:
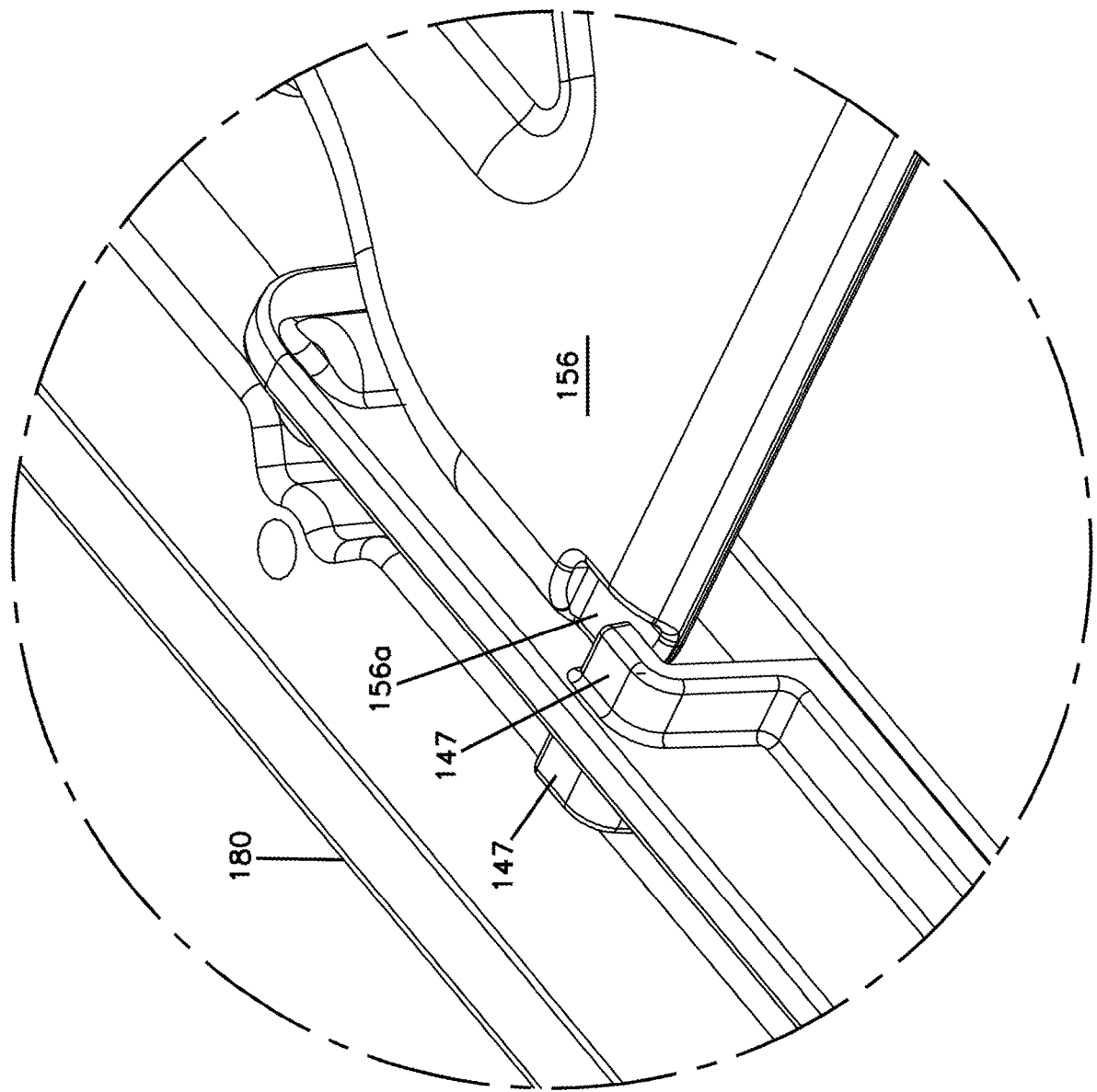
FIG. 6 is an enlarged view of a portion of FIG. 4 labeled F6.

In certain examples, the support members 155 can include retention sections 145 that aid in holding the covers 156 to the blade 150. As shown in FIG. 5, each retention section 145 includes a lower shelf 146 and an upper shelf 147. A portion 156a of the cover 156 having a reduced thickness can be inserted between the lower and upper shelves 146, 147 so that the reduced thickness portion 146 is held therebetween (see FIG. 6).

In certain examples, a flange 158 extends from a rearward edge of the base 151 of the blade 150. In some examples, the flange 158 defines one or more openings 159 to provide a handle for a user to withdraw the blade 150 through the rear 117 of the chassis 110. In other examples, the flange 158 otherwise provides a handle or handhold for the user to manipulate the blade 150 from the rear 102 of the chassis system 100.

In certain implementations, a rear cable management tray 160 can be mounted to the blade 150 (e.g., to the flange 158). The rear cable management tray 160 includes an exit 161 that aligns with the retention member 157. The rear cable management tray 160 also includes a first entrance 162 and a second entrance 163 that provide access to cable paths leading to the exit 161. Accordingly, optical cables can be routed from the rear 117 of the chassis housing 111, through one of the cable paths, and onto the blade 150.

Figure 7:
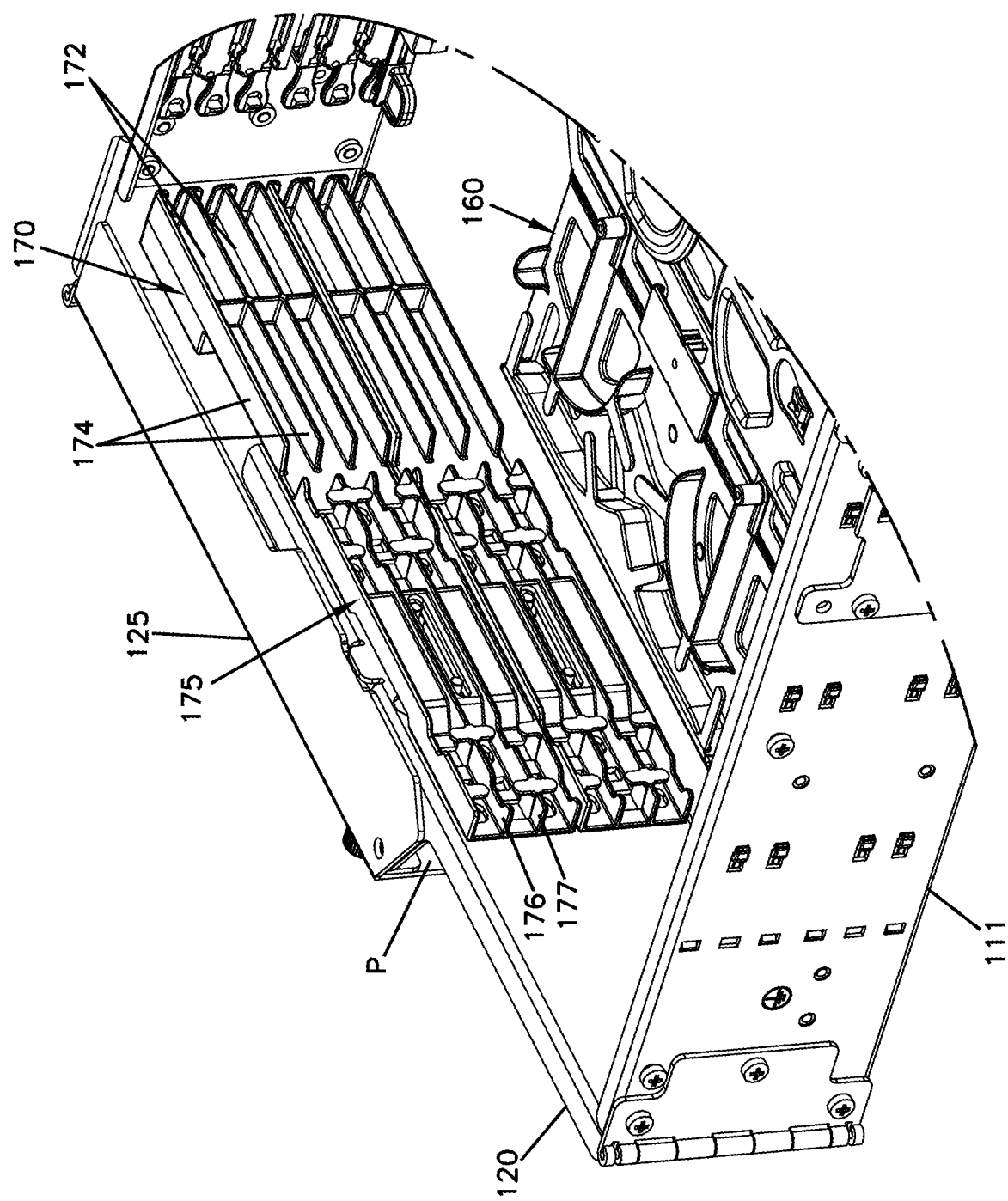
FIG. 7 is a perspective view of the rear doors of the bladed chassis system of FIG. 3 in the closed position.
Figure 8:
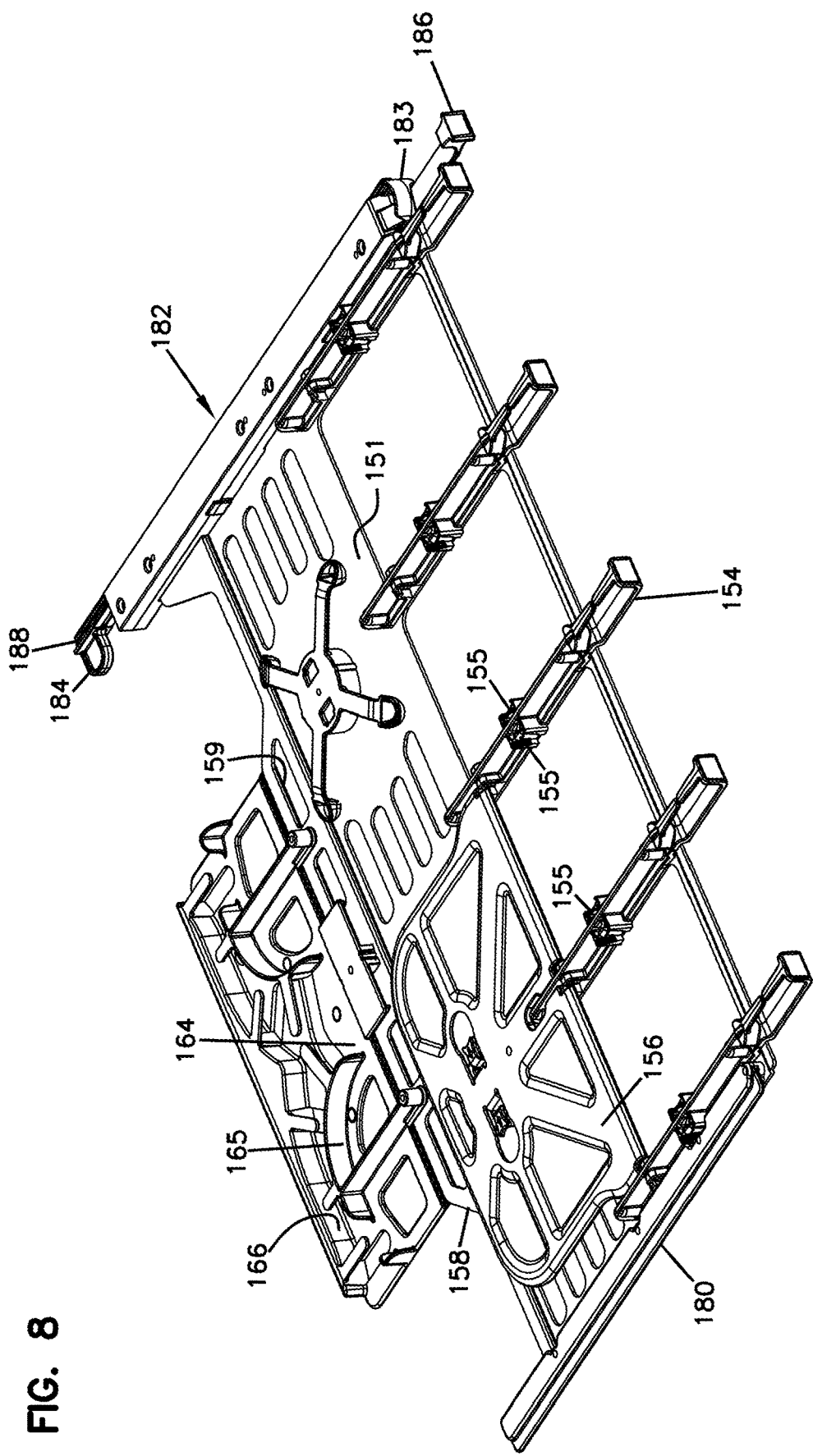
FIG. 8 is another perspective view of the blade of FIG. 3 with one of the covers removed for ease in viewing a fiber management spool beneath.

As shown in FIGS. 2 and 7, the rear doors of the chassis 110 (e.g., the cable bracket 120 and bracket cover 125) are configured to manage the optical cables routed into the chassis 111 from the rear. For example, the cable bracket 120 and bracket cover 125 cooperate to define a cable port P that leads to a first rear management arrangement 170 disposed on the doors. In the example shown, the first rear management arrangement 170 is carried by the cable bracket 120. The rear management arrangement 170 includes cable passages 172 leading from the port P to the interior 115 of the chassis 110. The rear management arrangement 170 also includes divider flanges 174 that extend along a portion of the rear 117 of the chassis housing 111.

In certain implementations, a second rear management arrangement 175 also can be disposed at the rear doors of the chassis 110. In the example shown, the second rear management arrangement 175 also is carried by the cable bracket 120. The second rear management arrangement 175 defines channels and retaining fingers that aid in guiding optical cables or fibers thereof along the rear 117 of the chassis housing 111 towards one of the entrances 162, 163 of the rear cable management tray 160.

As shown in FIGS. 8-12, the chassis 110 and the blades 150 are configured to facilitate movement between the blades 150 and the chassis housing 111. For example, one or more first guide members 130 are disposed at an inner surface of one of the chassis sidewalls 113. Each first guide member 130 defines one or more open-ended channels 131

Figure 9:
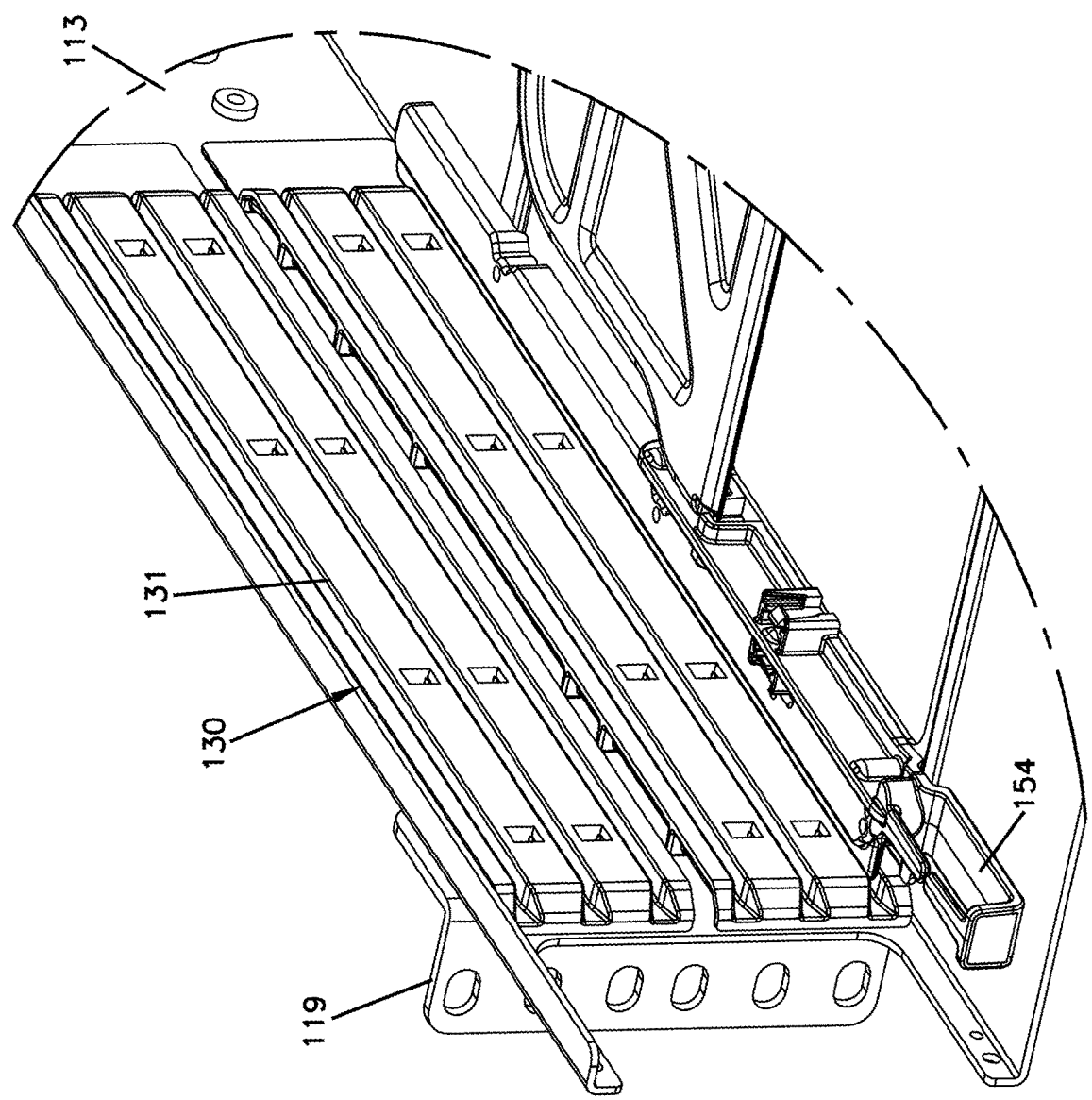
FIG. 9 is a perspective view of a first guide member mounted to an interior sidewall of the bladed chassis system of FIG. 1.

(see FIG. 9). Each blade 150 includes a first rail 180 that is sized and shaped to slide along one of the channels 131. The first rail 180 is axially fixed relative to the blade base 151. In the example shown, the first rail 180 and channels 131 are configured so enable the rail 180 to be freely inserted into and removed from the channel 131.

Figure 10:
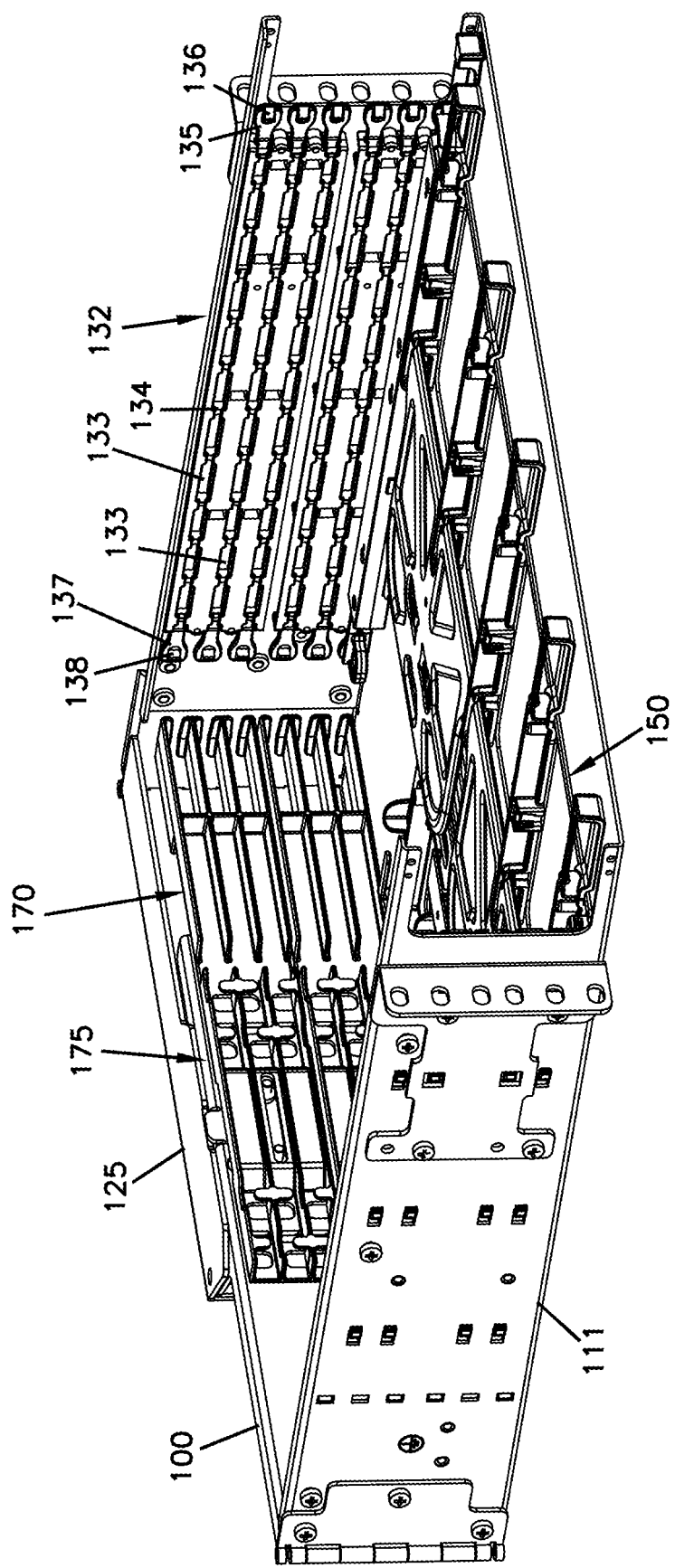
FIG. 10 is a perspective view of the bladed chassis system of FIG. 1 oriented so that a second guide member is visible.
Figure 11:
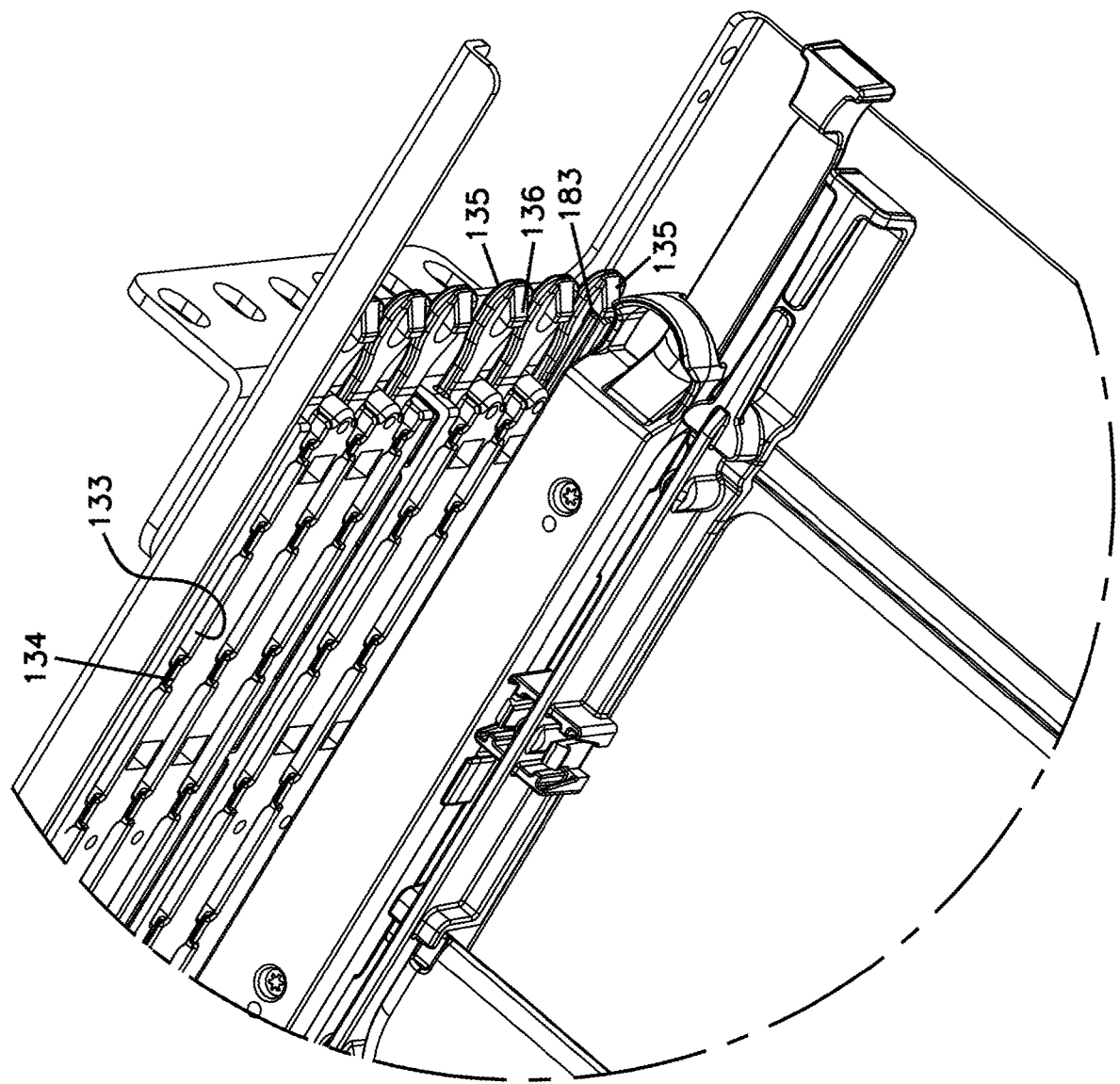
FIG. 11 is an enlarged view of a forward portion of the second guide member of FIG. 10.

One or more second guide members 132 are disposed at an inner surface of another of the chassis sidewalls 113 (see FIG. 10). The second guide member 132 also defines one or more channels 133. Each blade 150 includes a second rail 185 that is sized and shaped to slide along one of the channels 133. The second rail 185 is axially movable relative to the blade base 151 as will be discussed in greater detail herein. In certain examples, retention tabs 134 extend over the channels 133 to aid in retaining the second rail 185 within the channel 133.

In accordance with some aspects of the disclosure, the chassis 110 can be flipped upside-down to change the direction in which the cable port P faces without using tools. Flipping the chassis 110 causes the cable port P to face in the opposite direction from where it was facing. The first and second guide members 130, 132 are structured to selectively receive the blades 150 in a first orientation and in a second orientation that is flipped 180° from the first orientation. Accordingly, the blades 150 can be installed in the chassis 110 when the chassis is disposed in a first orientation; the blades 150 also can be installed in the chassis 110 when the chassis 110 is disposed in a second orientation that is flipped 180° from the first orientation.

Figure 12:
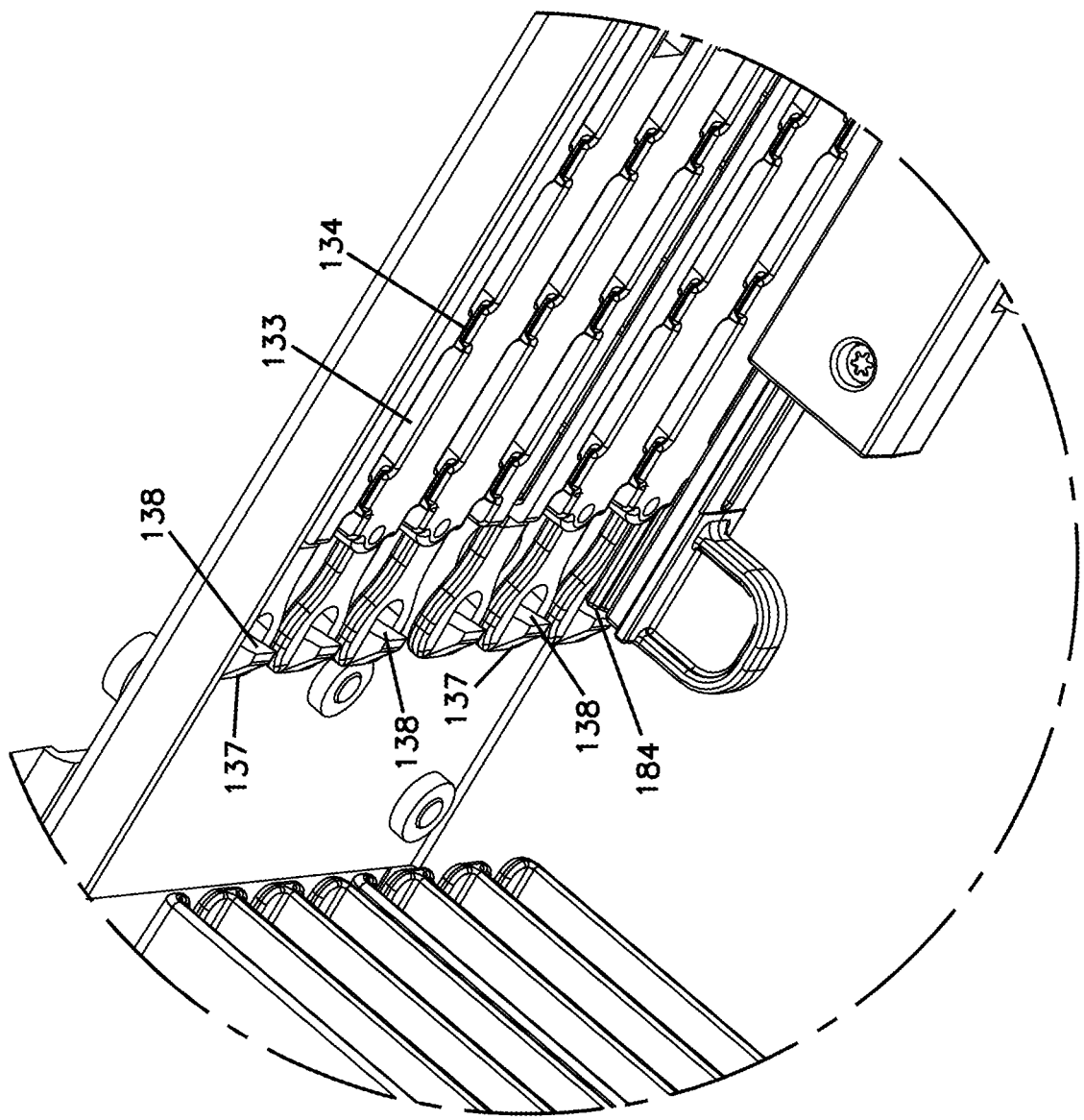
FIG. 12 is an enlarged view of a rearward portion of the second guide member of FIG. 10.

In certain implementations, each second guide member 132 is configured to hold the second rail 185 at an axially fixed position within the chassis housing 111. For example, each second guide member 132 includes one or more forward latching members 135 (FIG. 11) and one or more rearward latching members 137 (FIG. 12). Each forward latching member 135 defines a rearward facing tab 136 and each rearward latching member 137 defines a forward facing tab 138. When a blade 150 is disposed within the chassis housing 111, the rearward facing tab 136 of the forward latching member 135 engages a forward end 183 of the second rail 185 and the forward facing tab 138 of the rearward latching member 137 engages a rearward end 184 of the second rail 185. In certain examples, the rearward facing tab 136 has a forward-facing ramp and the forward facing tab 138 has a rearward-facing ramp.

Accordingly, a blade 150 can be inserted into the interior 115 of the chassis housing 111 through either the open front 116 or the open rear 117 (after opening the cable bracket 120 and bracket cover 125). The first rail 180 of the blade is aligned with one of the channels 131 of the first guide member 130. The second rail 182 is aligned with one of the channels 133 of the second guide member 132.

To insert the blade 150 through the open front 116, the rear end 184 of the second rail 182 cams against the forward-facing ramp of the rearward facing tab 136 to deflect the forward latching member 135 sufficient to allow the second rail 182 to enter the channel 133. The first rail 180 slides along the channel 131 and the second rail 182 is slid along the channel 133 until the rear end 184 of the second rail 182 abuts the forward facing tab 138 of the rearward latching member 137. The forward latching member 135 returns to the undeflected position so that the rearward facing tab 136 engages a forward end 183 of the second rail 182.

To insert the blade 150 through the open rear 117, the forward end 183 of the second rail 182 cams against the rearward-facing ramp of the forward facing tab 138 to deflect the rearward latching member 137 sufficient to allow the second rail 182 to enter the channel 133. The first rail 180 slides along the channel 131 and the second rail 182 is slid along the channel 133 until the forward end 183 of the second rail 182 abuts the rearward facing tab 136 of the forward latching member 135. The rearward latching member 137 returns to the undeflected position so that the forward facing tab 138 engages the rearward end 183 of the second rail 182.

To remove the blade 150 from the chassis housing 111, a user deflects one of the latching members 135, 137 to release the second rail 182 from the corresponding tab 136, 138. The user can then push or pull the blade 150 out of the chassis housing 111 so that the first rail 180 slides along the channel 131 and the second rail 182 slides along the channel 132. In an example, the user can pull a rear handle 188 to pull the blade 150 through the open rear 117. In another example, the user can pull a forward handle 186 to pull the blade 150 through the open front 116.

In accordance with some aspects of the disclosure, the blade 150 is movable relative to the second rail 182 between two or more discrete positions. As the term is used herein, a "discrete" position indicates a position at which the user receives some type of feedback (e.g., tactile feedback, audible feedback, etc.) that the blade 150 has reached a predetermined position relative to the chassis. In certain examples, the blade 150 can be moved relative to the second rail 182 between an operation position and a connector access position. In an example, the blade 150 can be moved relative to the second rail 182 between the operation position, the connector access position, and an adapter access position. In an example, the connector access position is located forwardly of the operation position, and the adapter access position is located forwardly of the connector access position.

In certain implementations, the blade 150 can be releasably locked into one or more of the positions. As the term is used herein, a blade 150 is "locked" in position if the user must take affirmative steps beyond applying forward/rearward pressure to the blade 150 to move the blade 150 relative to the chassis 111. In certain implementations, the latching arrangement 200 is configured to lock the blade 150 relative to the intermediate guide member 190 in the operation position. In certain implementations, the latching arrangement 200 is configured to lock the blade 150 relative to the intermediate guide member 190 in the connector access position. In certain implementations, the latching arrangement 200 is configured to lock the blade 150 relative to the intermediate guide member 190 in the adapter access position. In certain implementations, the latching arrangement 200 is configured to lock the blade 150 relative to the intermediate guide member 190 in any discrete position.

Figure 13:
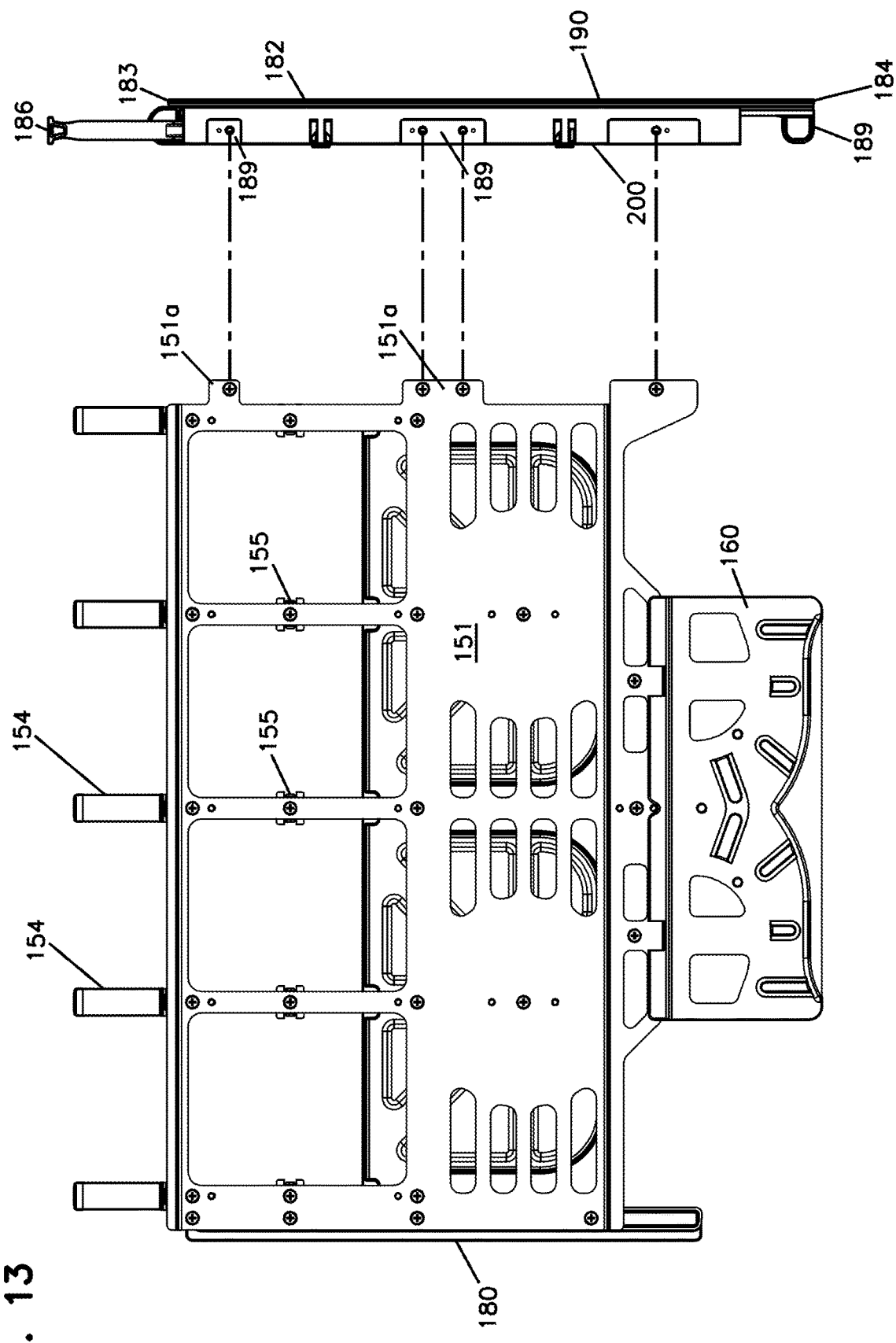
FIG. 13 is a bottom plan view of the example blade of FIG. 3 with a latching arrangement and intermediate guide member exploded from the blade.

In certain implementations, the second rail 182 is coupled to an intermediate guide member 190, which cooperates with a latching arrangement 200. As shown in FIG. 13, the latching arrangement 200 can be mounted to the base 151 of the blade 150 so that the latching arrangement 200 is fixed relative to and carried by the blade 150. For example, flanges 151a of the blade base 151 can fit in depressions 189 defined in the latching arrangement 200 and fasteners can be inserted therethrough. The latching arrangement 200 is movable relative to the intermediate guide member 190. In some implementations, a rail 197 of the intermediate guide member 190 can ride along a track 199 of the latching arrangement 200. In other implementations, a rail 197 of the latching arrangement 200 can ride along a track 199 of the intermediate guide member 190. In still other implementations, the latching arrangement 200 and the intermediate guide member 190 may be otherwise movable relative to each other.

Figure 15:
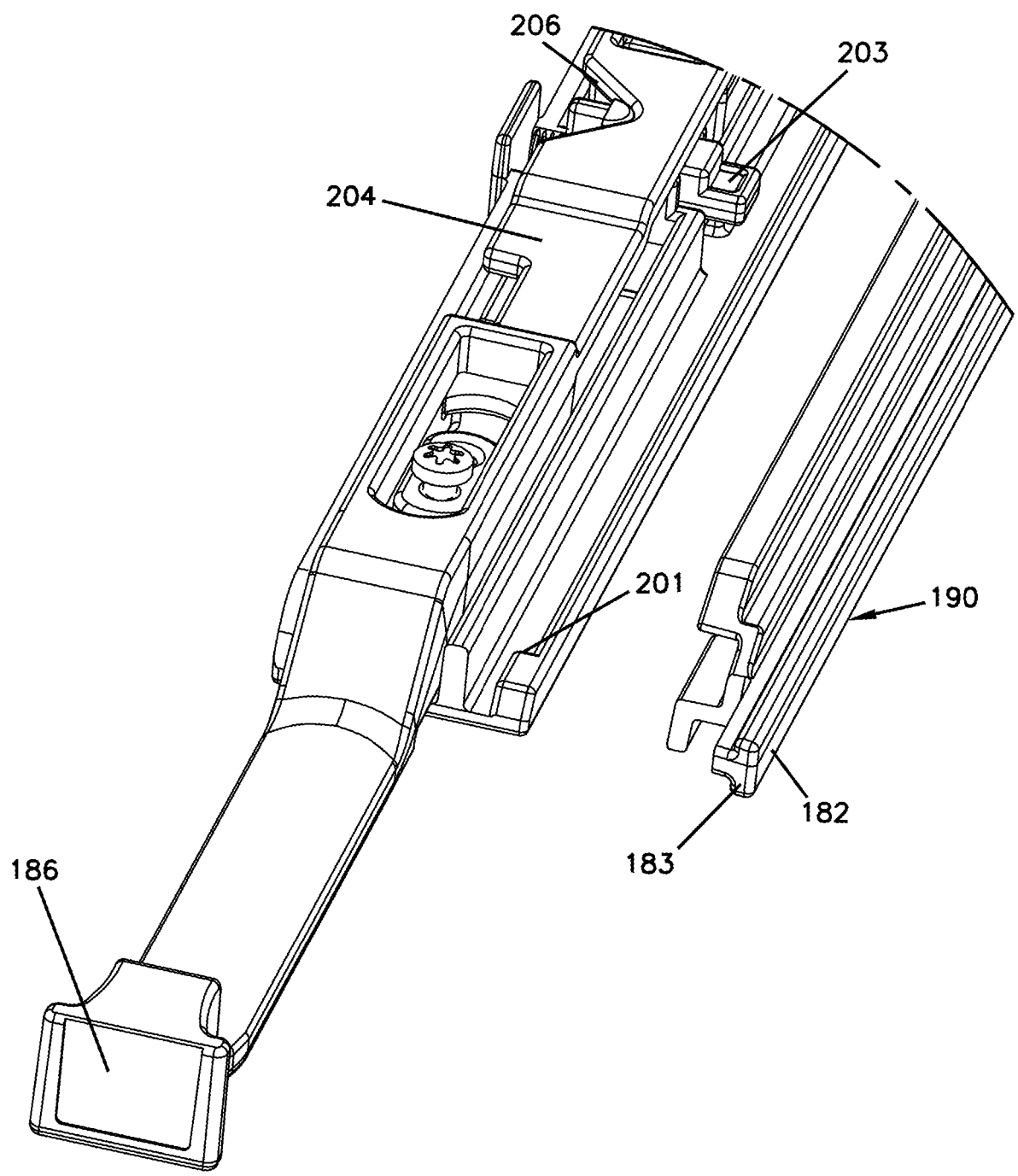
FIG. 15 is an enlarged view of the front of the latching arrangement and intermediate guide member of FIG. 14.
Figure 16:
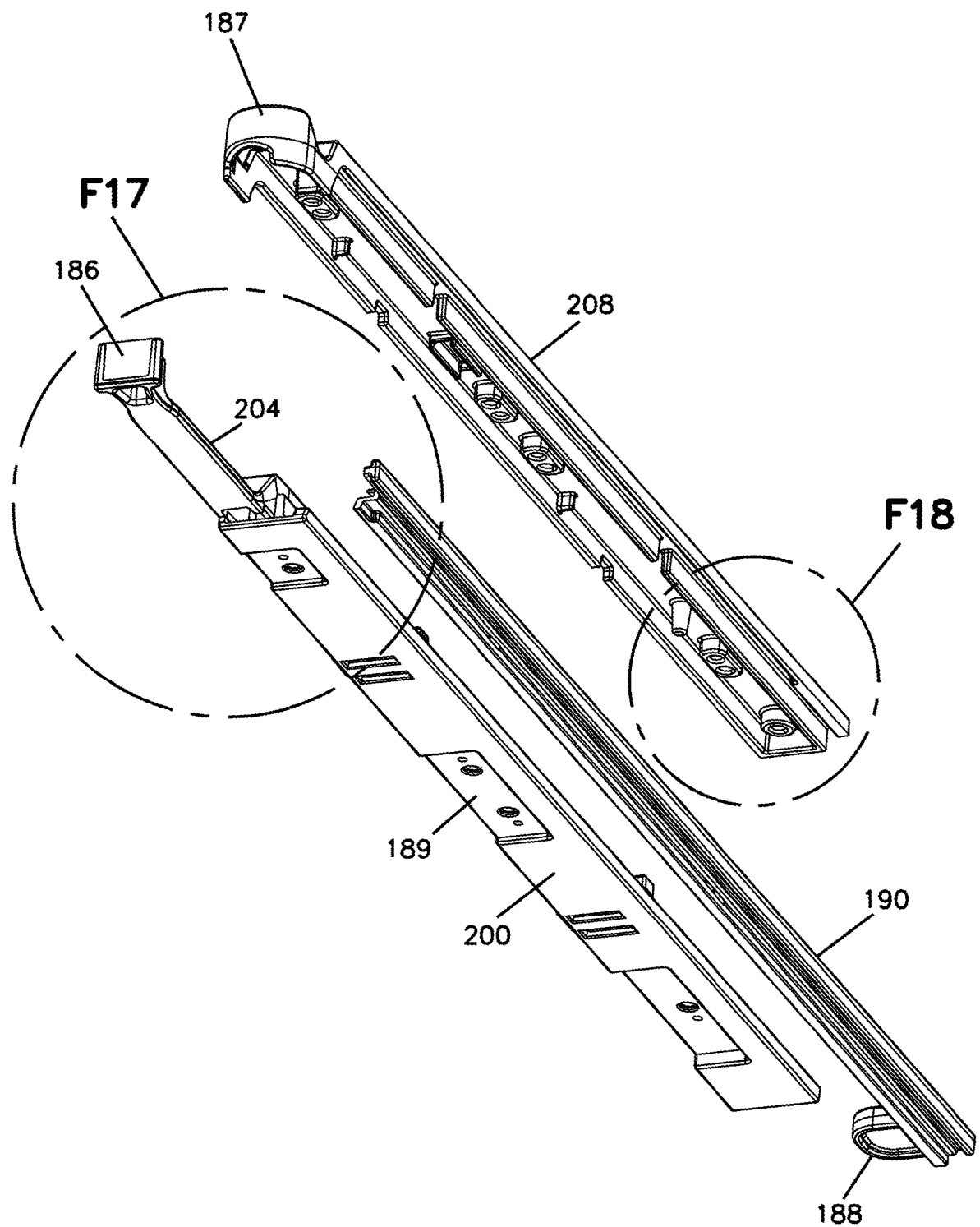
FIG. 16 is a bottom perspective view of the latching arrangement and intermediate guide member of FIG. 14.
Figure 17:
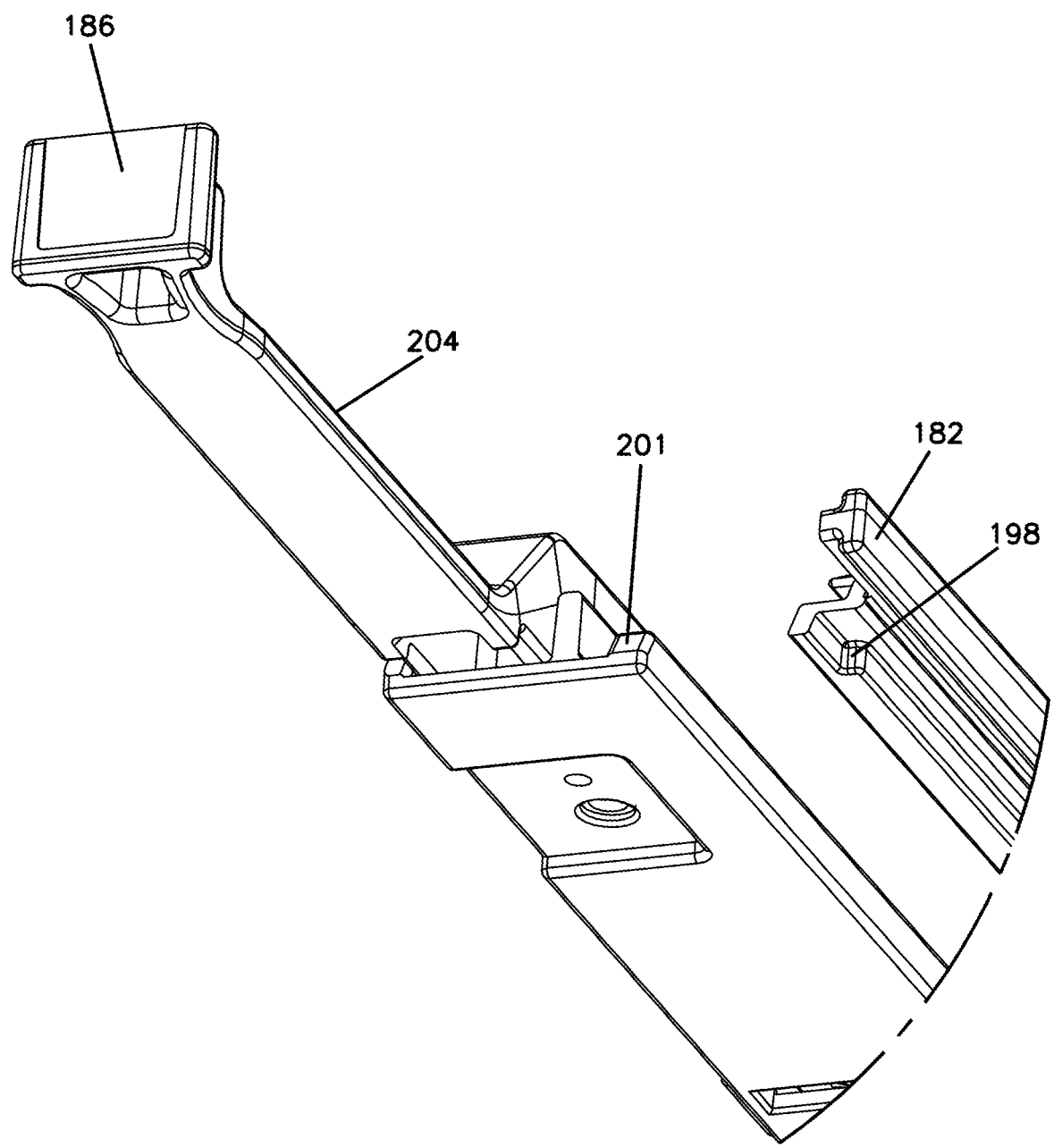
FIG. 17 is an enlarged view of the front of the latching arrangement and intermediate guide member of FIG. 16.
Figure 18:
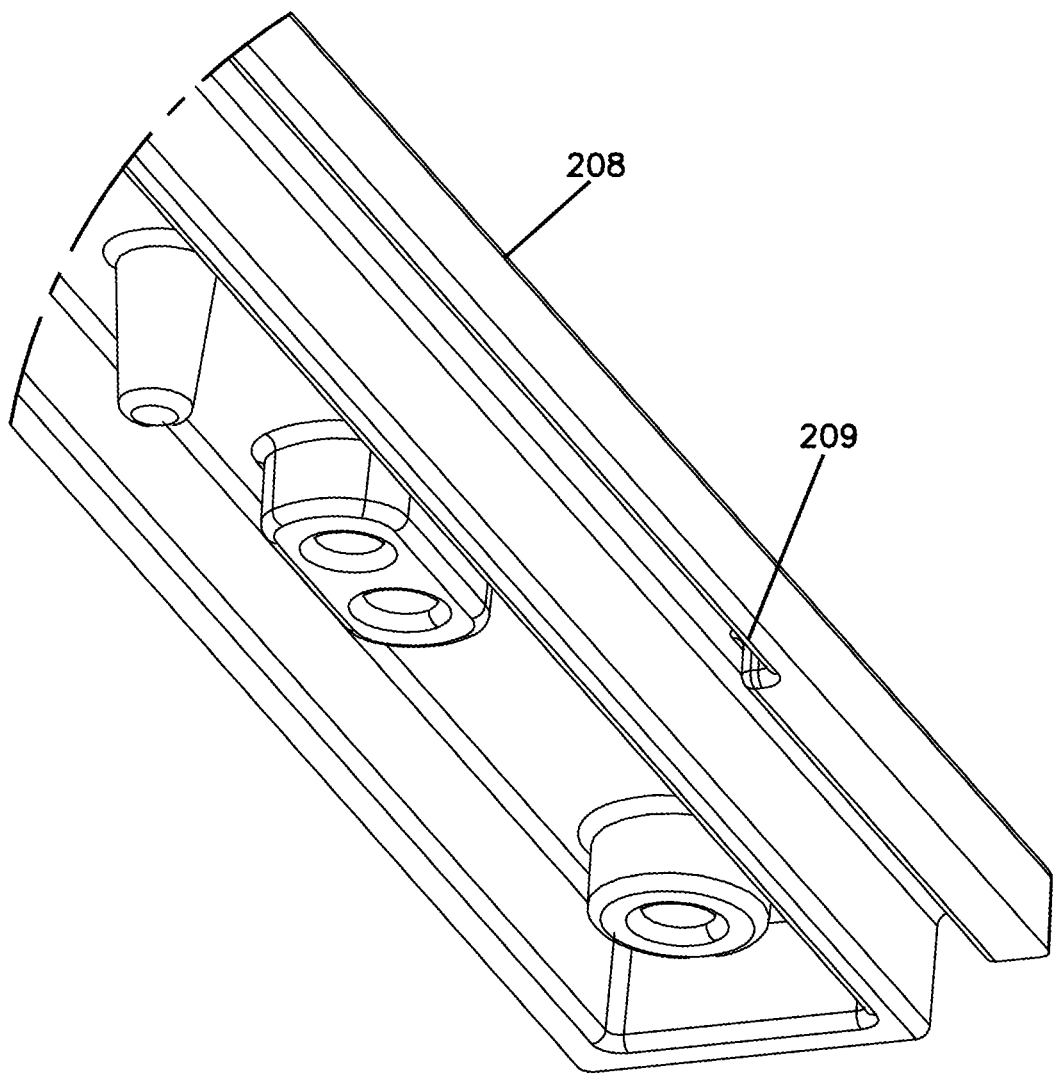
FIG. 18 is an enlarged view of the rear of the latching arrangement of FIG. 16.

In certain implementations, movement of the latching arrangement 200 relative to the intermediate guide member 190 is restricted. In certain examples, the latching arrangement 200 includes a rearward-facing shoulder 201 (FIG. 15) and the intermediate guide member 190 includes a forward-facing shoulder 198 (FIG. 17). Rearward movement of the blade 150 relative to the intermediate guide member 190 is inhibited by engagement between the rearward-facing shoulder 201 and the forward-facing shoulder 198. In certain examples, a cover 208 of the latching arrangement 200 includes a forward-facing shoulder 209 (FIG. 18) and the intermediate guide member 190 includes a rearward-facing shoulder. Forward movement of the blade 150 relative to the intermediate guide member 190 is inhibited by engagement between the forward-facing shoulder 209 and the rearward-facing shoulder of the guide member 190.

Figure 19:
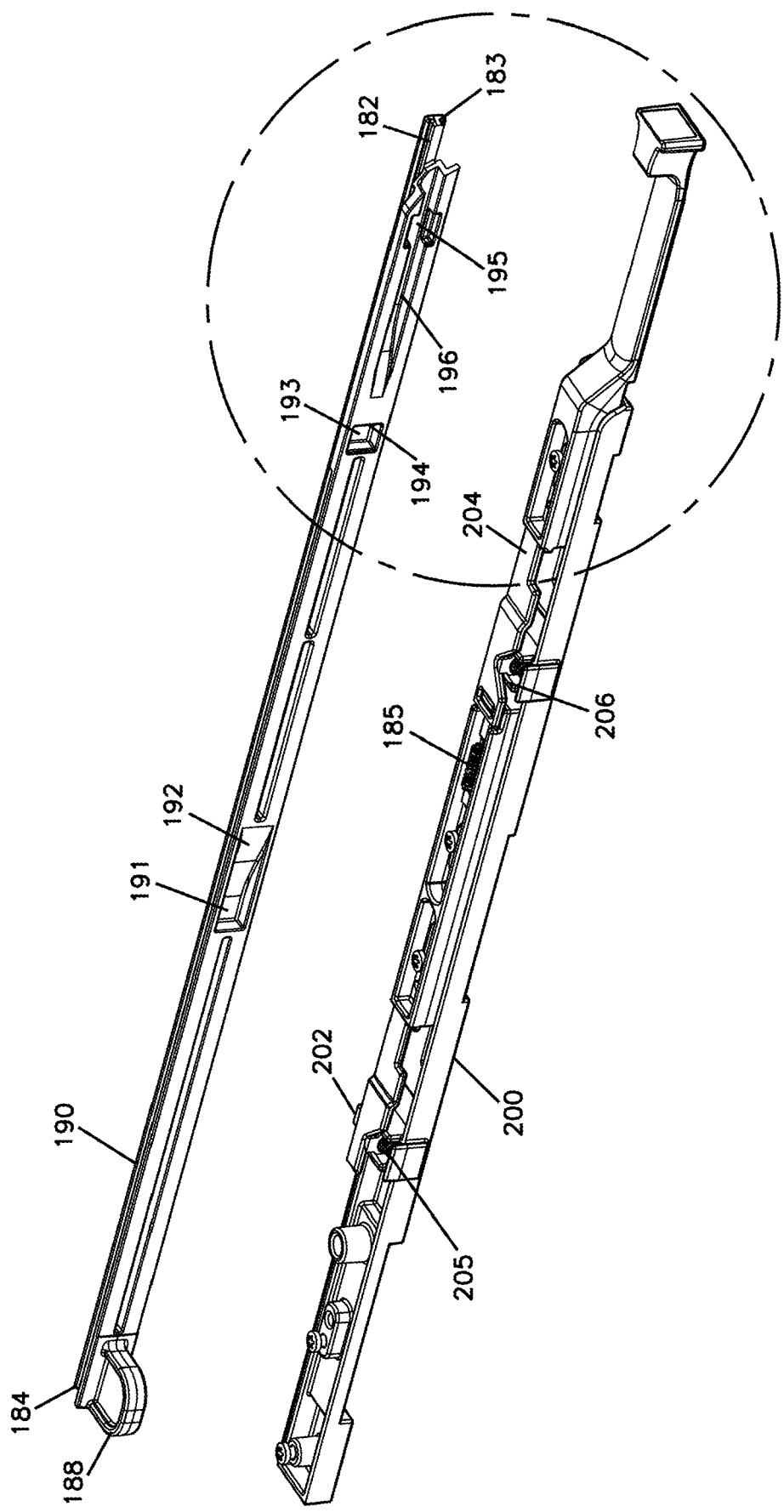
FIG. 19 is a perspective view of the intermediate guide member and the latching arrangement of FIG. 16 with a cover of the latching arrangement removed for clarity.

As shown in FIG. 19, the intermediate guide member 190 has a first cavity 191 and a second cavity 193. A ramp 192 extends forwardly to lead out of the first cavity 191. The front of the second cavity 193 steps outwardly to define a shoulder 194. A channel 196 is disposed forwardly of the second cavity 193. An enlarged section of the channel 196 defines a third cavity 195. The channel 196 is open to the front of the intermediate guide member 190.

Figure 14:
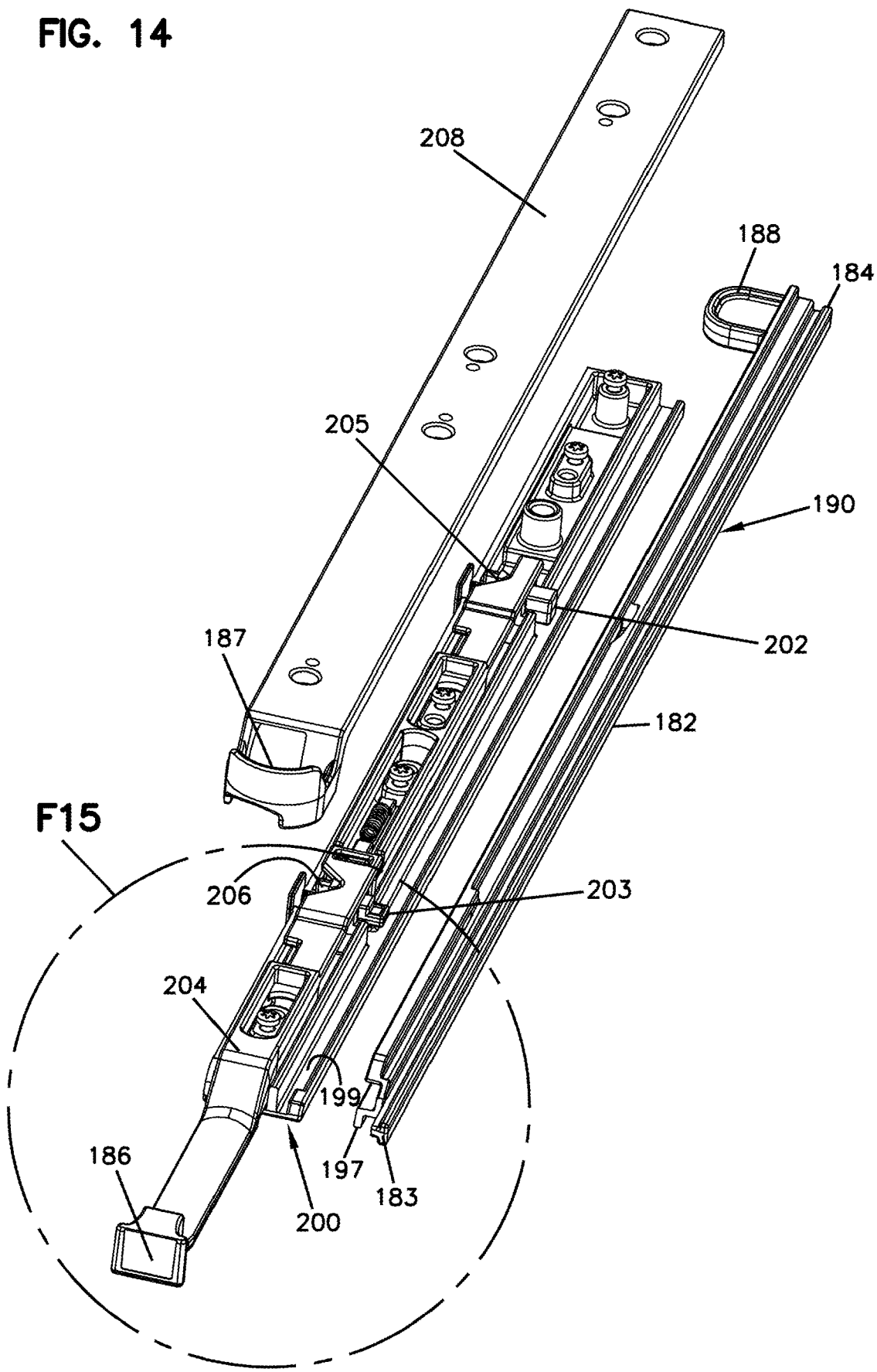
FIG. 14 is a top perspective view of an example latching arrangement and intermediate guide member exploded from each other.

As shown in FIG. 14, the latching arrangement 200 includes a first stop member 202 and a second stop member 203. In an example, a distal end of the second stop member 203 is thinner than a distal end of the first stop member 202. Each stop member 202, 203 is biased laterally outwardly towards the track 199. An actuator bar 204 extends across the stop members 202, 203 and is movable relative to the stop members 202, 203. A forward end of the actuator bar 204 forms the forward handle 186. The actuator bar 204 defines a first track 205 that aligns generally with the first stop member 202 and a second track 206 that aligns generally with the second stop member 203. The stop members 202, 203 are configured so that certain types of movement of the tracks 205, 206 relative to the stop members 202, 203 retracts one or both stop members 202, 203. A spring 185 biases the actuator bar 204 (and hence the tracks 205, 206) to a neutral position in which the stop members 202, 203 are extended.

In certain implementations, the first track 205 has only a forward ramped side. Movement of the first track 205 in a rearward direction (e.g., via rearward movement of the actuator bar 204) causes retraction of the first stop member 205. Movement of the first track 205 in a forward direction (e.g., via forward movement of the actuator bar 204) does not cause retraction of the first stop member 202. In certain implementations, the second track 206 has forward and rearward ramped sides. Movement of the second track 206 in a rearward direction (e.g., via rearward movement of the actuator bar 204) causes retraction of the second stop member 203. Movement of the second track 206 in a forward direction (e.g., via forward movement of the actuator bar 204) also causes retraction of the second stop member 203.

When the latching arrangement 200 is disposed in the operation position relative to the intermediate guide member 190, the first stop member 202 extends into the first cavity 191 and the second stop member 203 extends into the second cavity 193. Engagement between the second stop member 203 and the shoulder 194 of the second cavity 193 inhibits forward movement of the latching arrangement 200 (and hence the blade 150) relative to the intermediate guide member 190. As noted above, engagement between the rearward-facing shoulder 201 of the latching arrangement 200 and the forward-facing shoulder 198 of the intermediate guide member 190 inhibits rearward movement of the latching arrangement 200 (and hence the blade 150) relative to the intermediate guide member 190.

To move the blade 150 to the connector access position, the user pulls the handle 186 of the actuator bar 204, thereby moving the first and second tracks 205, 206 forwardly relative to the stop members 202, 203. Movement of the first track 205 relative to the first stop member 202 does not cause retraction of the first stop member 202. Movement of the second track 206 relative to the second stop member 203 retracts the second stop member 203, thereby removing the second stop member 203 from engagement with the shoulder 194 of the second cavity 193. Continued pulling on the handle 186 pulls the actuator bar 204, which entrains the latching arrangement 200 (and hence the blade 150) to move forwardly relative to the intermediate guide member 190. The first stop member 202 cams up the ramp 192 of the first cavity 191, which retracts the first stop member 202. The second stop member 203 moves forwardly of the second cavity 193.

The user pulls the handle 186 (and hence the blade 150) forwardly relative to the chassis housing 111 until the first stop member 202 snaps into the second cavity 193 of the intermediate guide member 190. The second stop member 203 slides along the channel 196 without being stopped. When the first stop member 202 aligns with the second cavity 193, the blade 150 is disposed in the connector access position. Engagement between the first stop member 202 and the second cavity 193 inhibits both forward and rearward movement of the blade 150 relative to the intermediate guide member 190 (and hence the chassis 110).

To move the blade 150 away from the connector access position, the user pushes the handle 186 of the actuator bar 204, thereby moving the first and second tracks 205, 206 rearwardly relative to the stop members 202, 203. Rearward movement of the first track 205 relative to the first stop member 202 causes retraction of the first stop member 202, thereby removing the first stop member 202 from engagement with the second cavity 193. Rearward movement of the second track 206 relative to the second stop member 203 also retracts the second stop member 203. Continued pushing on the handle 186 will cause the blade 150 to move rearward relative to the intermediate guide member 190 until the second stop member 203 snaps into the second cavity 193.

Alternatively, the user may pull forwardly on a portion of the latching arrangement 200 while pushing on the forward handle 186. For example, the latching arrangement 200 may include a brace member 187 accessible from the front of the chassis 110. In the example shown, the brace member 187 is disposed on the cover 208 of the latching arrangement 200. In examples, a first finger of the user may pull on the brace member 187 while the thumb of the user pushes on the handle 186. Pulling on the latching arrangement 200 while pushing on the handle 186 moves the blade 150 forwardly so that the first stop member 202 aligns with the channel 196 of the intermediate guide member 190.

The user continues to pull the brace member 187 until the first stop member 202 snaps into the third cavity 195. In certain implementations, a distal end of the first stop member 202 is larger than a distal end of the second stop member 203. Accordingly, the first stop member 202 is sized to engage forward and rearward walls of the third cavity 195. This engagement inhibits forward and rearward movement of the blade 150 relative to the intermediate guide member 190. The second stop member 203, on the other hand, is sized to slide through the third cavity 195 along the channel 196 without engaging walls of the third cavity 195.

To move the blade 150 away from the adapter access position, the user pushes the handle 186 of the actuator bar 204, thereby retracting both stop members 202, 203. Continuing to push the handle 186 without pulling on the brace member 187 causes rearward movement of the blade 150 relative to the intermediate guide member 190. Since the stop members 202, 203 are retracted, the blade 150 can be slid relative to the intermediate guide member 190 until the rearward-facing shoulder 201 of the latching arrangement 200 engages the forward-facing shoulder 198 of the intermediate guide member 190 at the operation position.

In certain examples, the forward-facing shoulder 209 of the latching arrangement 200 and the rearward-facing shoulder of the guide member 190 engage when the blade 150 is disposed in the adapter access position. Accordingly, continued forward movement of the blade 150 relative to the intermediate guide member 190 from the adapter access position is inhibited even when the stop members 202, 203 are retracted.

FIGS. 20-33 illustrate another example bladed chassis system 300 including blades mounted within a chassis and a multi-fiber cable routed to a rear of the chassis. The chassis includes a first rear door that guides the cables around a hairpin turn to direct the cables from the chassis interior to the rear cable port. A second rear door cooperates with the first rear door to extend across the rear of the chassis and define the rear cable port. The first rear door manages the cables while the first rear door moves from a first position extending across the rear of the chassis to a second position providing access to the rear of the chassis.

A moving arm arrangement is coupled to a blade mounted within the chassis. The moving arm arrangement manages the optical cables extending from the first rear door to one or more rear ports on the blade. The moving arm arrangement is configured to maintain a minimum bend radius of the cables during movement of the blades between stowed positions, first extended positions, and second extended positions. The moving arm arrangement includes stops that inhibit movement of the moving arm arrangement beyond a minimum bend radius of the cables.

The chassis includes guides along which the blades slide. Each guide includes a deflectable tab at a rear of the guide. A latch system on each blade includes a rail that abuts the tab. When in the undeflected position, the tab inhibits rearward movement of the blade through engagement with the rail. When in the deflected position, the tab allows the rail, and hence the blade, to bypass the tab and slide out of the chassis.

Figure 20:
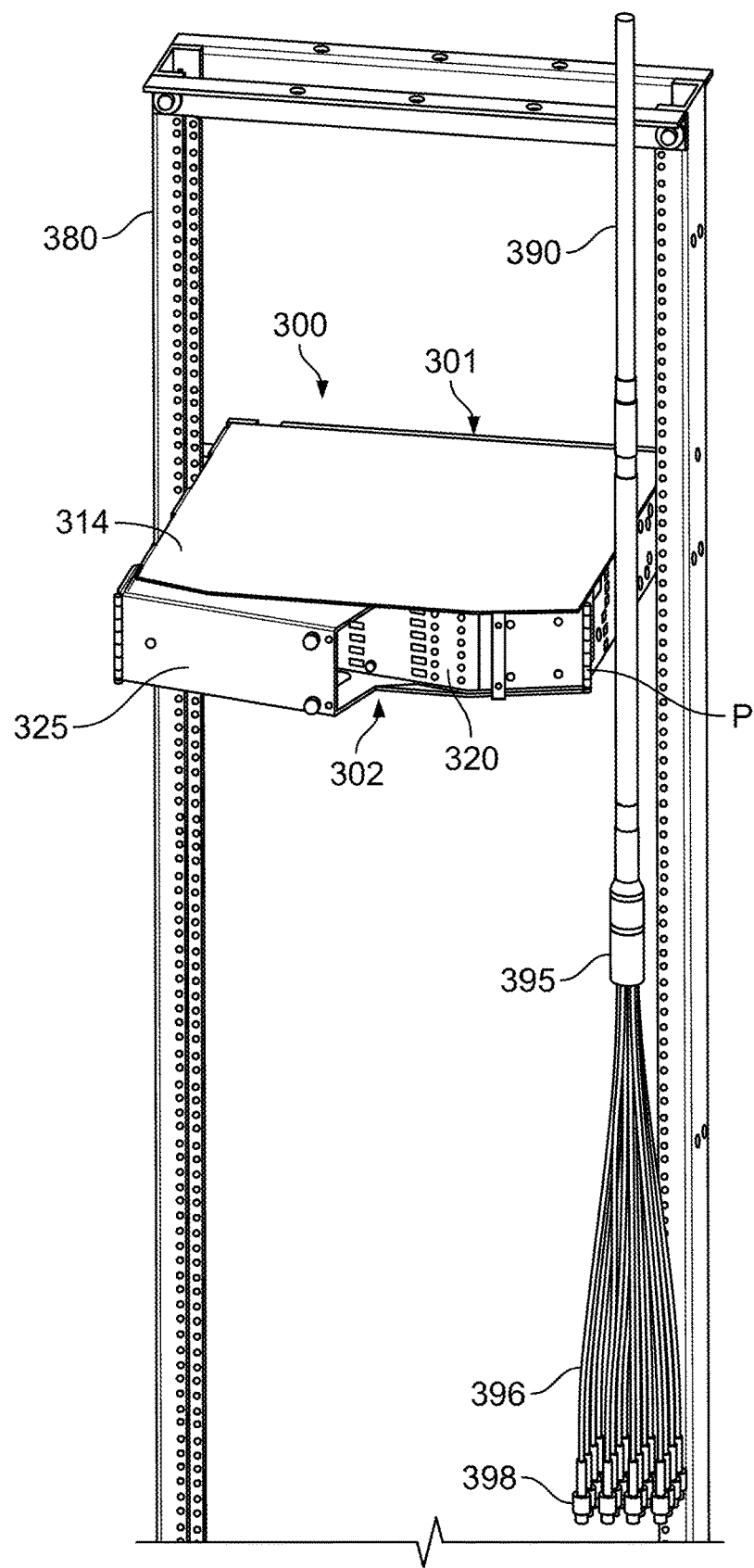
FIG. 20 is a perspective view of another example bladed chassis system mounted to a rack.

FIG. 20 illustrates the example bladed chassis system 300 mounted to a rack 380. The chassis system 300 has a front 301 and a rear 302. The chassis system 300 includes a chassis 310 and one or more blades 350. A cable 390 to be connected to the bladed chassis system 300 is routed down a rear of the rack 380. The cable 390 includes a plurality of fibers 396 terminated at optical connectors 398.

The chassis 310 includes a housing 311 having two sidewalls 313 extending between a first end wall 312 and a second end wall 314. The first end wall 312, sidewalls 313, and second end wall 314 define an interior 315 (FIG. 21) having an open front 316 and an open rear. Mounting brackets 319 are disposed at exterior surfaces of the sidewalls 313.

The chassis system 300 is configured to receive one or more multi-fiber cables at the rear 302 of the chassis system 300. In certain examples, the chassis system 300 defines one or more cable ports P at the rear 302 of the chassis system 300. One or more multi-fiber cables 390 can be received and anchored at one of the ports P at the discretion of the user.

A cable bracket arrangement 320 and a bracket cover arrangement 325 are mounted to the chassis housing 311 at the open rear. Each of the cable bracket arrangement 320 and the bracket cover arrangement 325 are movable between an open position and a closed position. The cable bracket arrangement 320 and the bracket cover arrangement 325 cooperate to close the open rear when both are disposed in the closed positions (see FIG. 21). The cable bracket arrangement 320 and the bracket cover arrangement 325 also cooperate to define the rear cable port P (FIG. 21) when disposed in the closed positions. Moving both the cable bracket arrangement 320 and bracket cover arrangement 325 to the open positions reveals the open rear of the housing 311.

In various implementations, the chassis 310 can hold multiple (e.g., two, three, four, five, six, eight, etc.) blades 350. Accordingly, the chassis 310 can be sized at 1 RU, 2 RU, 3 RU, 4 RU, 5 RU, 6 RU, etc. In some implementations, the blades 350 to be inserted into the chassis interior 315 through the open front 316. In other implementations, the blades 350 to be inserted into the chassis interior 315 through the open rear. For examples, the cable bracket arrangement 320 and bracket cover arrangement 325 can be pivoted to the open positions to allow blade insertion from the rear. In still other implementations, the blades 350 to be inserted into the chassis interior 315 selectively through the open front 316 or the rear 317.

Figure 23:
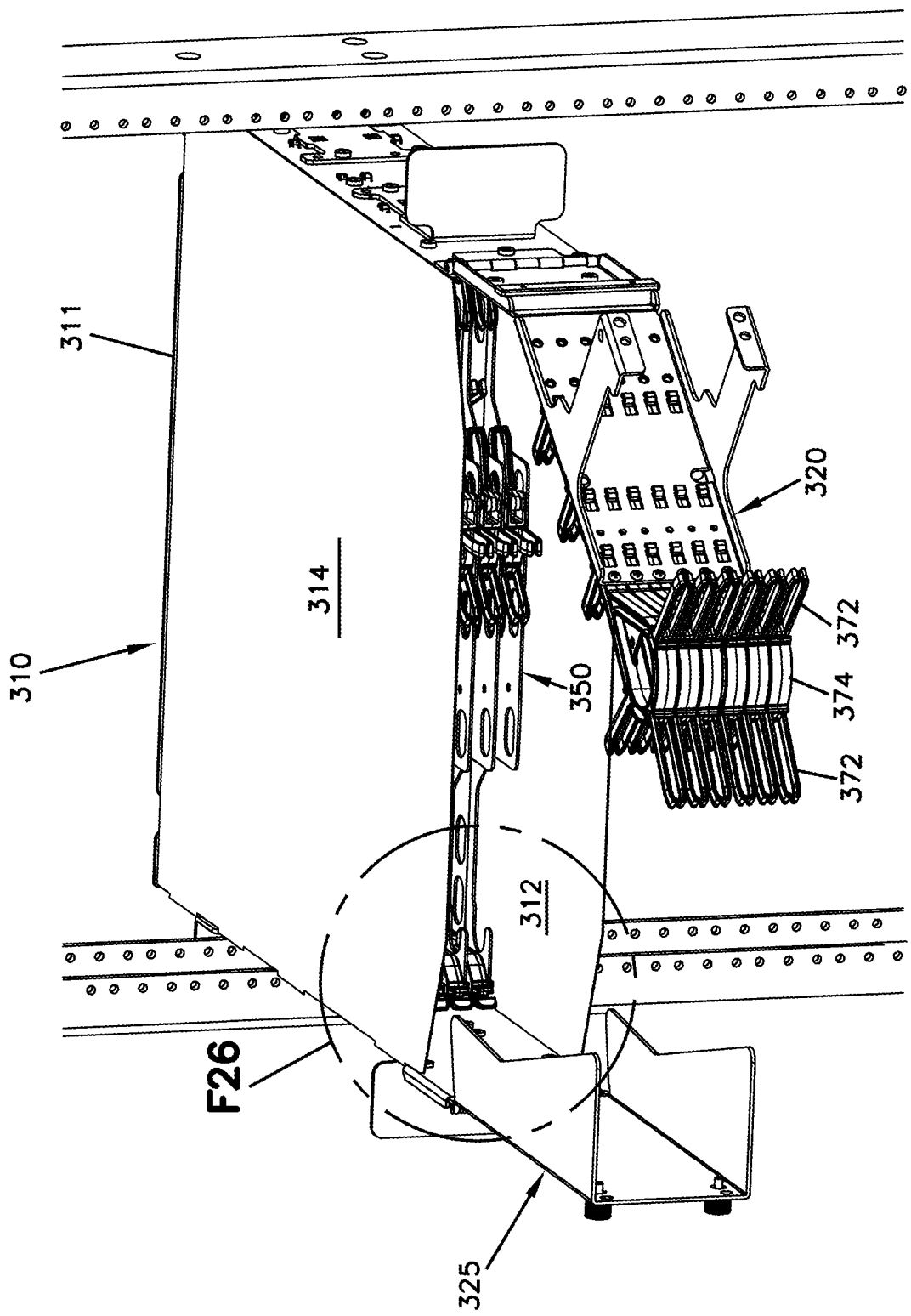
FIG. 23 is a rear perspective view of the bladed chassis system of FIG. 22 with the cable bracket arrangement disposed in a partially open position.

As shown in FIG. 23, the cable bracket arrangement 320 attaches to one of the sidewalls 313 at a hinge 321, which enables the cable bracket arrangement 320 to pivot relative to the sidewall 313. The cable bracket arrangement 320 is configured to pivot between a closed position and an open position. The cable bracket arrangement 320 includes a bracket receiving surface 323 that extends at least partially across the rear 302 of the chassis 310 when the cable bracket arrangement 320 is in the closed position. When the cable bracket arrangement 320 is in the open position, the bracket receiving surface 323 is sufficiently clear of the rear 302 of the chassis 310 to enable a blade 350 to enter/exit the chassis 310 through the rear 302. One or more arms 324 extend outwardly from the bracket receiving surface 323 so that the arms 324 extend rearwardly when the cable bracket arrangement 320 is closed.

The bracket cover arrangement 325 attaches to one of the sidewalls 313 at a hinge 326, which enables the bracket cover arrangement 325 to pivot relative to the sidewall 313. The bracket cover arrangement 325 is configured to pivot between a closed position and an open position. The bracket cover arrangement 325 includes a bracket covering surface 327 that extends at least partially across the rear 302 of the chassis 310 when the bracket cover arrangement 325 is in the closed position. When the bracket cover arrangement 325 is in the open position, the bracket covering surface 327 is sufficiently clear of the rear 302 of the chassis 310 to enable a blade 350 to enter/exit the chassis 310 through the rear 302.

Flanges 328 extend forwardly of the bracket covering surface 327 to engage the arms 324 of the cable bracket arrangement 320. The arms 324 and flanges 328 cooperate to define the cable port P at the rear 302 of the chassis 310.

One or more fasteners 329 can be used to secure the bracket cover arrangement 325 and the cable bracket arrangement 320 in the closed positions.

In some implementations, the cable bracket arrangement 320 carries a guide arrangement 370 that manages cables entering the chassis 310 from the rear 302. The guide arrangement 370 includes multiple latching clips or fingers 372 that extend outwardly from the cable bracket arrangement 320 to form a plurality of cable paths. The guide arrangement 370 also includes a bend radius limiter section 374 that guides cables from the interior 315 of the chassis 310 to the cable port P while maintaining a minimum bend radius of the cables.

Figure 24:
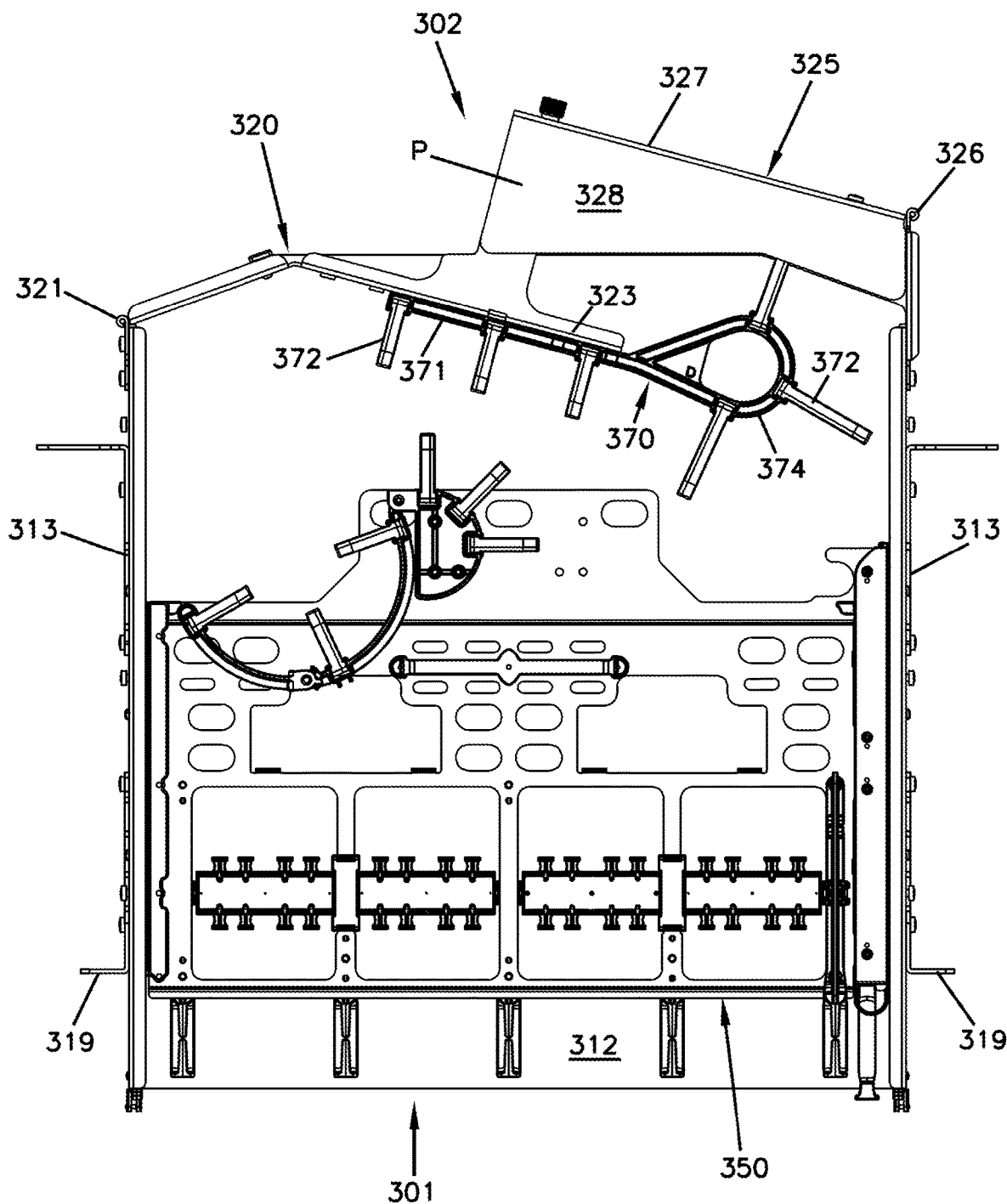
FIG. 24 illustrates a top plan view of the bladed chassis system of FIG. 20 with a top cover removed for ease in viewing a blade loaded therein.
Figure 25:
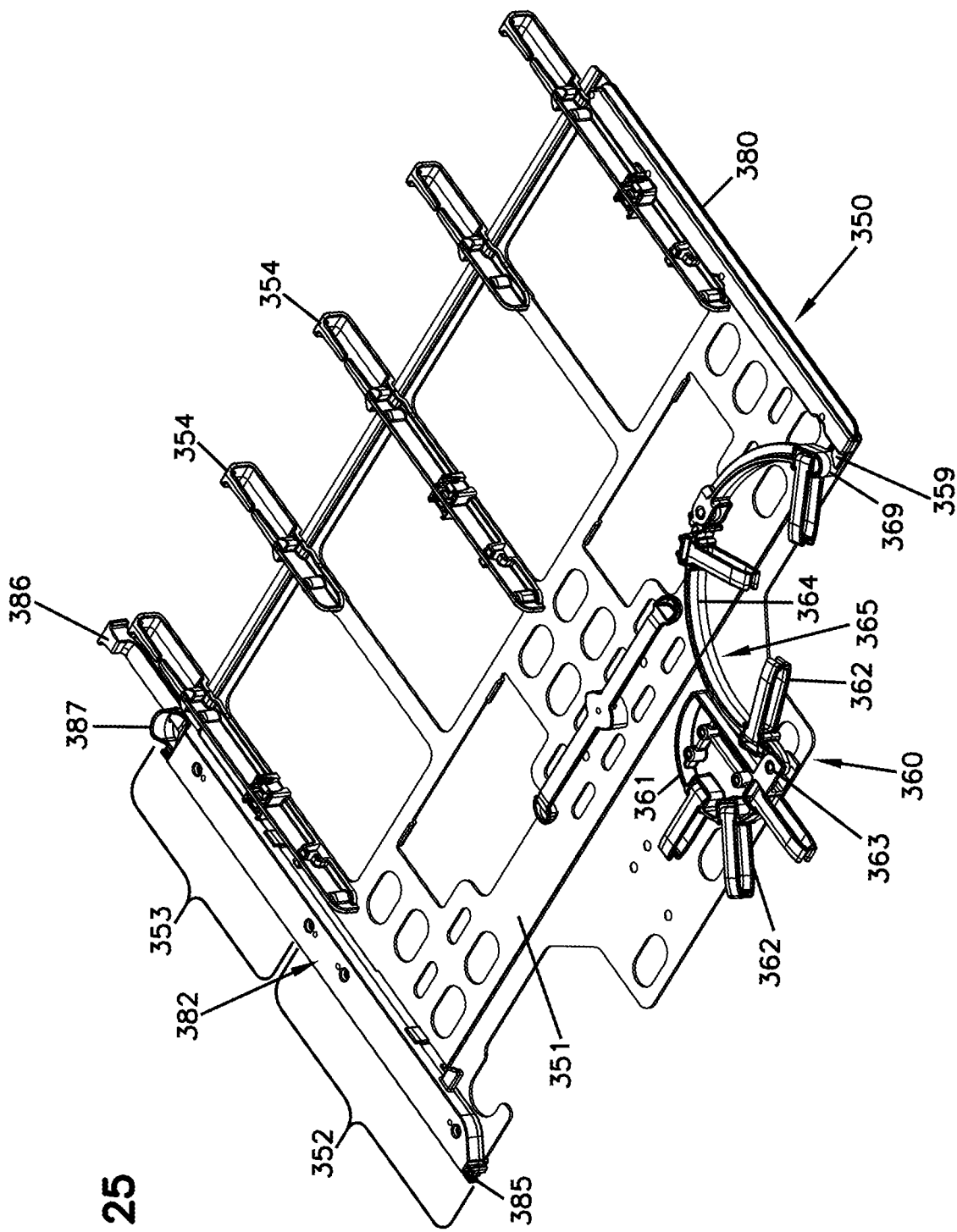
FIG. 25 is a perspective view of an example blade suitable for use in the bladed chassis system of FIG. 20.
Figure 26:
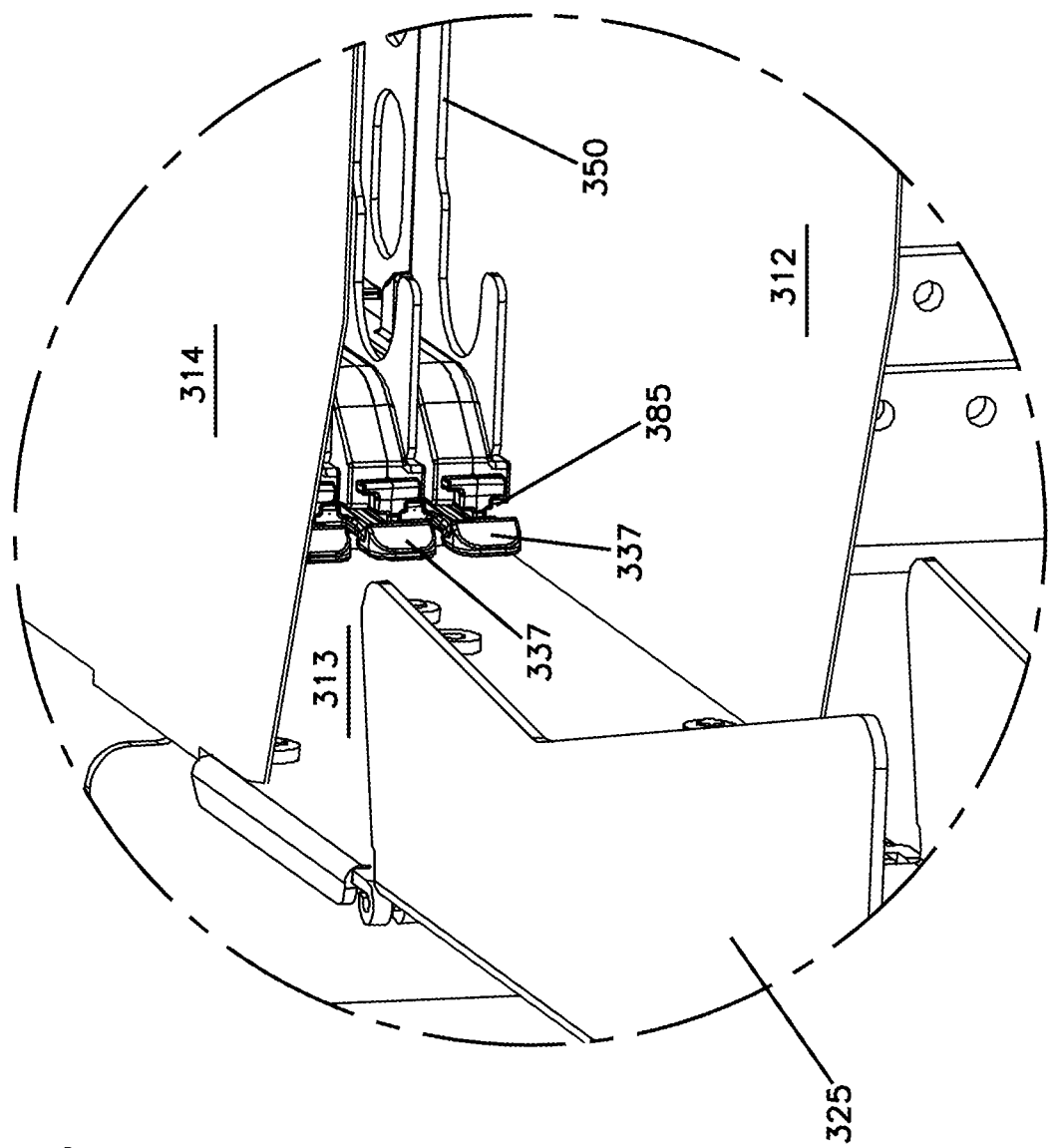
FIG. 26 is an enlarged view of an interaction between a blade rail and guide members on the chassis of the bladed chassis system of FIG. 20.
Figure 27:
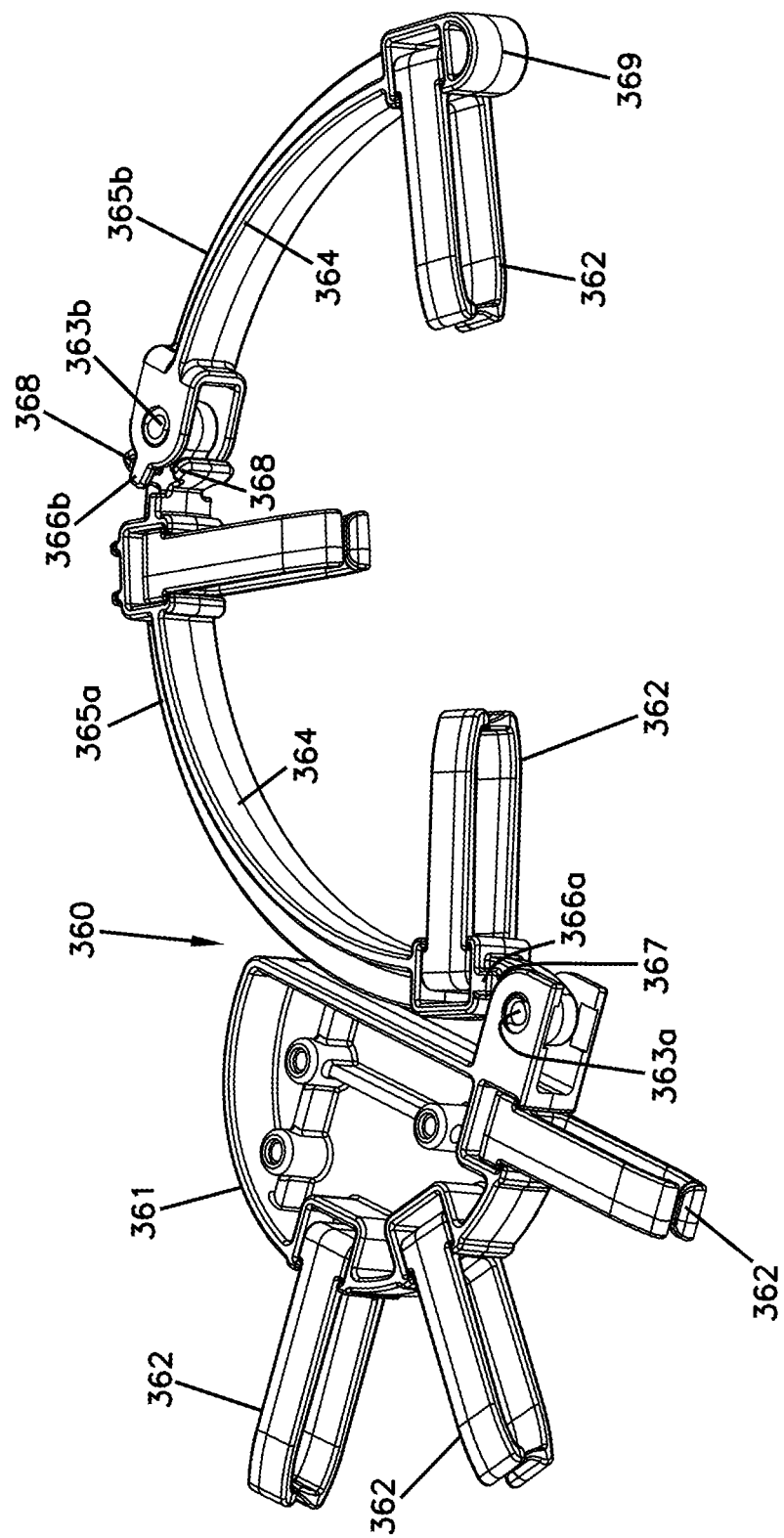
FIG. 27 is an isolated view of an example moving arm arrangement suitable for use on the blade of FIG. 25.
Figure 28:
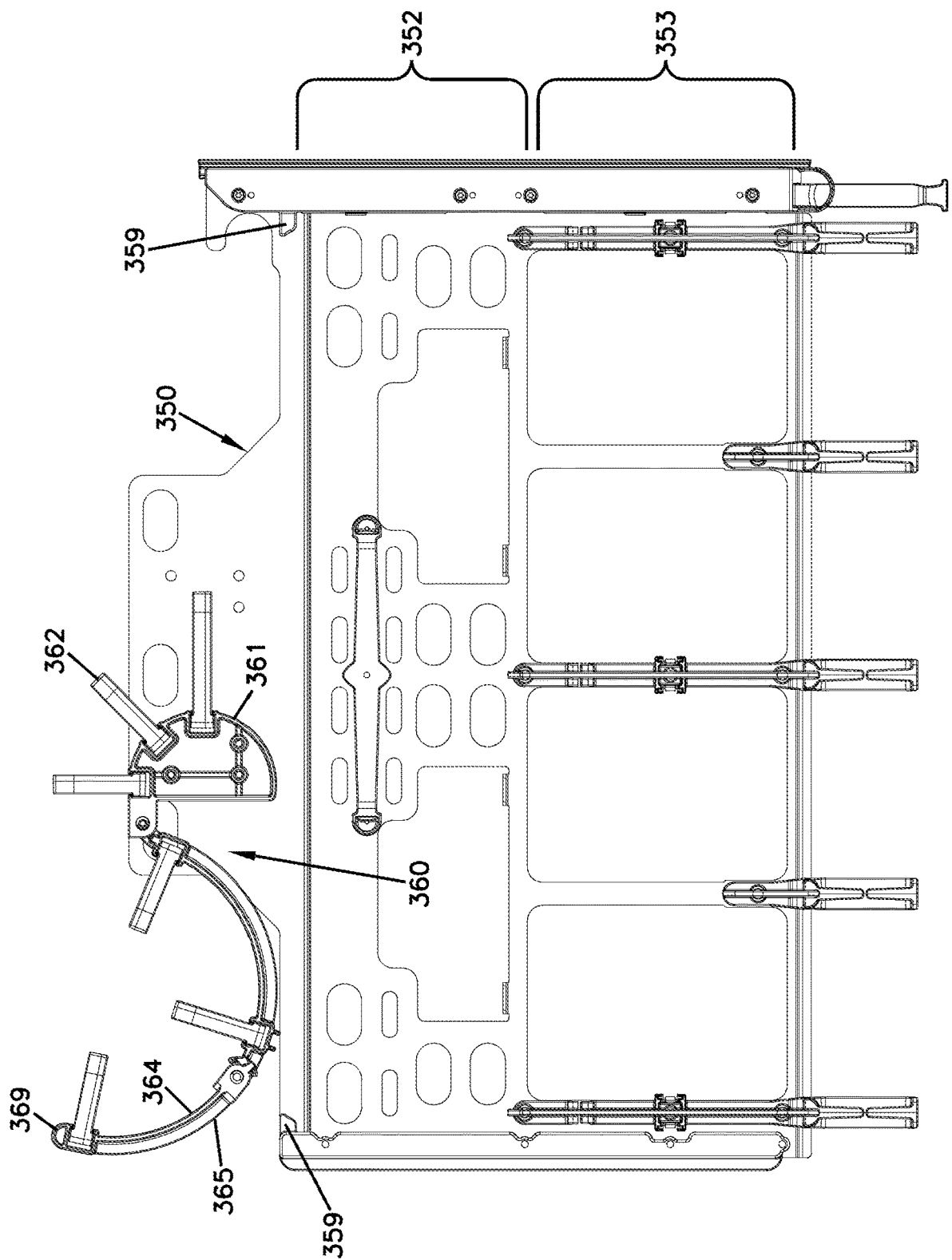
FIG. 28 shows the moving arm arrangement mounted to the blade of FIG. 25 and disposed in the closed position.
Figure 29:
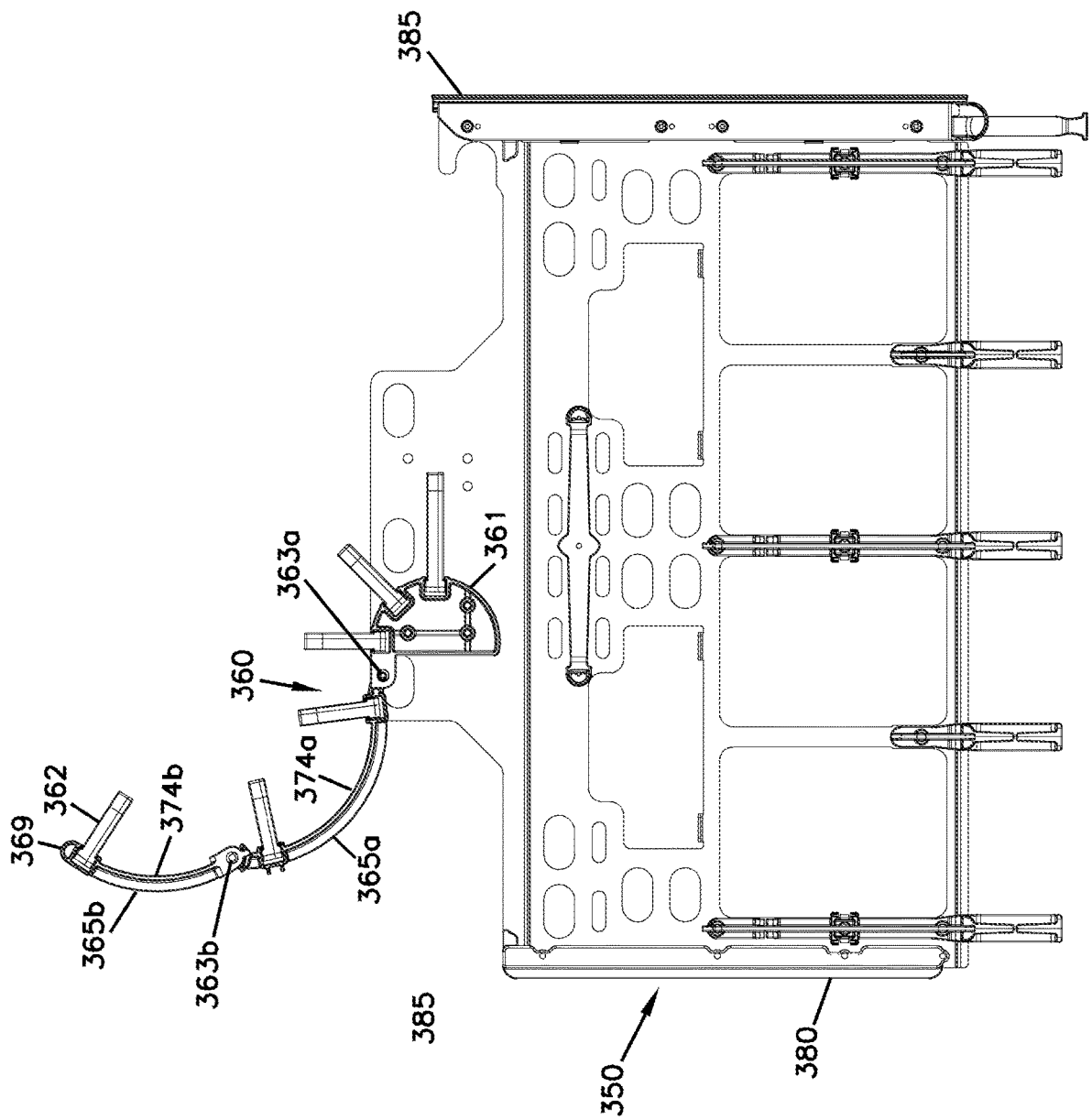
FIG. 29 shows the moving arm arrangement mounted to the blade of FIG. 25 and disposed in the open position.

FIGS. 24-25 illustrate an example blade 350 configured to mount within the interior 315 of a bladed chassis system 300. Each blade 350 includes a base 351 extending from a front to a rear. The base 351 includes a fiber management section 352 towards the rear and a termination section 353 towards the front. The fiber management section 352 is configured to hold fiber management structures (e.g. moving arm arrangement 360) to retain and manage the optical fibers routed onto the blade 350. Fiber retainer members 354 extend forwardly of the termination section 353.

One or more optical adapters are disposed at the termination section 353. U.S. application Ser. No. 14/747,854, incorporated herein by reference above, illustrates one way the optical adapters can be coupled to the blade 350. Connectorized ends of the optical fibers managed at the fiber management section 352 can be plugged into rear ports of the optical adapters. Example adapter modules suitable for mounting at the termination section 353 can be found in U.S. Publication No. 2014-0219614, U.S. Publication No. 2014-0219615, and U.S. application Ser. No. 14/611,924, the disclosures of which are incorporated by reference above. In other implementations, simplex optical adapters can be individually mounted at the termination section 353.

The chassis 310 and the blades 350 are configured to facilitate movement between the blades 350 and the chassis housing 311. For example, one or more first guide members are disposed at an inner surface of one of the chassis sidewalls 313. Each first guide member defines one or more open-ended channels. Each blade 350 includes a first rail 380 that is sized and shaped to slide along one of the channels. The first rail 380 is substantially similar to the first rail 180 of the bladed chassis system 100 described above.

Figure 21:
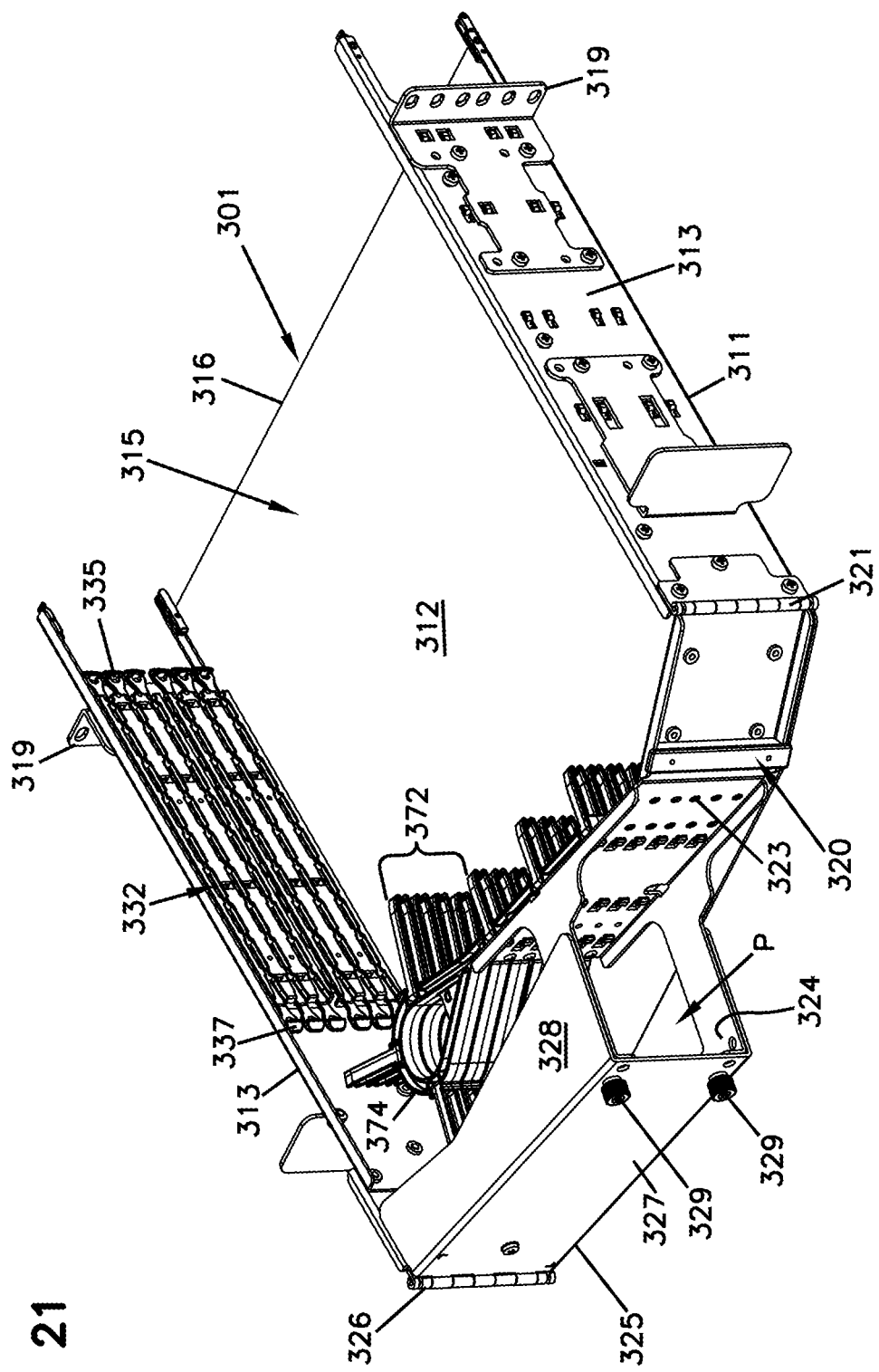
FIG. 21 is a top perspective view of an unloaded chassis of the bladed chassis system of FIG. 20 with a cover removed for ease in viewing.
Figure 22:
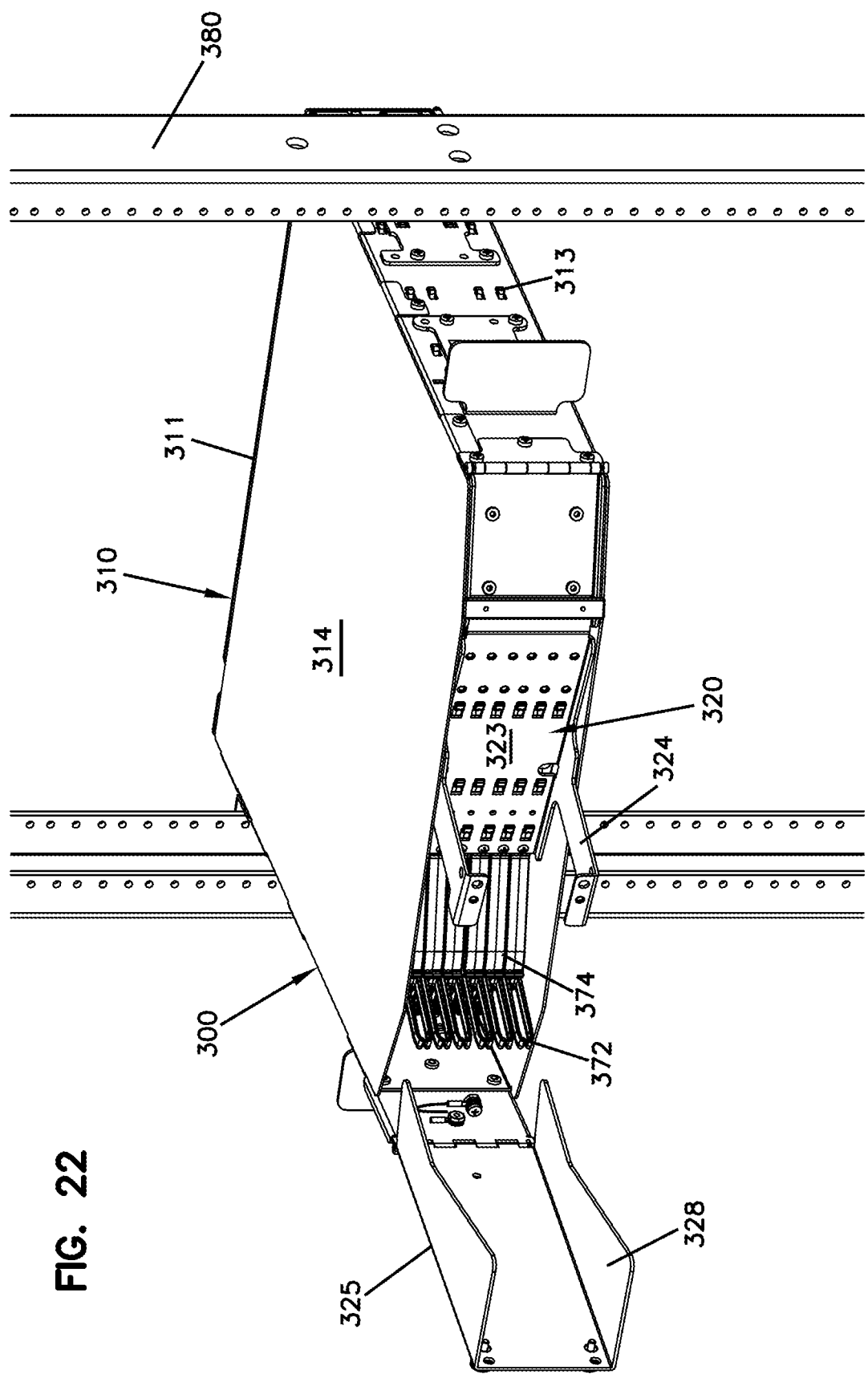
FIG. 22 is a rear perspective view of the bladed chassis system of FIG. 20 with a bracket cover arrangement disposed in an open position to expose a cable bracket arrangement.

One or more second guide members 332 are disposed at an inner surface of another of the chassis sidewalls 313 (see FIG. 21). The second guide member 332 also defines one or more channels. Each blade 350 includes a second rail 385 that is sized and shaped to slide along one of the channels. The first and second guide members 330, 332 are structured to selectively receive the blades 350 in a first orientation and in a second orientation that is flipped 180° from the first orientation. Accordingly, the blades 350 can be installed in the chassis 310 when the chassis is disposed in a first orientation; the blades 350 also can be installed in the chassis 310 when the chassis 310 is disposed in a second orientation that is flipped 180° from the first orientation.

The second rail 385 is axially movable relative to the blade base 351. In certain implementations, each second guide member 332 is configured to hold the second rail 385 at an axially fixed position within the chassis housing 311. For example, each second guide member 332 includes one or more forward latching members 335 and one or more rearward latching members 337. When a blade 350 is disposed within the chassis housing 311, the forward latching member 335 engages a forward end of the second rail 385 and the rearward latching member 337 engages a rearward end of the second rail 385.

Accordingly, a blade 350 can be inserted into the interior 315 of the chassis housing 311 through either the open front 316 or the open rear (after opening the cable bracket arrangement 320 and bracket cover arrangement 325). When inserting the blade 350, the end of the second rail 385 cams against the forward or rearward latching member 335, 337 to deflect the forward or rearward latching member 335, 337 sufficient to allow the second rail 385 to enter the channel of the guide 332. To remove the blade 350 from the chassis housing 311, a user deflects one of the latching members 335, 337 to release the second rail 385. The user can then push or pull the blade 350 out of the chassis housing 311 so that the first rail 380 and the second rail 382 slide along the channels 131 of the guides 330, 332.

In accordance with some aspects of the disclosure, the blade 350 is movable relative to the second rail 385 between two or more discrete positions. As the term is used herein, a "discrete" position indicates a position at which the user receives some type of feedback (e.g., tactile feedback, audible feedback, etc.) that the blade 350 has reached a predetermined position relative to the chassis 310. In certain examples, the blade 350 can be moved relative to the second rail 385 between an operation position and a connector access position. In an example, the blade 350 can be moved relative to the second rail 385 between the operation position, the connector access position, and an adapter access position. In an example, the connector access position is located forwardly of the operation position, and the adapter access position is located forwardly of the connector access position.

In certain implementations, the blade 350 can be releasably locked into one or more of the positions. As the term is used herein, a blade 350 is "locked" in position if the user must take affirmative steps beyond applying forward/rearward pressure to the blade 350 to move the blade 350 relative to the chassis 311. In some implementations, the second rail 382 is coupled to an intermediate guide member, which cooperates with a latching arrangement. In certain implementations, the intermediate guide member and the latching arrangement are substantially similar to the intermediate guide member 190 and the latching arrangement 200 described above.

In certain implementations, the latching arrangement 200 is configured to lock the blade 350 relative to the intermediate guide member 190 in the operation position. In certain implementations, the latching arrangement 200 is configured to lock the blade 350 relative to the intermediate guide member 190 in the connector access position. In certain implementations, the latching arrangement 200 is configured to lock the blade 350 relative to the intermediate guide member 190 in the adapter access position. In certain implementations, the latching arrangement 200 is configured to lock the blade 350 relative to the intermediate guide member 190 in any discrete position.

Each blade 350 includes a moving arm arrangement 360 mounted to the blade 350 at the fiber management section 352. The moving arm arrangement 360 manages the optical fibers extending from the guide arrangement 370 and onto the blade 350. The moving arm arrangement 360 inhibits bending of the optical fibers beyond a minimum bend radius during movement of the blades 350 between discrete positions. The moving arm arrangement 360 includes a stationary bend radius limiter 361 mounted to the blade base 351. One or more fiber clips or retaining arms 362 extend outwardly from the stationary limiter 361.

A moving arm 365 is movably coupled to the stationary bend radius limiter 361. The moving arm 365 defines a guide surface 364 along which the fibers can be routed. One or more fiber clips or retaining arms 362 extend from the guide surface 364 to aid in holding the fibers to the guide surface 364. In some implementations, the guide surface 364 defines a generally curved path. In certain implementations, the guide surface 364 defines a generally concave path. In some examples, the guide surface 364 has a generally continuous curvature. In other examples, the guide surface 364 does not have a continuous curvature.

The moving arm 365 can be moved relative to the stationary limiter 361 between a shipping position, a closed position, and an open position. When no fibers are held by the moving arm arrangement 360, the moving arm 365 is stowed in the shipping position (see FIG. 25). When fibers are held by the moving arm arrangement 360 and the corresponding blade 350 is disposed in the operation position, the moving arm 365 is in the closed position (see FIG. 28). When the fibers are held by the moving arm arrangement 360 and the corresponding blade 350 is disposed in the connector access position, the moving arm 365 is in the open position (see FIG. 29).

In some implementations, the moving arm 365 includes multiple pieces that are movable relative to each other. In certain implementations, the moving arm 365 includes a first arm 365a and a second arm 365b. The first arm 365a defines part of the guide surface 364. The first arm 365a is pivotally coupled to the stationary limiter 361 at a pivot point 363a. The first arm 365a pivots between the shipping position, the closed position, and the open position. The second arm 365b also defines part of the guide surface 364. In certain implementations, the second arm 365b is pivotally coupled to the first arm 365a at a pivot point 363b to travel relative to the first arm 365a.

In certain implementations, the moving arms 365a, 365b include limiting tabs 366a, 366b configured to interact with stop surfaces 367, 368, respectively. For example, the first moving arm 365a includes a limiting tab 366a that is configured to abut a stop surface 367 attached to the stationary limiter 361. Engagement between the limiting tab 366a and the stop surface 367 inhibits continued movement of the first arm 365a relative to the stationary limiter 361, thereby providing a maximum extension of the moving arm 365 relative to the stationary limiter 361. Limiting the maximum extension of the moving arm 365 inhibits excessive bending of the optical fibers routed from the stationary limiter 361 to the guide surface 364.

The second moving arm 365b includes a limiting tab 366b that is configured to pivot between two stop members 368. Engagement between the limiting tab 366b and the stop members 368 reduces the travel of the second arm 365b relative to the first arm 365a. Reducing the travel inhibits creating a guide surface 364 that would violate a minimum bend radius of the optical fibers.

The second moving arm 365b extends from the pivot point 363b to a distal end 369, which defines an abutment surface. The blade 350 includes a holding tab 359 against which the distal end 369 of the second moving arm 365b can rest when the moving arm 365 is disposed in the shipping position. Engagement between the holding tab 359 and the abutment surface of the second moving arm 365b maintains the position of the moving arm 365 prior to loading the moving arm 365 with fibers.

In some implementations, the moving arm arrangement 360 is coupled to be attached to the blade 350 in one of a first orientation and a second orientation. The second orientation is flipped 180° from the first orientation. In the first orientation, the moving arm 360 routes the fibers from a center of the blade 350 towards a first side of the blade 350. In the second orientation, the moving arm 360 routes the fibers from the center of the blade 350 towards a second side of the blade 350 that is opposite the first side. Accordingly, the same moving arm arrangement 360 can be used regardless of which direction the rear cable port P faces.

Figure 30:
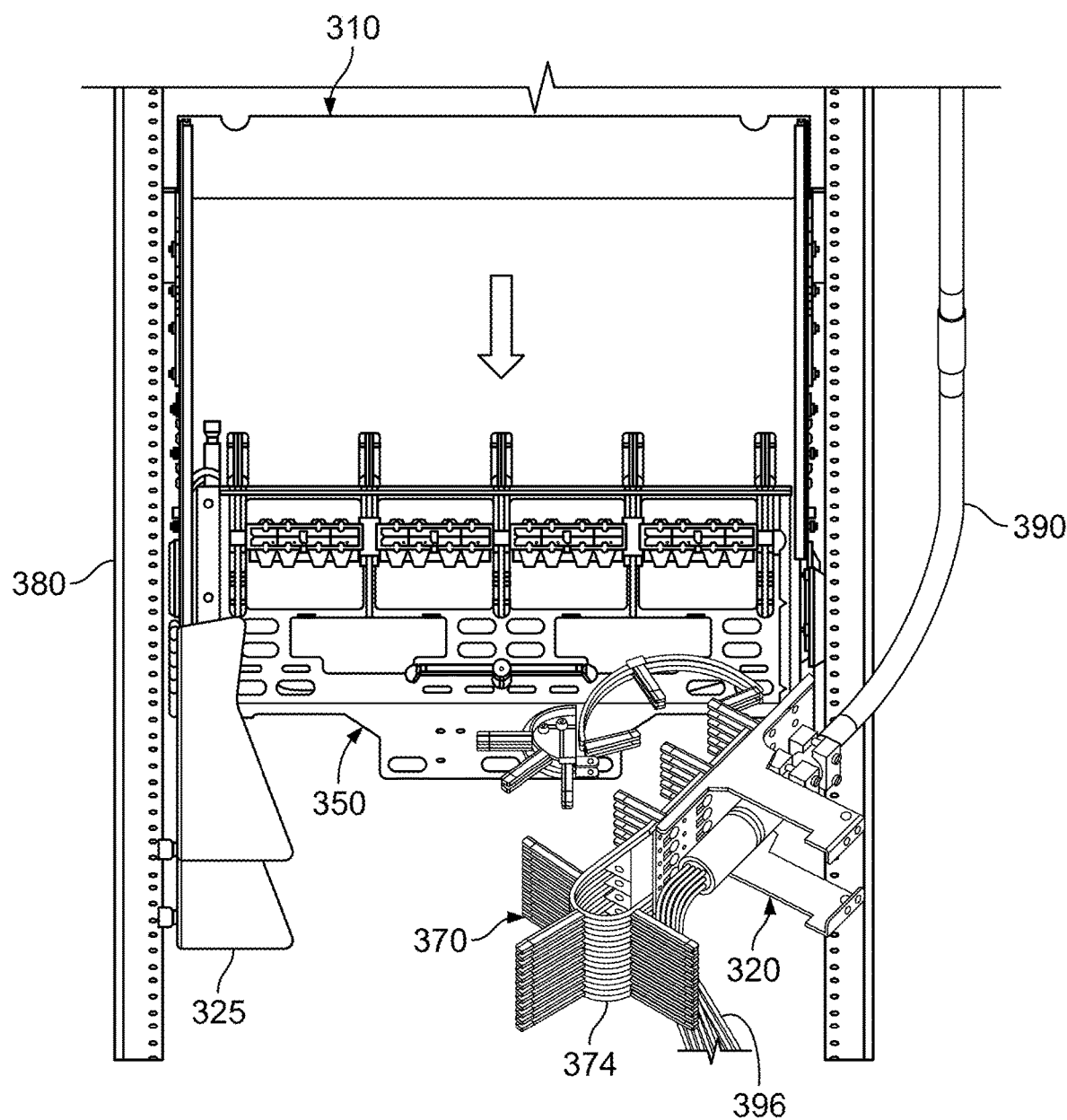
FIG. 30 illustrates the bladed chassis system of FIG. 22 with a cable anchored to the cable bracket arrangement and a blade slid to a rear position.

As shown in FIG. 30, the bladed chassis system 300 is cabled by routing one or more cables to a rear 302 of the chassis system 300. The bracket cover arrangement 325 is moved to the open position. The cable 390 is mounted to the cable bracket arrangement 320 (e.g., using clamps or brackets). The cable bracket arrangement 320 is moved to the open position to provide access to the interior 315 of the chassis 310 from the rear 302.

Figure 31:
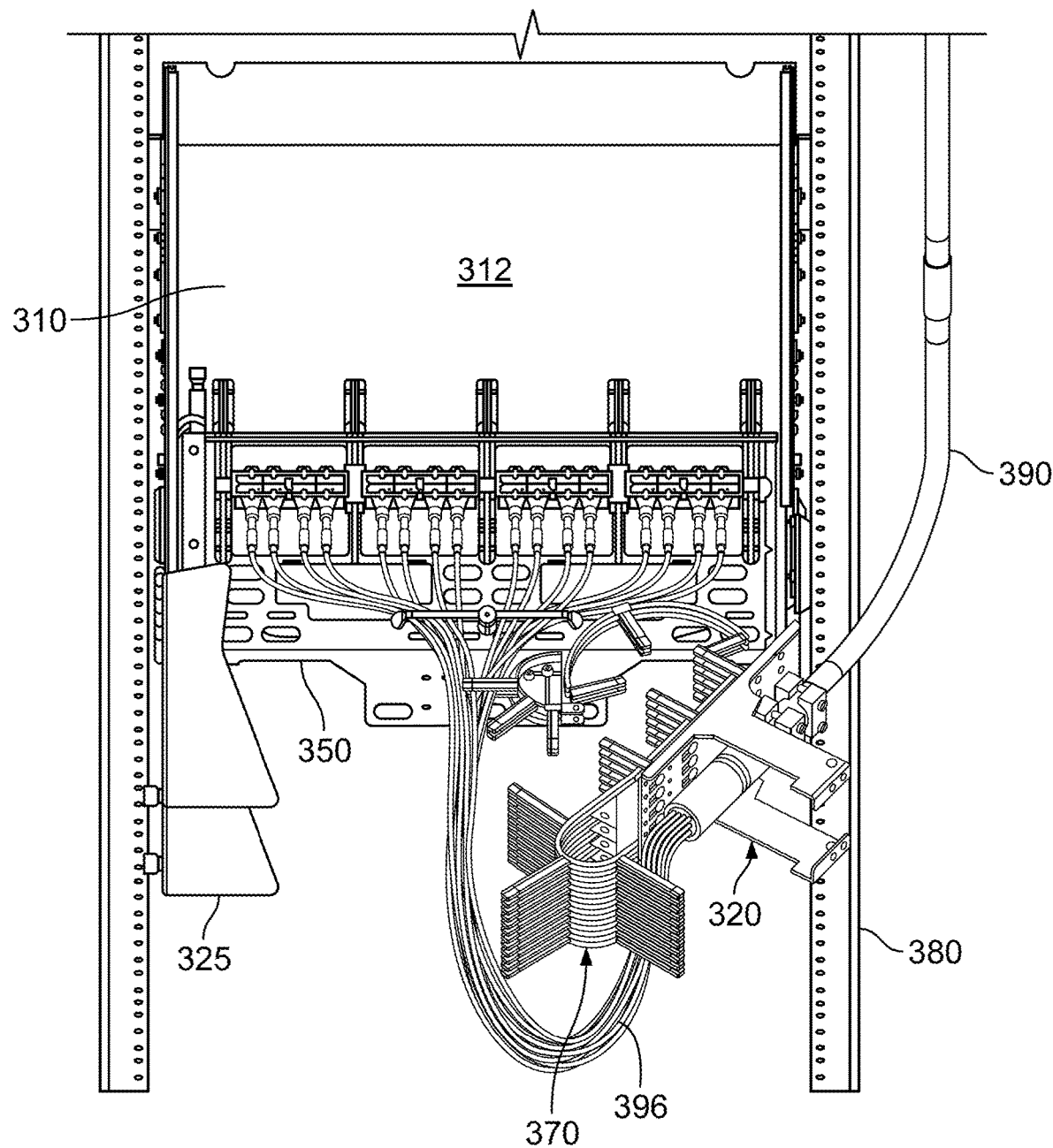
FIG. 31 illustrates the bladed chassis system of FIG. 30 with connectorized ends of the cable plugged into rear ports of the blade.

As seen in FIG. 31, one or more fibers 396 of the cable 390 are routed into the chassis interior 315 through the rear 302. Connectorized ends 398 of the fibers 396 are plugged into ports on the blade 350. Retaining arms may guide the fibers 396 towards the ports. In certain implementations, the blade 350 is moved to a discrete position rearward of the operation position to connect the fibers 396.

Figure 32:
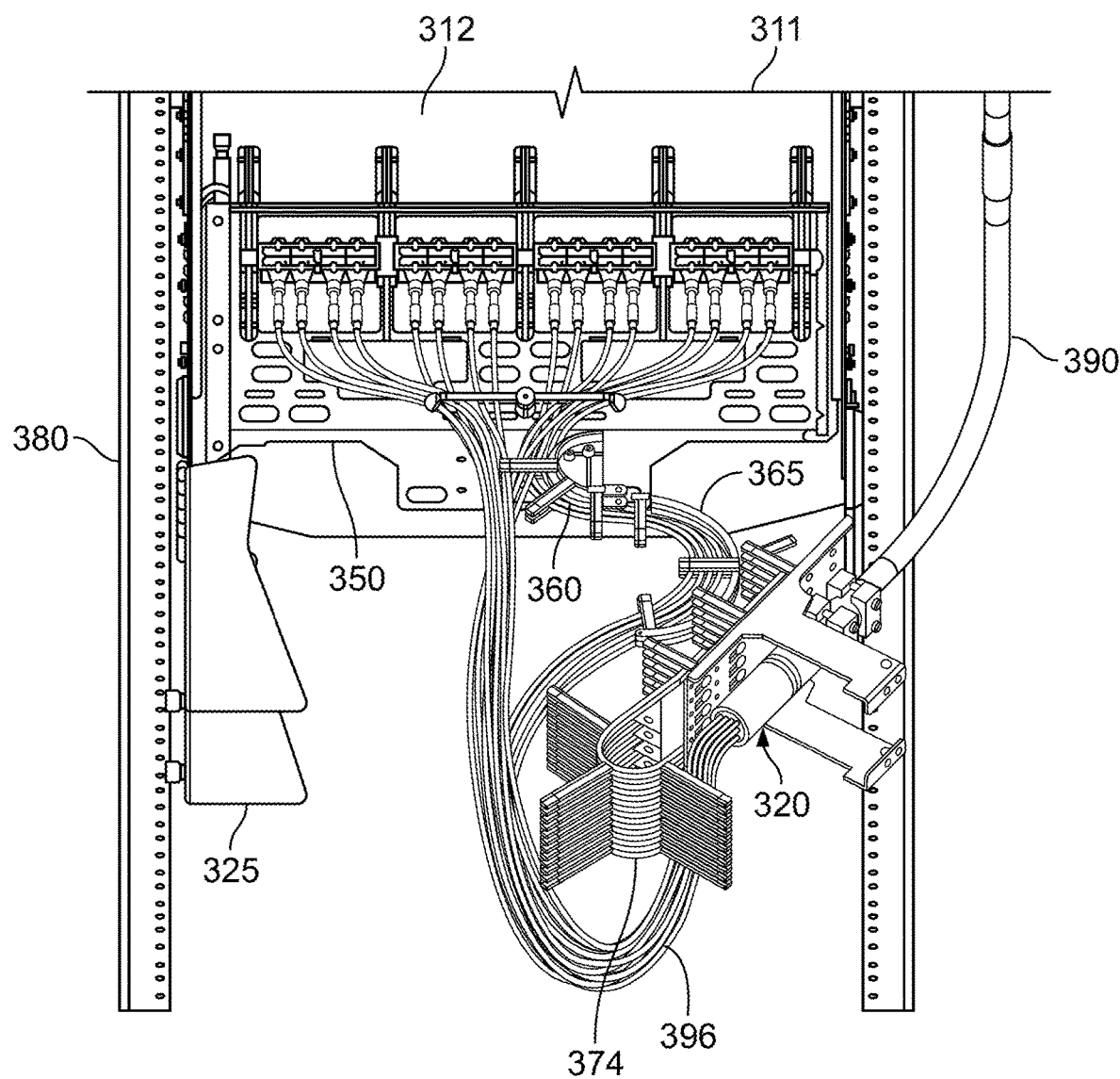
FIG. 32 illustrates the bladed chassis system of FIG. 31 with some of the fibers loaded onto the moving arm arrangement.

As seen in FIG. 32, the fibers are loaded onto the moving arm 365 and routed around the stationary limiter 361. In some implementations, the moving arm 365 is moved to the closed position to load the fibers. For example, the blade 350 may be moved to the operation position before loading the fibers onto the moving arm 365. In other implementations, the moving arm 365 is moved to the open position to load the fibers.

Figure 33:
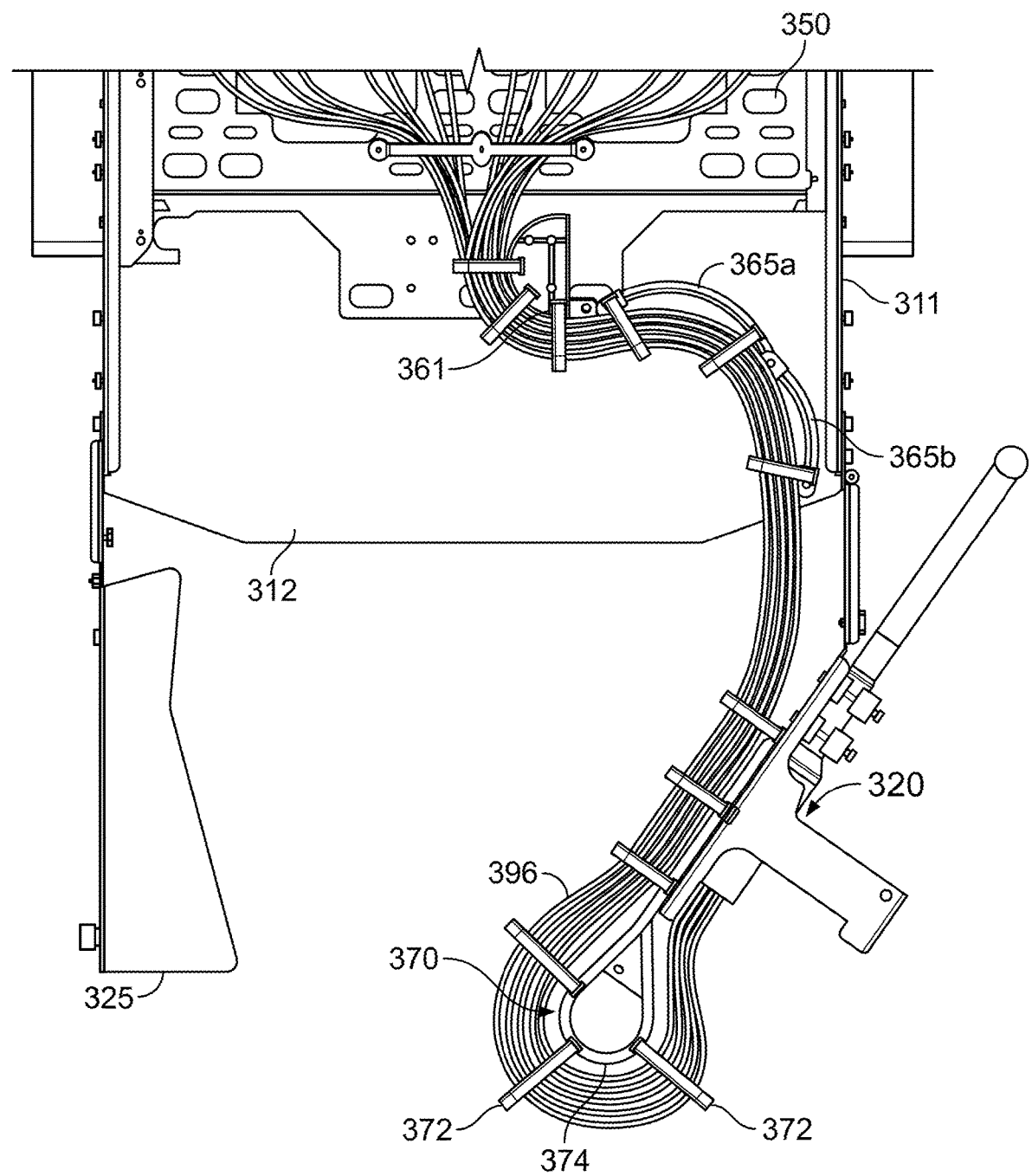
FIG. 33 illustrates the bladed chassis system of FIG. 32 with all of the fibers loaded onto the moving arm and through the routing paths of the guide arrangement carried by the cable bracket arrangement.

As seen in FIG. 33, the fibers are routed along the guide arrangement 370 carried by the cable bracket arrangement 320. For examples, the fibers can be disposed along cable channels defined by retaining arms or clips extending outwardly from the guide arrangement 370. When the fibers are fully loaded onto the guide arrangement 370 and moving arm arrangement 360, the cable bracket arrangement 320 and the bracket cover arrangement 325 can be closed.

During use, the blades 350 are moved between the discrete positions. The moving arm arrangement 360 manages the optical fibers to maintain a minimum bend radius along a length of the fibers as the blade moves within the chassis 310.

Figure 34:
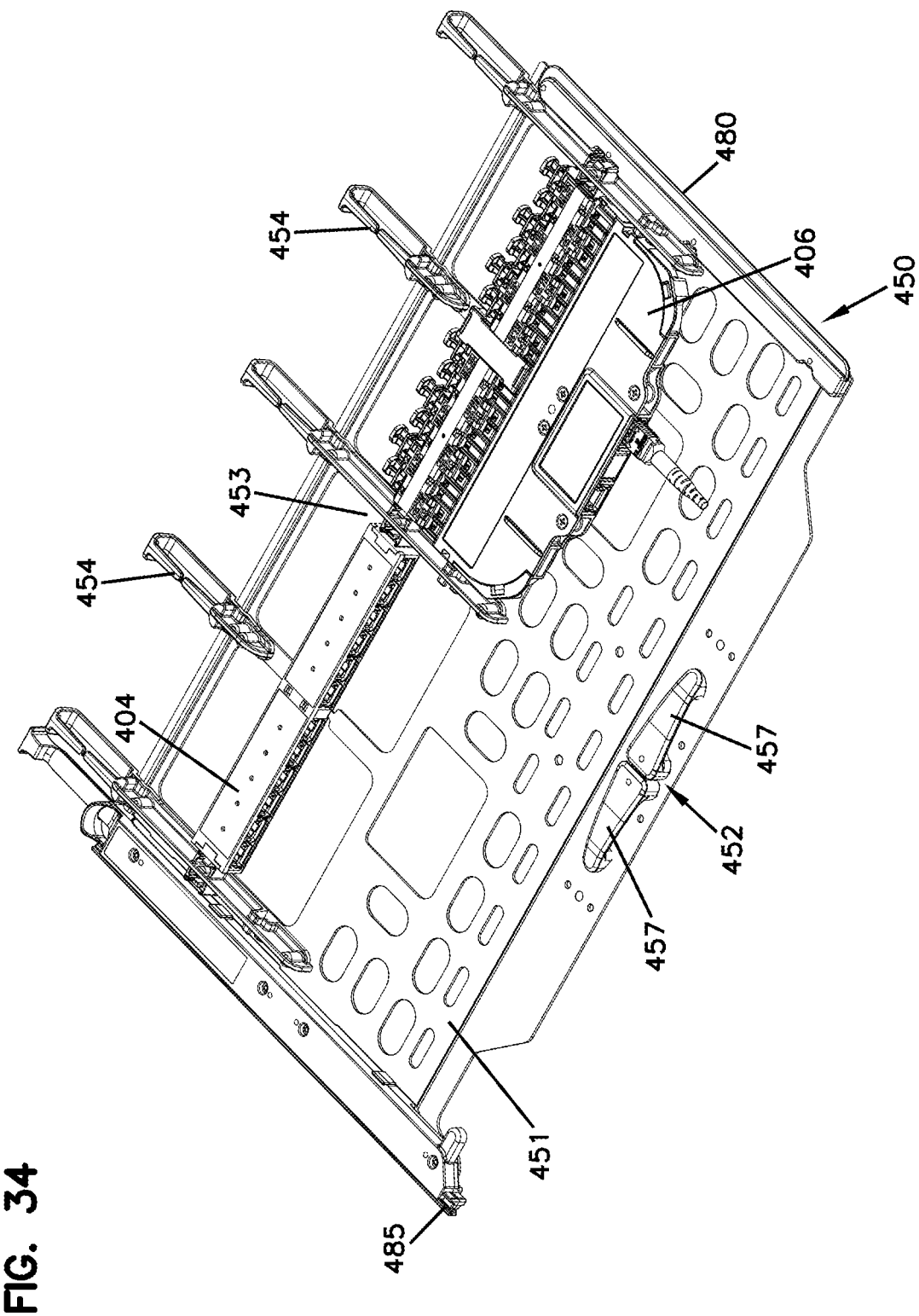
FIG. 34 illustrates another example blade configured in accordance with the principles of the present disclosure.

FIGS. 34-44 illustrate another example bladed chassis system that is substantially the same as the bladed chassis system 300 described above except where otherwise indicated. FIG. 34 illustrates another example blade 450 suitable for use in the bladed chassis systems disclosed herein. The blade 450 is configured to mount within the interior 115, 315 of a bladed chassis system 100, 300, 400. Each blade 450 includes a base 451 extending from a front to a rear. The base 451 includes a fiber management section 452 towards the rear and a termination section 453 towards the front. The fiber management section 452 is configured to hold fiber management structures (retention fingers 457) to retain and manage the optical fibers routed onto the blade 450. Fiber retainer members 454 extend forwardly of the termination section 453.

One or more optical adapters are disposed at the termination section 453. U.S. application Ser. No. 14/747,854, incorporated herein by reference above, illustrates one way the optical adapter modules can be coupled to the blade 450. Connectorized ends of the optical fibers managed at the fiber management section 452 can be plugged into rear ports of the optical adapters. Example adapter modules suitable for mounting at the termination section 353 can be found in U.S.

Publication No. 2014-0219615, U.S. Publication No. 2014-0219614, U.S. application Ser. No. 14/611,924, and U.S. Provisional Application No. 62/253,338, the disclosures of which are incorporated by reference above.

In some implementations, the front and rear ports of the adapter modules 404 are configured to receive multi-fiber connectors (e.g., MPO connectors). In certain implementations, the adapter modules 404 each define six rear ports that align with six front ports. In certain implementations, each tray can hold about four modules. In certain implementations, each port of the adapter module 404 is configured to receive a multi-fiber connector terminating about 12 fibers. In such implementations, the blade 450 carries about 288 fiber connections. In certain implementations, each port of the adapter module 404 is configured to receive a multi-fiber connector terminating about 24 fibers. In such implementations, the blade 450 carries about 576 fiber connections.

In other implementations, the adapter modules 406 are configured to receive multi-fiber connectors at the rear ports and single-fiber connectors at the front ports that are optically coupled to the rear ports. In an example, an adapter module 406 has two rear ports and twenty-four single fiber ports. In such implementations, the blade 450 carries about forty-eight fiber connections.

The chassis 410 can be sized in various rack unit sizes. For each rack unit, the chassis 410 can hold at least three blades 450. Accordingly, if four of the adapter modules 404 are installed on the blades 450, then about 864 fiber connections are made per rack unit. In certain implementations, the chassis 410 can hold four blades 450. Accordingly, if four of the adapter modules 404 are installed on the blades 450, then about 1152 fiber connections are made per rack unit.

In certain implementations, the chassis 410 can hold at least two hundred fiber connections per rack unit. In certain implementations, the chassis 410 can hold at least 576 fiber connections per rack unit. In certain implementations, the chassis 410 can hold at least 432 fiber connections per rack unit. In certain implementations, the chassis 624 can hold at least two hundred fiber connections per rack unit.

The chassis 410 and the blades 450 of the bladed chassis system 400 are configured to facilitate movement between the blades 450 and the chassis housing 410. Each blade 450 can be inserted into the interior of the chassis 410 through either an open front or an open rear of the chassis 410. For example, each blade 450 may include a first rail 480 and a second rail 485 configured to slide along guide channels defined at sidewalls of the chassis 410. The first and second rails 480, 485 are substantially the same as the rails 380, 385 described above, except shortened between front and rear ends.

In certain implementations, the blade 450 can be releasably locked into one or more of the positions. As the term is used herein, a blade 450 is "locked" in position if the user must take affirmative steps beyond applying forward/rearward pressure to the blade 450 to move the blade 450 relative to the chassis 410. In some implementations, the second rail 485 is coupled to an intermediate guide member, which cooperates with a latching arrangement. In certain implementations, the intermediate guide member and the latching arrangement are substantially similar to the intermediate guide member 190 and the latching arrangement 200 described above.

In accordance with some aspects of the disclosure, the blade 450 is movable relative to the second rail 485 between two or more discrete positions. As the term is used herein, a "discrete" position indicates a position at which the user receives some type of feedback (e.g., tactile feedback, audible feedback, etc.) that the blade 450 has reached a predetermined position relative to the chassis 410. In certain examples, the blade 450 can be moved relative to the second rail 485 between an operation position and a connector access position. In an example, the blade 450 can be moved relative to the second rail 485 between the operation position, the connector access position, and an adapter access position. In an example, the connector access position is located forwardly of the operation position, and the adapter access position is located forwardly of the connector access position.

In certain implementations, the latching arrangement 200 is configured to lock the blade 450 relative to the intermediate guide member 190 in the operation position. In certain implementations, the latching arrangement 200 is configured to lock the blade 450 relative to the intermediate guide member 190 in the connector access position. In certain implementations, the latching arrangement 200 is configured to lock the blade 450 relative to the intermediate guide member 190 in the adapter access position. In certain implementations, the latching arrangement 200 is configured to lock the blade 450 relative to the intermediate guide member 190 in any discrete position.

FIGS. 35-44 illustrate cable management at the rear of the chassis 410. The chassis 410 differs from the chassis 110, 310 in that the chassis 410 does not include two doors. Rather, the chassis 410 has an open rear 417 from which a cable manager 420 extends rearwardly. The cable manager 420 defines cable ports P through which cables enter a management region 421. The cables routed to the rear ports of the adapter modules 404, 406 have slack length routed through the management region 421. When the blade 450 is moved relative to the chassis 410, the slack length moves within the management region 421 to accommodate the movement of the blades 450.

In some implementations, an example cable is routed through a cable port P, through the management region 421, and onto one of the blades 450. In certain implementations, each blade 450 includes a cable retention tab 457 at a central rear of blade 450. The cable retention tab 457 facilitates routing the cable onto the rear of blade 450 from a central location. The cable is routed from the cable retention tab 457 to a rear port of one of the adapter modules 404, 406 or other adapter installed on the blade 450. The cable retention tab 457 facilitates controlling movement of the cable slack length during movement of the blade 450. In the example shown, each blade 450 has two cable retention tabs 457 facing outwardly from each other in opposite directions.

In some implementations, the cables can be routed into the management region 421 from a first side of the chassis 410 and/or from an opposite second side of the chassis 410. An example cable routed from the first side of the chassis 410 extend through a port P, into the management region 421, and across the management region 421 towards the second side of the chassis 410. The example cable curves back towards the open rear 417 of the chassis 410 and extends to one of the blades 450. Accordingly, a half-loop is formed at the second side of the chassis 410. The example cable is routed to the cable retention tab 457 facing towards the first side of the chassis 410 on the blade 450. From the cable retention tab 457, the example cable is routed to the adapter module at the first side of the chassis 410.

A second example cable routed from the second side of the chassis 410 extend through a port P, into the management region 421, and across the management region 421 towards the first side of the chassis 410. The second example cable curves back towards the open rear 417 of the chassis 410 and extends to one of the blades 450. Accordingly, a half-loop is formed at the first side of the chassis 410. The second example cable is routed to the cable retention tab 457 facing towards the second side of the chassis 410 on the blade 450. From the cable retention tab 457, the second example cable is routed to the adapter module at the second side of the chassis 410.

When the blade 450 is moved forwardly relative to the chassis 410, slack length of the first and second cables is pulled from the cable management region 421 into the chassis 410 through the open rear 417 of the chassis 410. As the slack length moves into the chassis, the half-loop of each cable moves closer to the middle of the cable management region 421. When the blade is moved rearwardly relative to the chassis 410, the slack length of the first and second cables is pushed through the open rear 417 of the chassis 410 into the cable management region 421. The half-loop of each cable moves back towards the opposite side of the chassis 410 from which the cable entered.

In some implementations, each chassis 410 holds multiple blades 450. In such implementations, the cables for the blades 450 are layered on top of each other in the management region 421. For example, the cables routed to the top-most blade 450 are layered above the cables routed to the bottom-most blade 450. Cables routed to any middle blades 450 are layered between the cables for the top-most blade 450 and the cables for the bottom-most blade 450. Each blade 450 can move independent of the other blades 450 in the chassis 410. The cables for each blade 450 move relative to the cables of the other blades 450.

Figure 35:
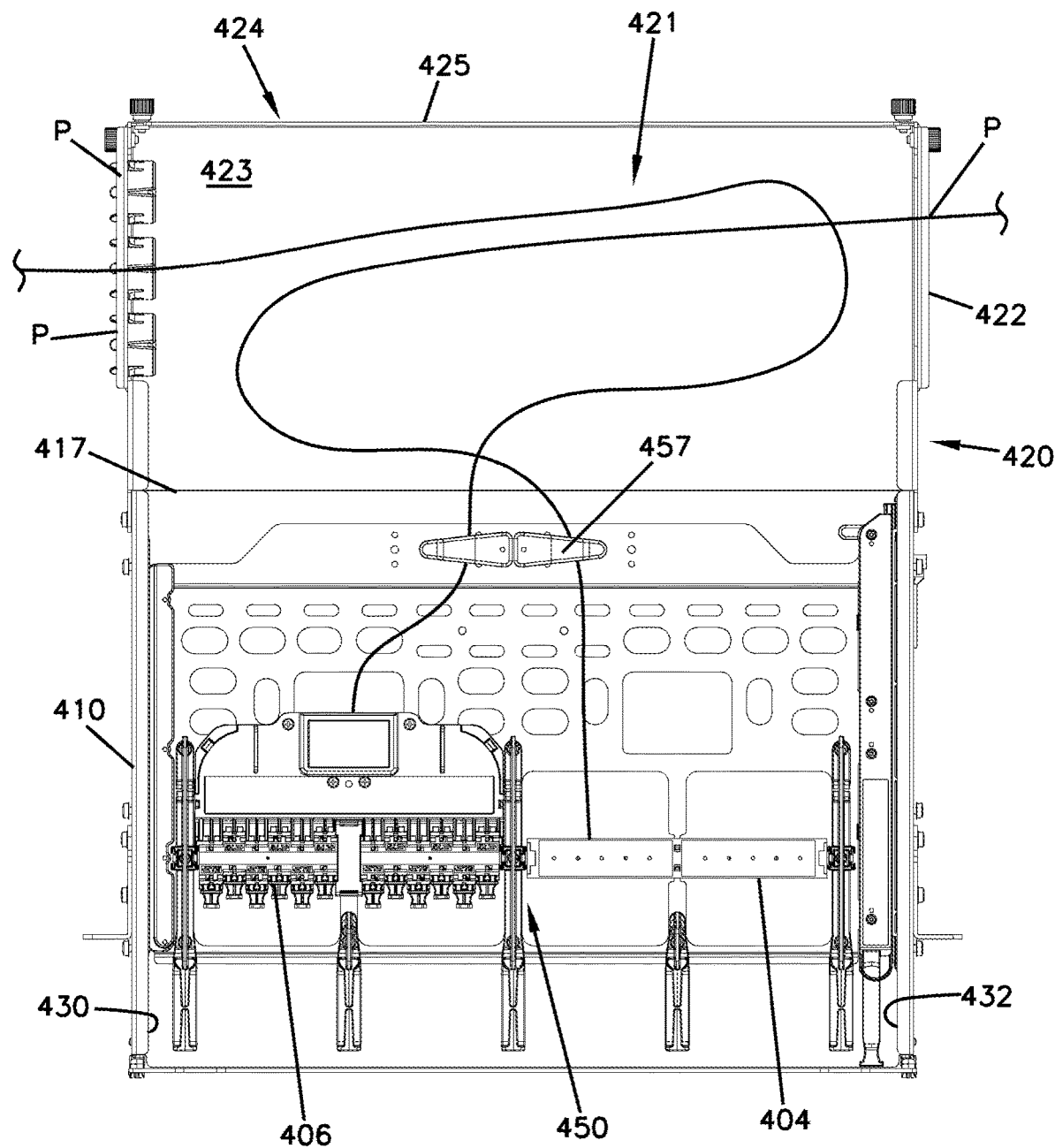
FIG. 35 is a top plan view of an example bladed chassis system including the blade of FIG. 34 mounted in a chassis to which a cable manager is attached, top panels of the chassis and cable manager are removed for ease in viewing the interiors of the chassis and cable manager.
Figure 36:
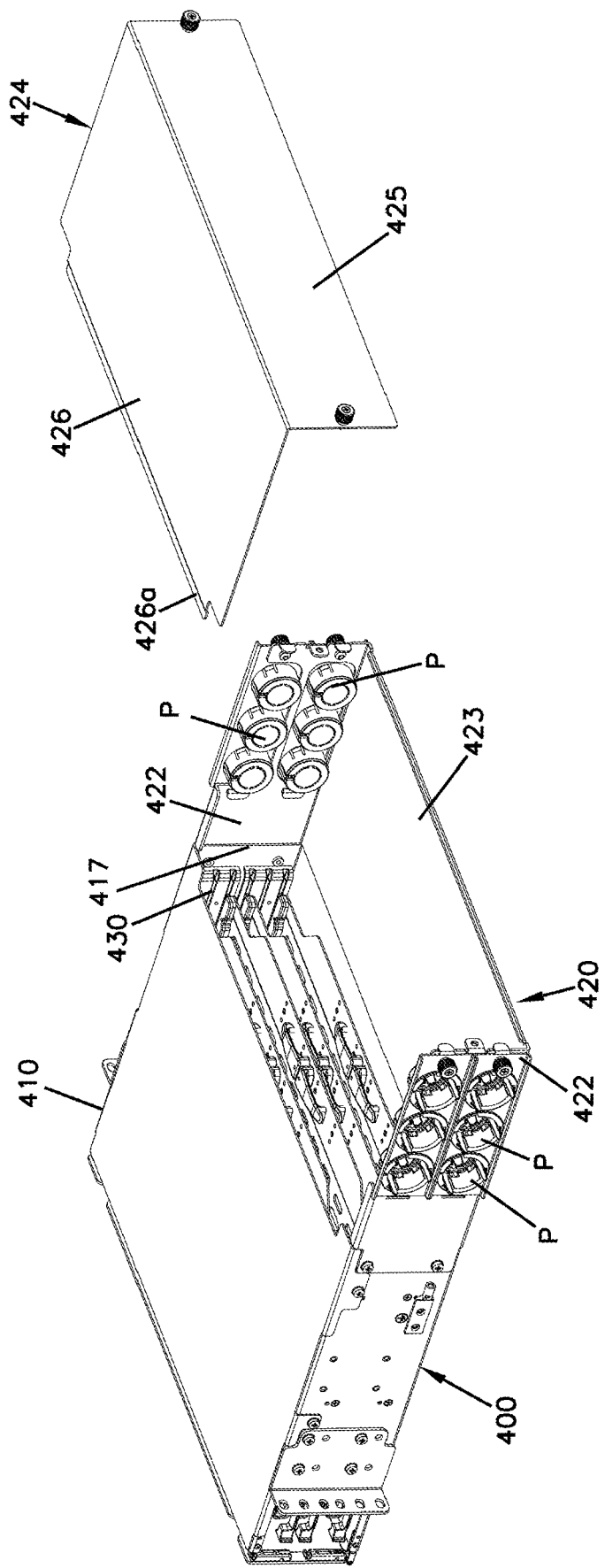
FIG. 36 is a rear perspective view of the chassis and cable manager of FIG. 35 with a rear cover exploded away from the cable manager.
Figure 37:
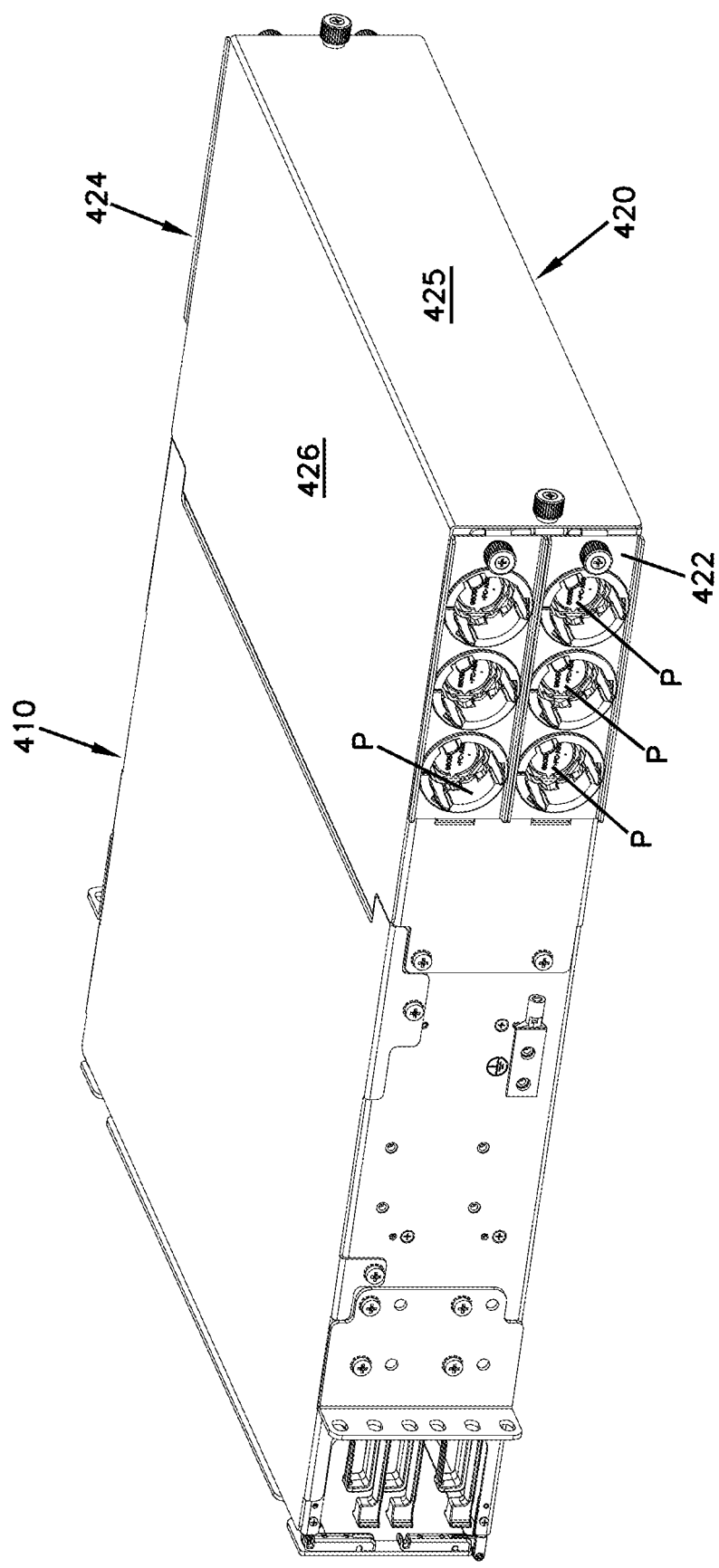
FIG. 37 is a rear perspective view of the chassis and cable manager of FIG. 36 with the rear cover mounted on the cable manager.

As shown in FIGS. 35-37, the cable manager 420 includes one or more walls 422 that extend rearwardly from the open rear 417 generally parallel with the sidewalls of the chassis 410. In certain implementations, the cable manager 420 includes two sidewalls 422 that each align with one of the sidewalls of the chassis 410. Each sidewalls 422 defines one or more apertures. In some implementations, the apertures function as cable ports. In other implementations, the apertures receive cable glands that function as cable ports. In still other implementations, the apertures receive port modules that each define one or more ports through which cables extend into the management region 421 as will be described herein.

In certain implementations, the cable manager 420 also includes a bottom panel 423 that extends between the two sidewalls 422. In certain examples, the bottom panel 423 is monolithically formed with the sidewalls 422. The bottom panel 423 cooperates with the sidewalls 422 to define the management region 421. In certain examples, the cable manager 420 has an open top and an open rear to facilitate routing cables through the management region 421.

In certain implementations, a rear cover 424 fits over the cable manager 420 to cover the management region 421. In some implementations, the rear cover 424 includes a rear wall 425 and/or a top wall 426. The rear wall 425 extends between the sidewalls 422. The top wall 426 extends between the sidewalls 422 and between the open rear 417 of the chassis 410 and the open rear of the cable manager 420. In certain examples, the rear wall 425 and the top wall 426 are monolithically formed.

In an example, the top wall 426 of the rear cover 424 includes a ledge 426a designed to tuck under a cover of the chassis 410 to create continuous coverage across the top of the chassis 410 and cable manager 420. In certain examples, the rear cover 424 is configured to removably secure to the cable manager 420. In the example shown, the sidewalls 422 include fastener mounts and the rear cover 424 carries fasteners that align with the fastener mounts when the rear cover 424 is mounted to the cable manager 420. In other implementations, however, the fasteners can be disposed at the cable manager 420 and the rear cover 424 can define fastener apertures. In still other implementations, the rear cover 424 can latch, friction-fit, or otherwise secure to the cable manager 420.

Figure 38:
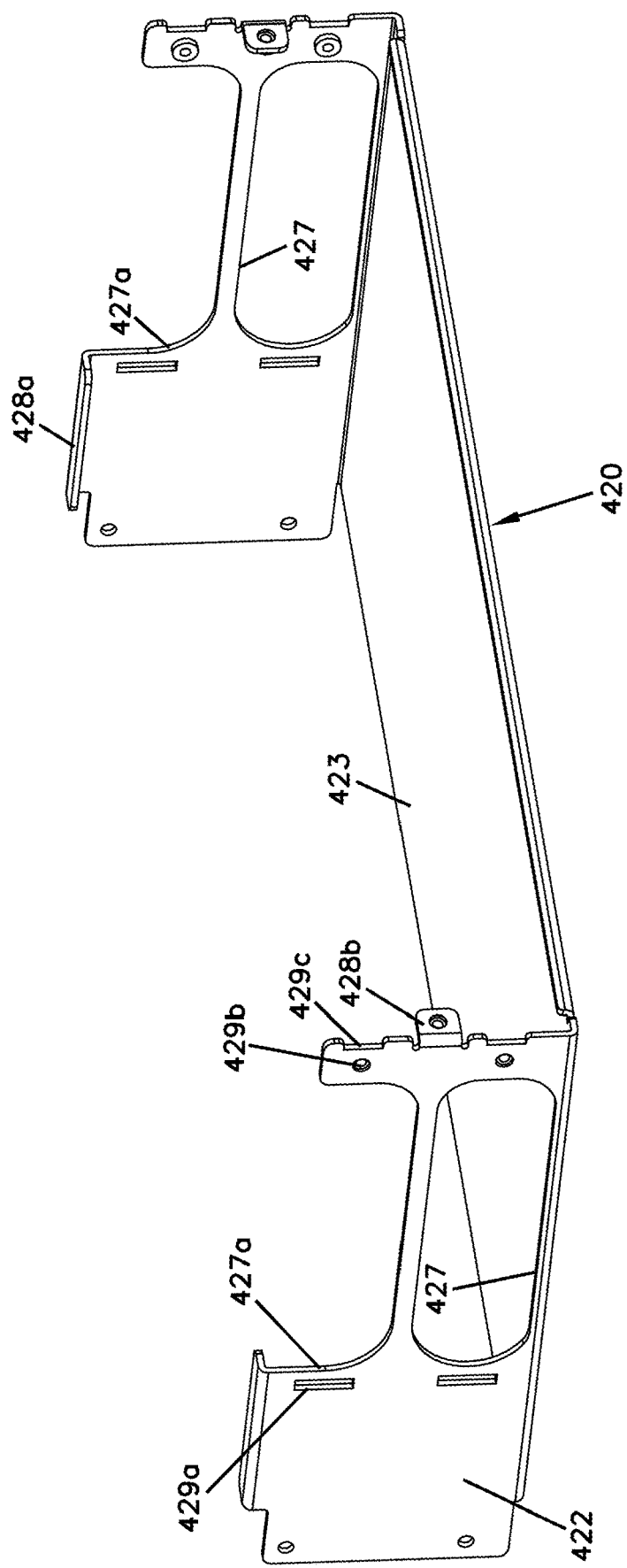
FIG. 38 is a rear perspective view of the cable manager of FIG. 36 without the rear cover or port modules.

One example cable manager 420 is shown in FIG. 38. The example cable manager 420 includes a bottom panel 423 extending between two sidewalls 422. Each sidewall 422 defines an aperture 427. In some examples, each sidewall 422 also defines an open notch 427a. In other examples, each sidewall 422 defines two apertures 427. In still other examples, each sidewall 422 defines two open notches 427a facing in opposite directions. In some implementations, the apertures 427 and/or notches 427a define the cable ports P. In other implementations, port modules, which will be described in more detail herein, can be mounted to the sidewalls 422 over the apertures 427 and/or notches 427a.

In certain implementations, the sidewalls 422 of the cable manager 420 are configured to mount to the chassis 410. In the example shown, the sidewalls 422 define fastener apertures that align with fastener apertures defined in the sidewalls of the chassis 410. Fasteners can be inserted through the fastener apertures in the cable manager 420 and the fastener apertures in the chassis 410 to secure the cable manager 420 to the chassis 410.

In certain implementations, the sidewalls 422 are configured to receive and support the rear cover 424. For example, the sidewalls 422 can include support flanges 428 that extend inwardly from the sidewalls 422 at a top of the cable manager 420. The top wall 426 of the rear cover 424 can seat on the support flanges 428. In the example shown, fastener mounts 429 extend inwardly from the rear of the sidewalls 422.

Figure 39:
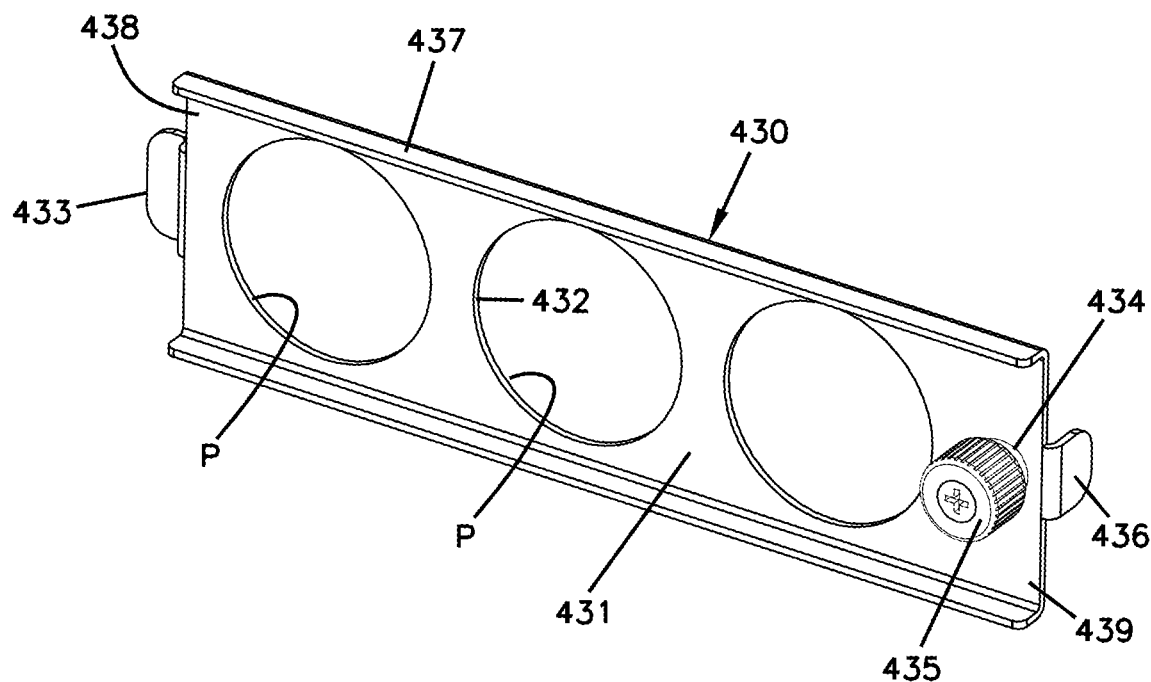
FIGS. 39-42 are perspective views of example port modules suitable for use with the cable manager of FIG. 38.
Figure 40:
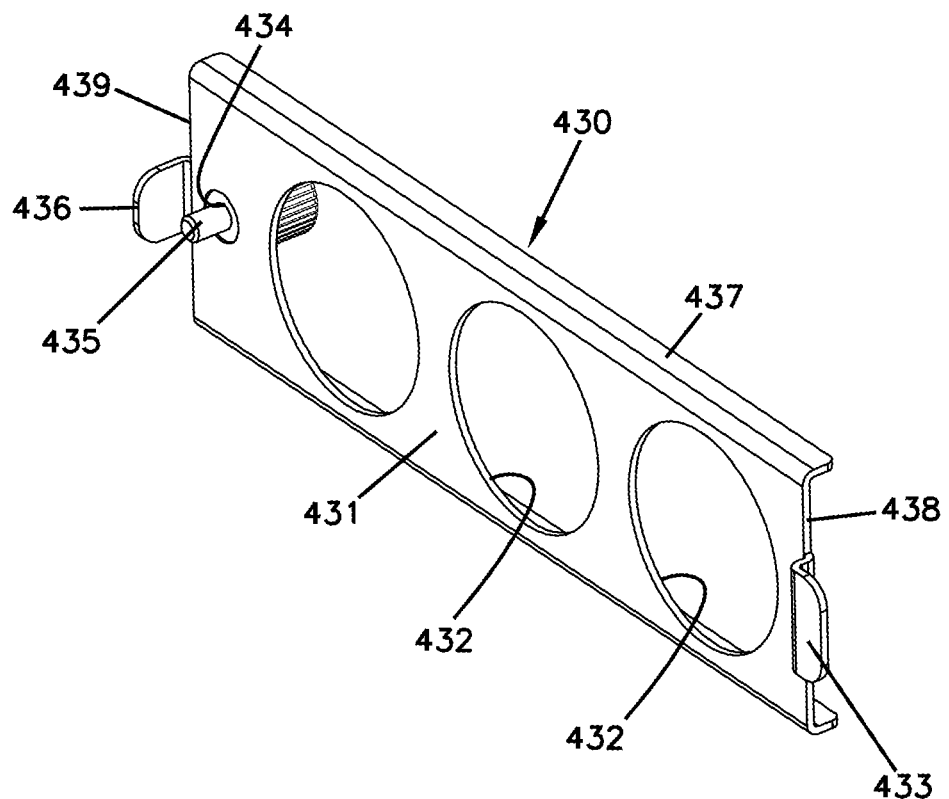

FIGS. 39 and 40 illustrate one example port module 430 configured to mount to one of the sidewalls 422 across one of the apertures 427 or notches 427a. Each port module 430 defines one or more cable ports P. The port module 430 includes a panel 431 defining one or more apertures 432. Each aperture 432 either defines a cable port P or is configured to receive a gland, adapter, or other structure that defines the cable port P. In the example shown, the port module 430 defines three apertures 432. In other examples, the port modules 430 can have any desired number of apertures (e.g., one, two, four, six, etc.).

In certain implementations, the port module 430 is elongated between a first end 438 and a second end 439. In certain examples, the apertures 432 are disposed in a row extending between the first and second ends 438, 439. In certain examples, the apertures 432 may be arranged in two rows. In certain examples, the apertures 432 may be arranged in staggered rows. In other examples, the apertures 432 may be arranged in any desired configuration.

The port module 430 is configured to removably secure to a sidewall 422 of the cable manager 420. In certain implementations, fastening structure is disposed at the first and second ends 438, 439 of the port module 430. In some implementations, a first tab 433 extends outwardly from the first end 438 of the panel 431 and a fastener aperture 434 is defined at the second end 439 of the panel 431. A fastener 435 may be carried in the fastener aperture 434. In certain examples, a second tab 436 can be disposed at the second end 439 of the port module panel 431.

As shown in FIG. 38, the sidewall 422 of the cable manager 420 is configured to fit with the fastening structure of the port module 430. Each sidewall 422 defines a slot 429*a* forward of the aperture 427 or notch 427*a* and a fastener aperture 429*b* rearward of the aperture 427 or notch 427*a*. In certain examples, each sidewall 422 also defines a rearward-facing notch 429*c*.

As shown in FIG. 36, the first tab 433 of the port module 430 can be inserted into the slot 429*a*. The fastener 435 is inserted through the fastener apertures 434, 429*b* to removably secure the port module 430 to the sidewall 422. In certain examples, the second tab 436 fits into the rearward-facing notch 429*c*.

In some implementations, each sidewall 422 of the cable manager 420 is configured to receive only a single port module 430. In other implementations, each sidewall 422 is configured to receive multiple port modules 430. In certain implementations, the port module 430 includes rails 437 at the top and bottom of the panel 431. The rails 437 facilitate stacking of the port modules 430 at the cable manager 420. As shown in FIG. 36, the bottom rail 437 of an upper port module 430 can be seated on the upper rail 437 of a lower port module 430.

Figure 41:
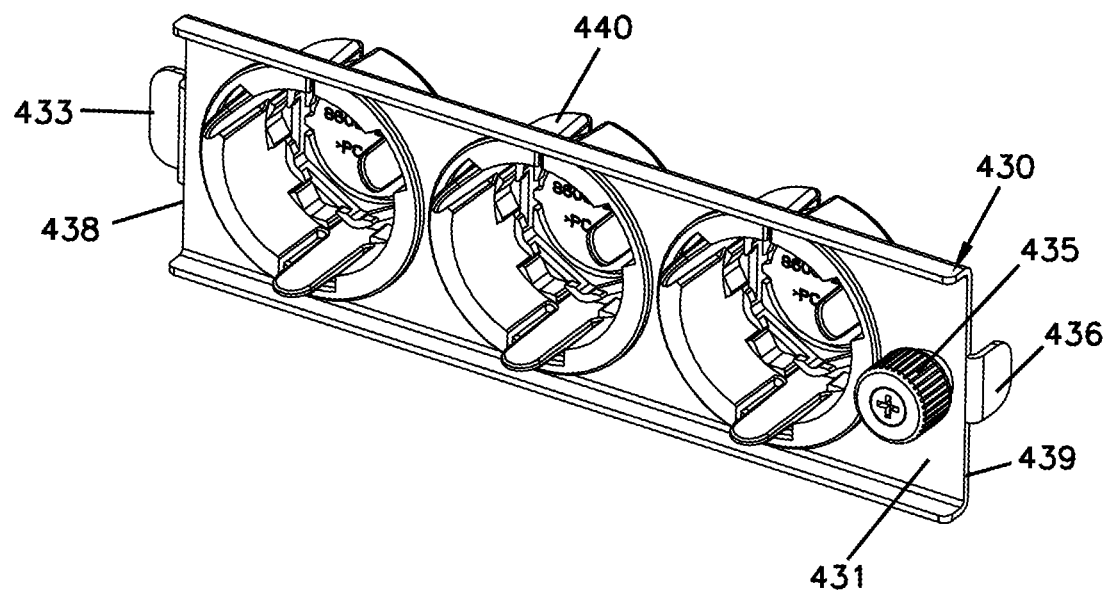
Figure 42:
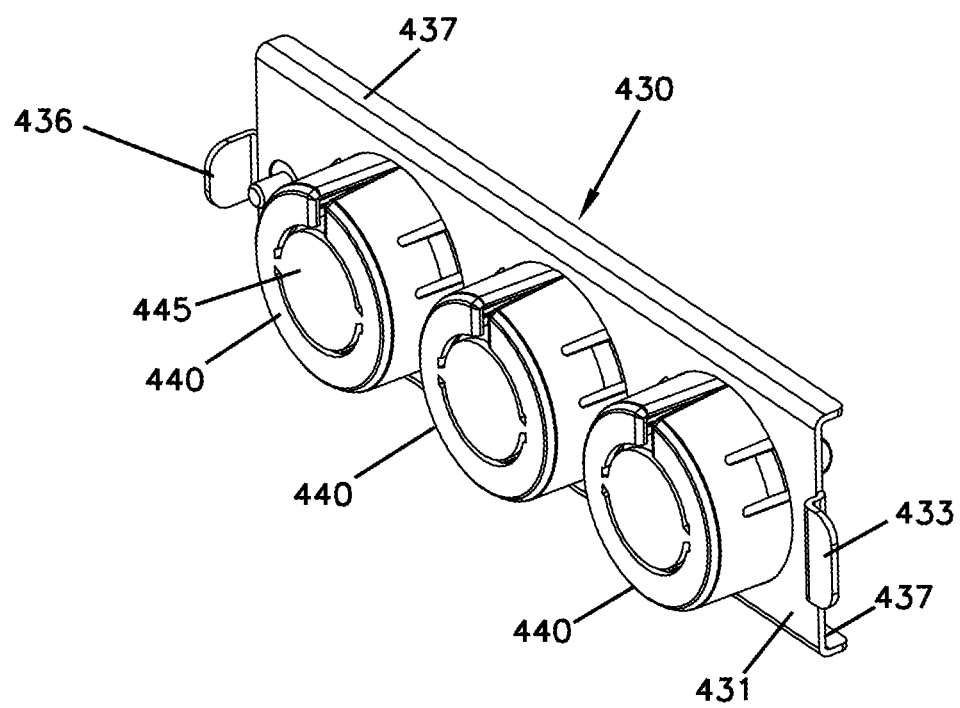

As shown in FIGS. 41 and 42, each port module 430 can carry a cable gland 440, adapter, or other port P defining structure at the apertures 432. In some implementations, the gland 440, adapter, or other port defining structure is configured to secure the cable entering the port P to the cable manager 420. In certain examples, a jacket and/or strength member of the cable can be secured to the gland 440, adapter, or other port defining structure by compression, adhesive, piercing etc.

In some implementations, the gland 440, adapter, or other port defining structure facilitates environmentally sealing the cable management region 421. For example, the gland 440, adapter, or other port defining structure can form a seal between the port module 430 and the gland 440, adapter, or other port defining structure. The gland 440, adapter, or other port defining structure also can form a seal between the cable and the gland 440, adapter, or other port defining structure.

In certain implementations, the gland 440, adapter, or other port defining structure can be closed when the port P is not in use. In the example shown in FIG. 42, glands 440 include port covers 445 that extend across the ports P. In an example, each port cover 445 is attached to the respective gland 440 via a perforated surface that can be broken by the application of pressure to the port cover 445. In another example, the port covers 445 are otherwise removably secured to the glands 440. In other examples, sealing plugs can be inserted into the ports P of the glands 440, adapters, or other port defining structures.

Example glands suitable for use with the port modules 430 can be found in U.S. application Ser. No. 14/587,016, titled "Trunk Gland Adapters and Related Trunk Gland Units and Methods of Connecting Trunk Cables to Fiber Optic Enclosures," the disclosure of which is hereby incorporated herein by reference.

Figure 43:
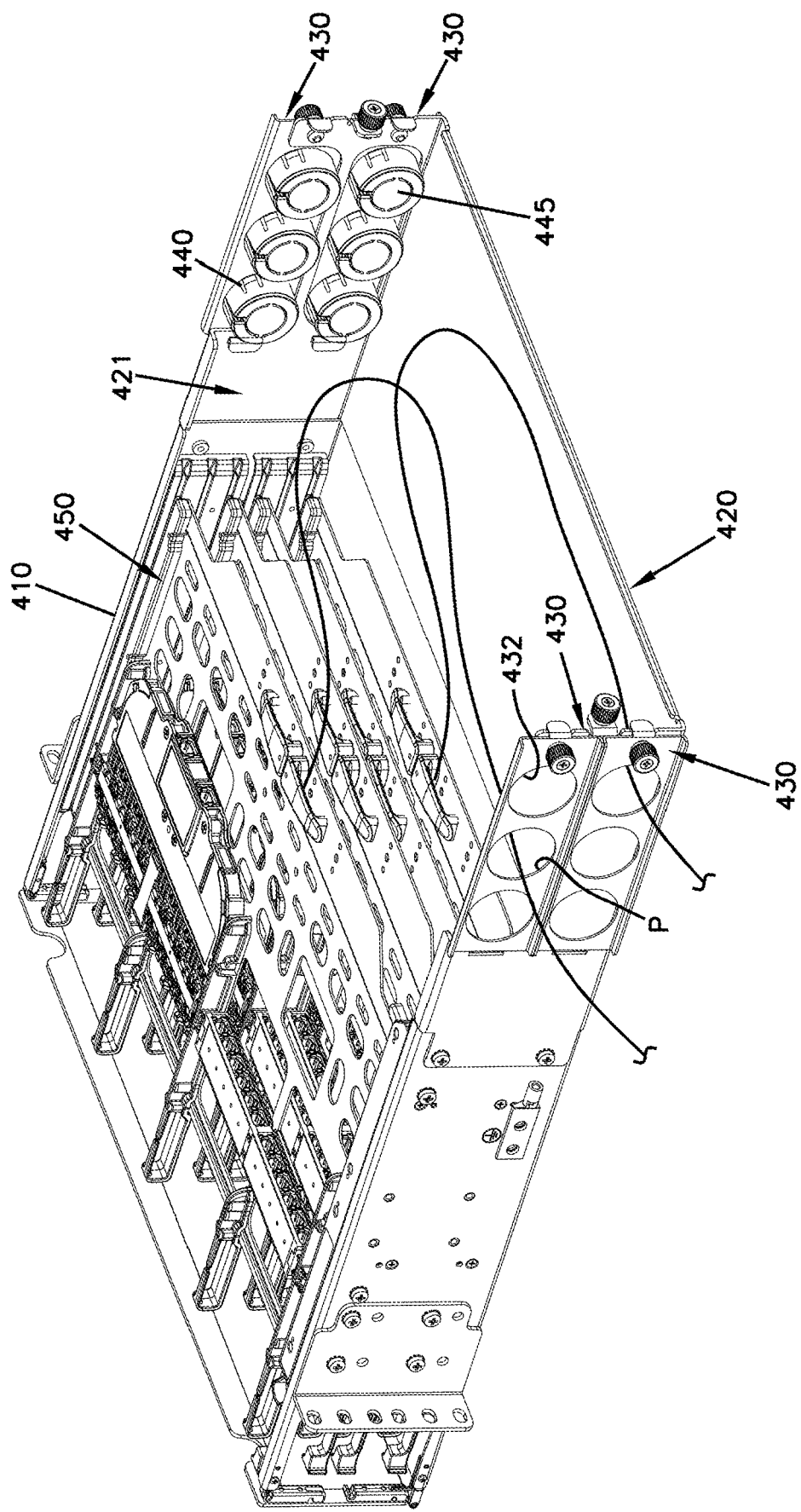
FIG. 43 is a rear perspective view of an example chassis and cable manager with the rear cover of the cable manager and the top panel of the chassis removed for ease in viewing.

FIG. 43 shows an example 1RU chassis 410 (i.e., a chassis sized to a single rack unit) that includes an example cable manager 420. The cable manager 420 includes two port modules 430 mounted to a first sidewall 422 and two port modules 430 mounted to a second sidewall 422. In other examples, however, a greater or lesser number of port modules 430 can be mounted to each sidewall 422.

In the example shown, the apertures 432 of the port modules 430 mounted to the first sidewall 422 define the ports P and the apertures 432 of the port modules 430 mounted to the second sidewall 422 hold glands 440 that define the ports. In other examples, however, any of the port modules 430 can hold glands 440 or can use the apertures 432 to define cable ports P.

Figure 44:
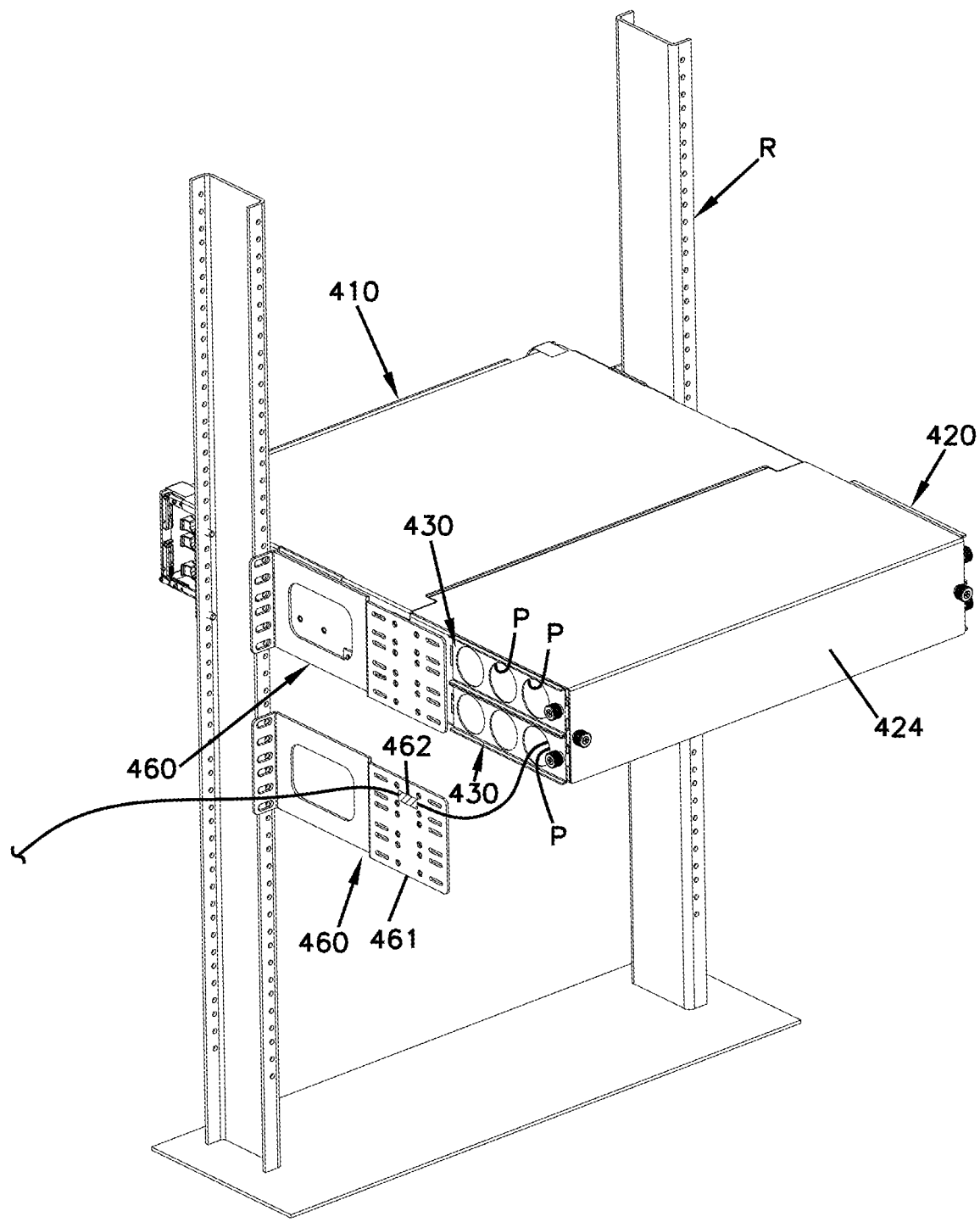
FIG. 44 is a perspective view of an example anchoring bracket and the example chassis and cable manager of FIG. 37 mounted to a rack.

FIG. 44 shows an example chassis 410 mounted to an example rack R. In some implementations, a bracket 460 can be mounted to either the chassis 410, the cable manager 420, or to the rack R to provide anchoring of the cables routed into the cable manager 420. For example, the bracket 460 can be used when the port module apertures 432 define the cable ports P. In other examples, the bracket 460 can be used when the apertures 427 and/or notches 427*a* of a cable manager sidewall 422 are being used as the cable ports P. In other examples, the bracket 460 can be used to supplement any axial retention of the cable at the gland 440, adapter, or other port defining structure at the port module 430.

The bracket 460 includes a main body 461 having a forward flange configured to mount to the rack R (e.g., using fasteners). The main body 461 is configured to receive cable anchor arrangements 462 (e.g., using fasteners). In some examples, an anchor arrangement 462 is configured to radially compress the jacket of a cable to hold a section of the cable at an axially fixed position relative to the bracket 460. In other examples, the anchor arrangement 462 can otherwise hold the section of the cable.

Figure 45:
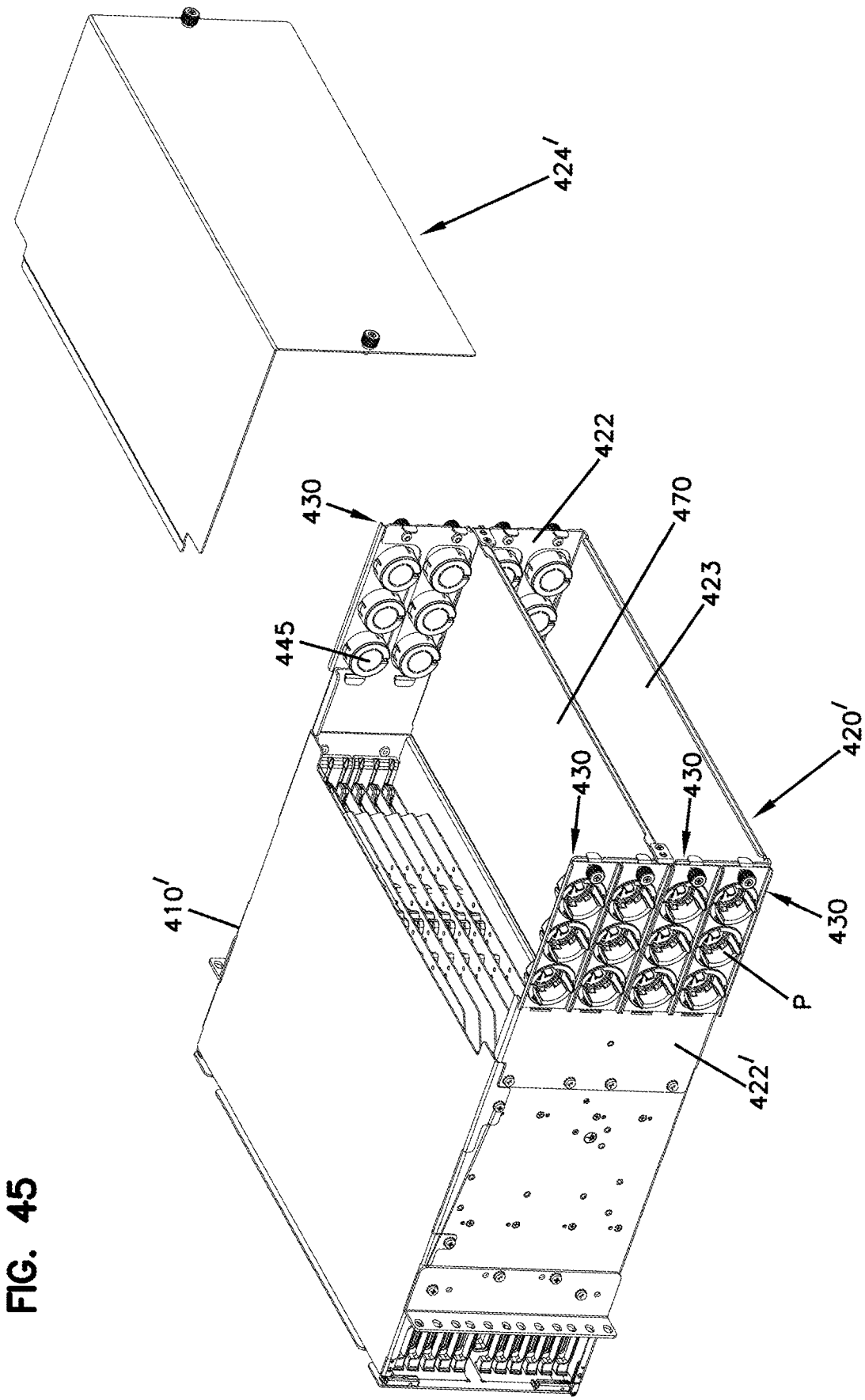
FIG. 45 illustrates an example cable manager suitable for use with a larger chassis, the cable manager including a mid-shelf.

FIG. 45 illustrates an example 4RU chassis 410' and an example cable manager 420' suitable for use with a larger chassis 410'. The cable manager 420' includes one or more walls 422' that extend rearwardly from the open rear 417 of the chassis 410' generally parallel with the sidewalls of the chassis 410'. In some implementations, the cable manager 420' includes two sidewalls 422' that each align with one of the sidewalls of the chassis 410'. In other implementations, multiple sidewalls 422' can be stacked to form each side of the cable manager 420'.

Each sidewalls 422' defines one or more apertures. In some implementations, the apertures function as cable ports. In other implementations, one or more port modules can be disposed over the apertures. Each port module defines one or more ports P through which cables extend into the management region of the cable manager 420'. In certain implementations, the port modules are identical to the port modules 430 discussed above.

In the example shown, each sidewall 422' is configured to receive four port modules 430. In other examples, however, each sidewall 422' can be configured to receive a greater or lesser number (e.g., one, two, three, five, six, eight, etc.) of port modules 430. In the example shown, each port module 430 defines three ports P. In other examples, each port module 430 defines a greater or lesser number (e.g., one, two, four, five, six, eight, etc.) of ports P.

In certain implementations, the cable manager 420' includes a bottom panel 423 that extends between the two sidewalls 422'. In certain examples, the bottom panel 423 is monolithically formed with the sidewalls 422'. The bottom panel 423 cooperates with the sidewalls 422' to define the management region.

In certain implementations, a mid-shelf 470 can be added to separate the management region into an upper management region and a lower management region. For example, a mid-shelf 470 can be desirable for larger-sized chassis 410' to inhibit too much weight (e.g., from the cables extending through the upper ports P) from crushing the cables extending through the lower ports P. In certain implementations, the mid-shelf 470 is removable from the cable manager 420'.

Figure 46:
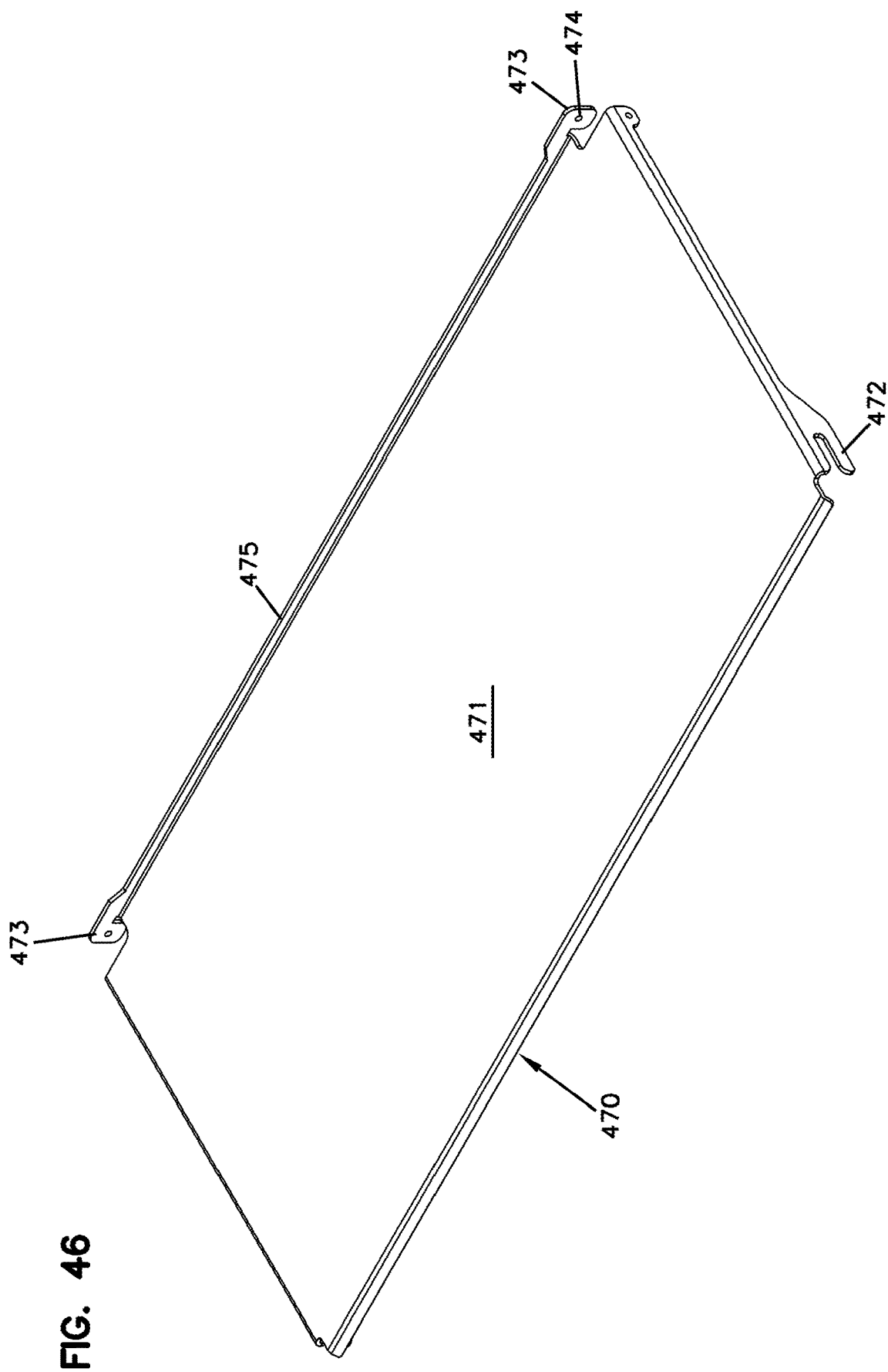
FIG. 46 illustrates an example mid-shelf suitable for use with the cable manager of FIG. 45.

In some implementations, a cable manager 420' can be partially cabled so that cables enter the management region through the bottom ports P. The mid-shelf 470 is added when a cable is to be extended through one of the top ports P. The mid-shelf 470 can be removed if one of the bottom blades 450 or respective cabling FIG. 46 illustrates an example mid-shelf 470 suitable for use with a cable manager 420'. The mid-shelf 470 includes a panel 471 to divide the management region. Hooked or slotted tabs 472 are disposed toward the front of the panel 471. In the example shown, a hooked or slotted tab 472 is disposed at each side of the front of the panel 471. Fastener tabs 473 are disposed towards the rear of the panel 471. The fastener tabs 473 define fastener apertures 474.

Figure 47:
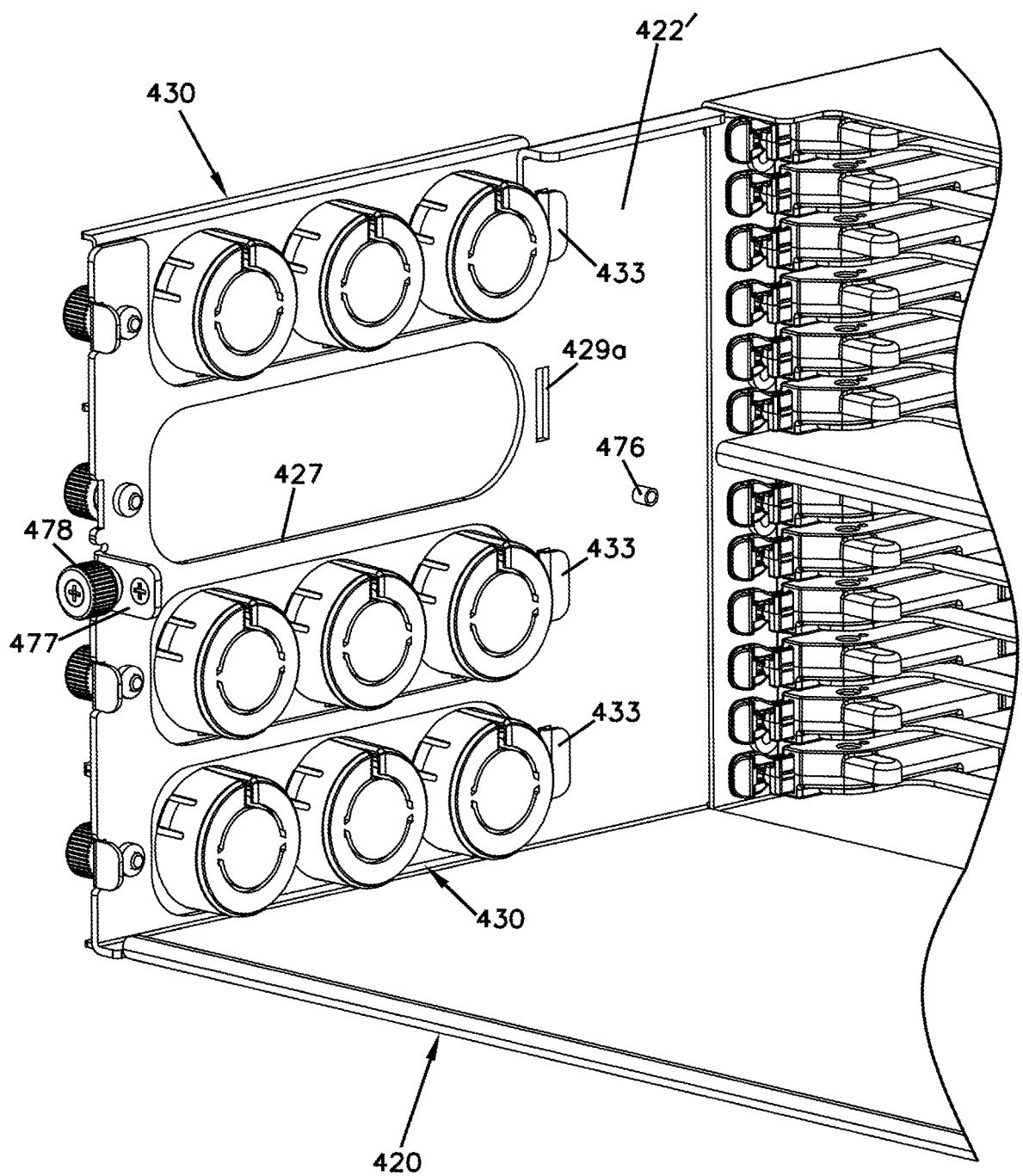
FIG. 47 illustrates an interior surface of an example sidewall of the cable manager of FIG. 45.

FIG. 47 illustrates an interior surface of an example sidewall 422'. The sidewall 422' defines four apertures 427 and four slots 429a. A peg 476 extends inwardly from the sidewall 422'. In certain implementations, multiple pegs 476 extend inwardly from the sidewalls 422'. In an example, each sidewall 422' includes a peg 476 that coaxially aligns with the peg 476 of the other sidewall 422'. In certain examples, the peg(s) 476 is disposed at an intermediate location between the bottom panel 423 and open top of the cable manager 420'. In the example shown, the peg(s) 476 is disposed centrally between the bottom panel 423 and open top of the cable manager 420'. In certain implementations, support tabs 477 extend inwardly from the rear of the sidewalls 422'. Each support tab 477 defines a fastener aperture.

The hooked or slotted tabs 472 of the mid-shelf 470 engage the pegs 476 of the sidewall 422' when the mid-shelf 470 is mounted to the cable manager 420' (adjacent the open rear of the chassis 410'). Each fastener tab 473 of the mid-shelf 470 aligns with a corresponding support tabs 477 of the chassis 410'. A fastener 478 (e.g., a thumb screw) can be inserted through a support tab 477 and a fastener tab 473 to releasably hold the mid-shelf 470 at the cable manager 420'.

In certain examples, the cable manager 420' has an open top and an open rear to facilitate routing cables through the management region. In certain implementations, a rear cover 424' fits over the cable manager 420' to cover the management region. In some implementations, the rear cover 424' includes a rear wall and/or a top wall. The rear wall extends between the sidewalls 422'. The top wall extends between the sidewalls 422' and between the open rear 417 of the chassis 410' and the open rear of the cable manager 420'. In certain examples, the rear wall and the top wall are monolithically formed.

Figure 48:
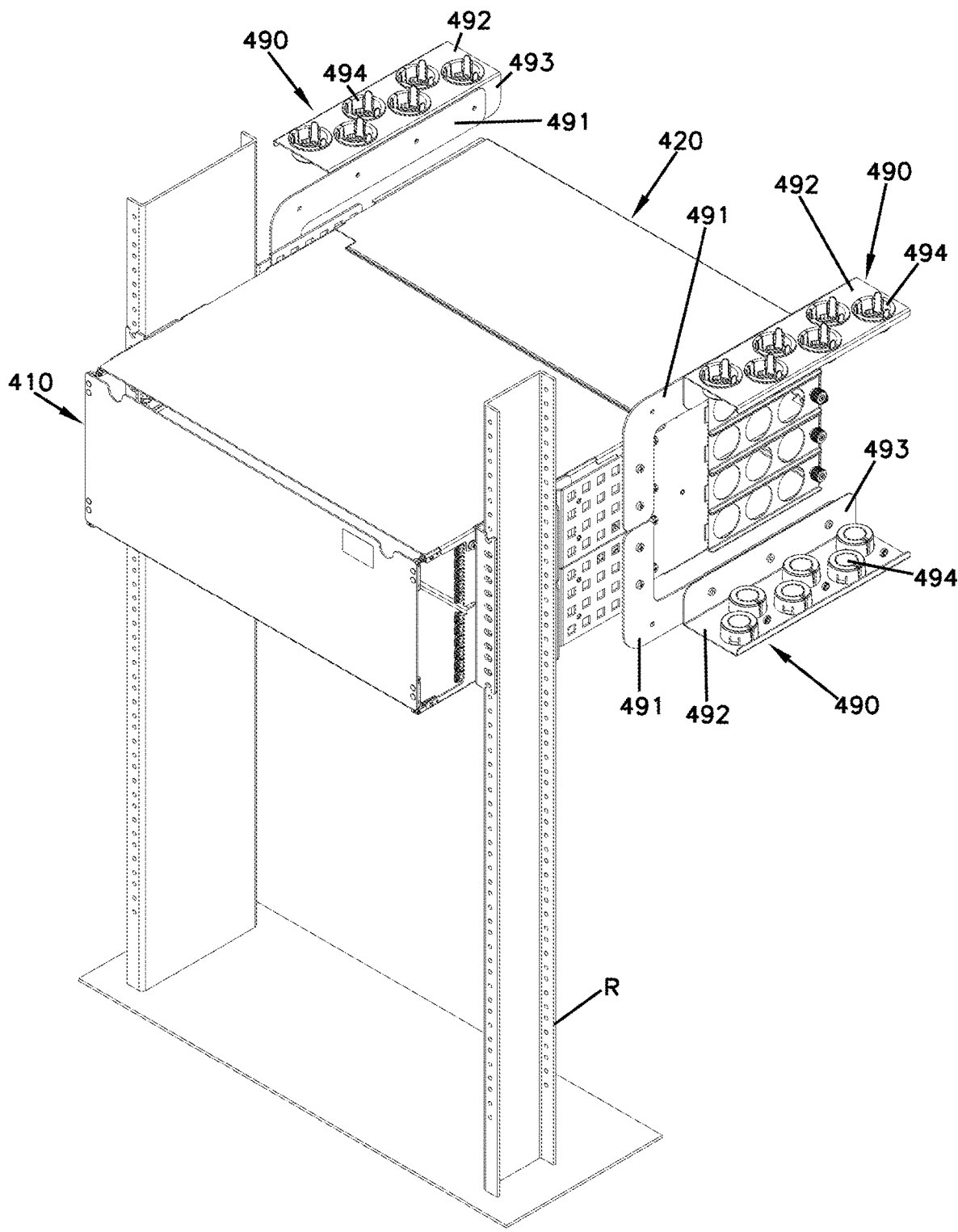
FIG. 48 is a perspective view of an example chassis and cable manager mounted to a rack with example cable anchor platforms mounted to, but spaced from the cable manager.
Figure 49:
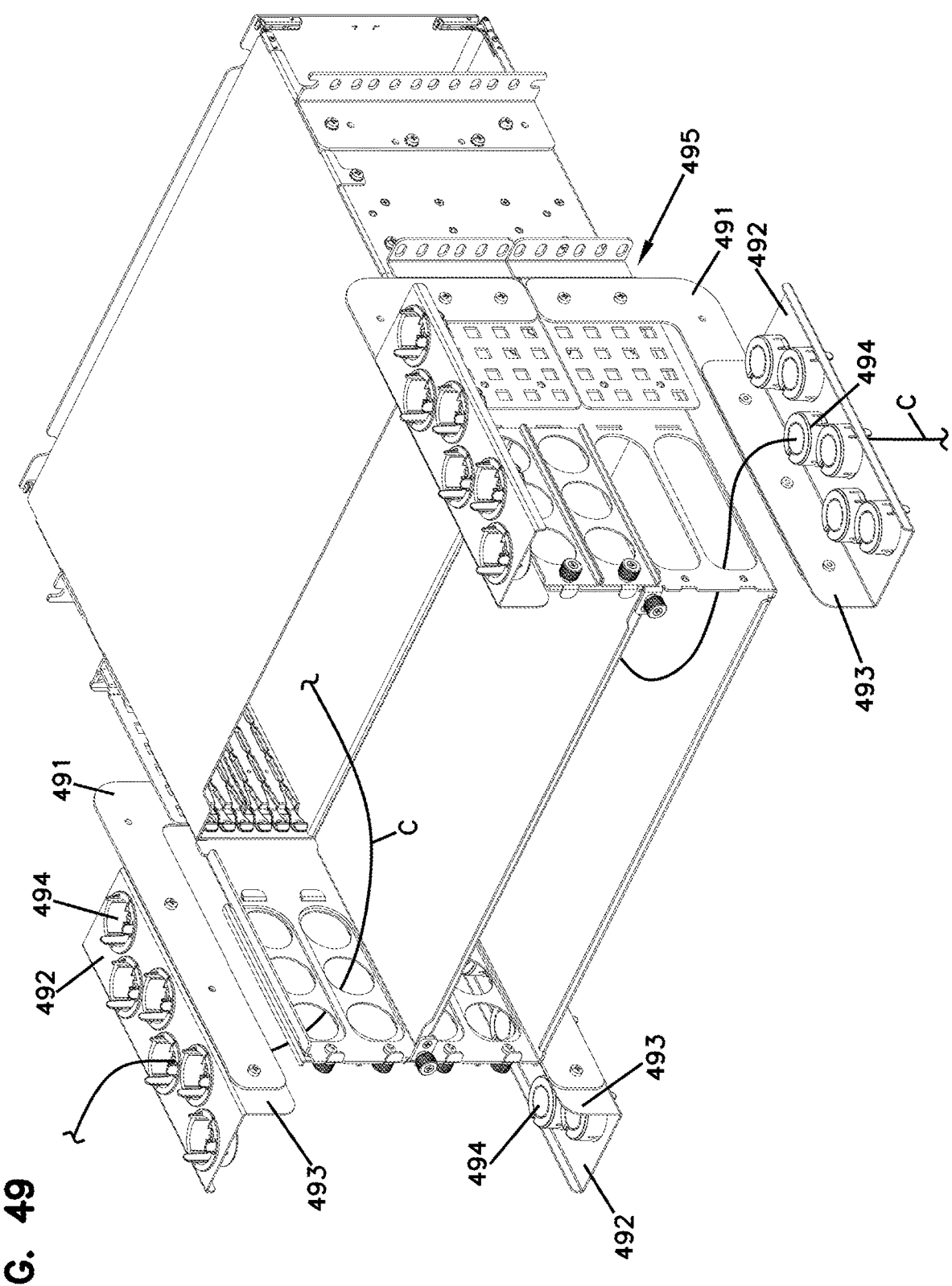
FIG. 49 is a perspective view of the chassis, cable manager, and cable anchor platforms of FIG. 48 with the rack removed for ease in viewing.
Figure 50:
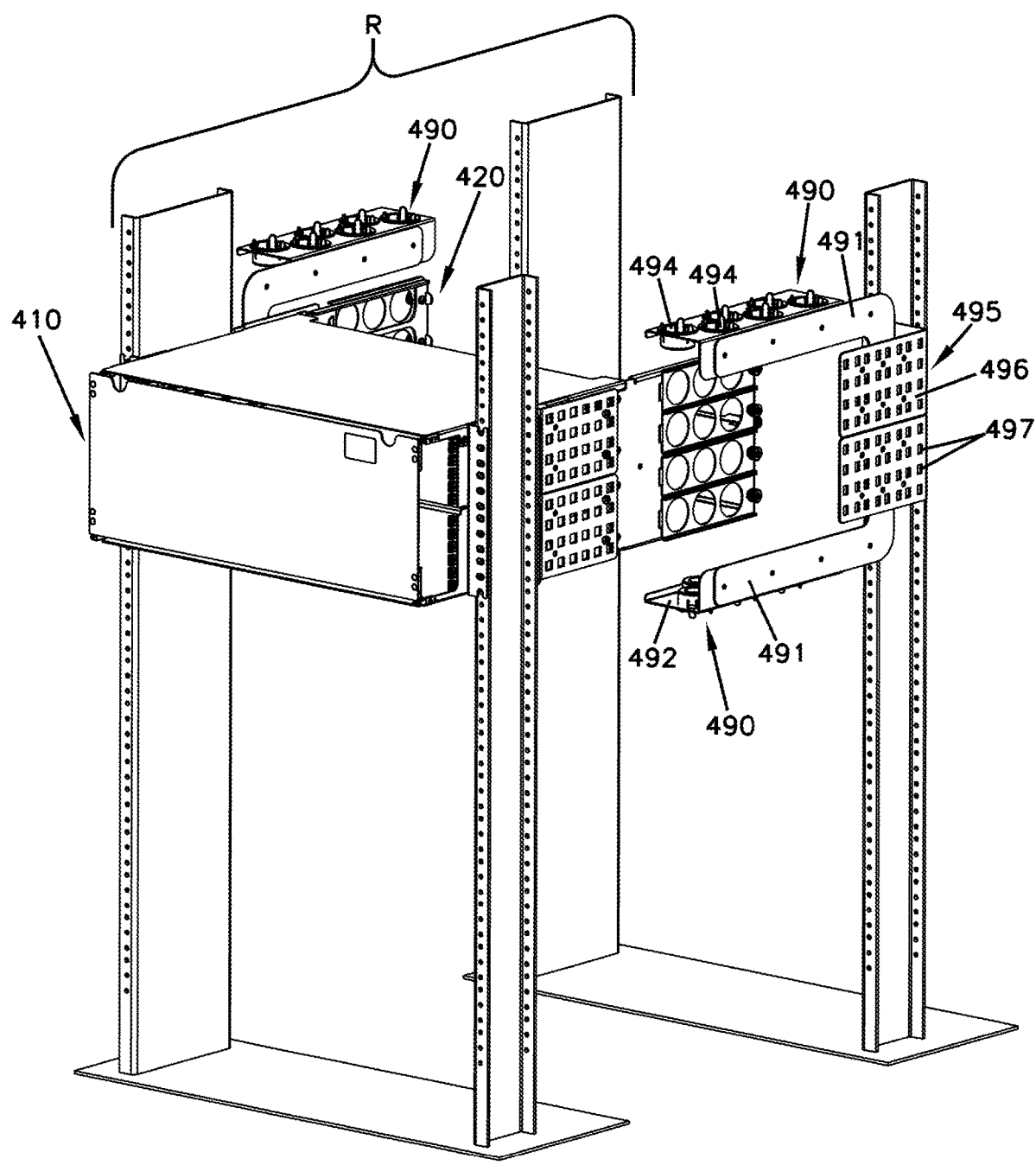
FIG. 50 is a perspective view of an example chassis and cable manager mounted to another example rack with example cable anchor platforms mounted to the rack.

Referring to FIGS. 48-50, one or more bracket arrangements 490 can be added to the chassis 410, the cable manager 420, or to the rack R to provide anchoring of the cables routed into the cable manager 420 at a location spaced from the cable manager 420. The bracket arrangement 490 includes a bracket 491 and a platform 492 that couples to the bracket 491 (e.g. using flange 493). The bracket 491 secures to the chassis 410, cable manager 420, or rack R to support the platform 492. The platform 492 holds one or more glands 440, adapters, or port apertures. Accordingly, cables routed to the cable manager 420 can be secured to the platform 492 instead of being directly secured to the cable manager 420 (as in FIG. 35).

In certain implementations, the platform 492 can be oriented so that the glands 440, adapters, or port apertures face in a different direction from the sidewalls 422 of the cable manager 420. In the example shown, the platform 492 is generally perpendicular from the sidewalls 422 of the cable manager 420. Spacing and re-orienting the platform 492 from the cable manager 420 may facilitate cable routing through the tight confines of the rack R. Cable anchors, fanouts, and other cable transition structures can be located away from the cable manager sidewalls 422.

In certain implementations, multiple platforms 492 can be secured at the chassis 410, cable manager 420, or rack R. In certain examples, multiple platforms 492 can be secured at a side of the chassis 410, cable manager 420, or rack R. In an example, one platform 492 can be suspended above a sidewall 422 of the cable manager 420 and another platform 492 can be suspended below the sidewall 422 of the cable manager 420 (e.g., see FIG. 49).

In some implementations, the bracket 491 can be attached to the chassis 410 or cable manager 420 (see FIG. 48). In other implementations, the bracket 491 can be attached to the rack R or other framework structure adjacent the chassis 410 (see FIG. 50). For example, a bracket 491 can be attached to an aperture-defining bracket 495 coupled to the rack R or other framework structure. In certain implementations, the bracket 491 is L-shaped. Other shapes are possible.

In certain implementations, cables can be secured to the aperture-defining bracket 495 by one or more cable ties or other fasteners. For example, a cable tie can be threaded through one or more of the apertures 497 defined in a panel 496 of the aperture-defining bracket 495. In certain examples, each bracket 495 can include a flange 498 extending from the panel 496. The flange 496 may aid in otherwise securing the bracket 495 to the chassis 410, cable manager 420, or rack R instead of to the platform 492. In the example shown, the aperture-defining bracket 495 is L-shaped. Other shapes are possible.

Figure 51:
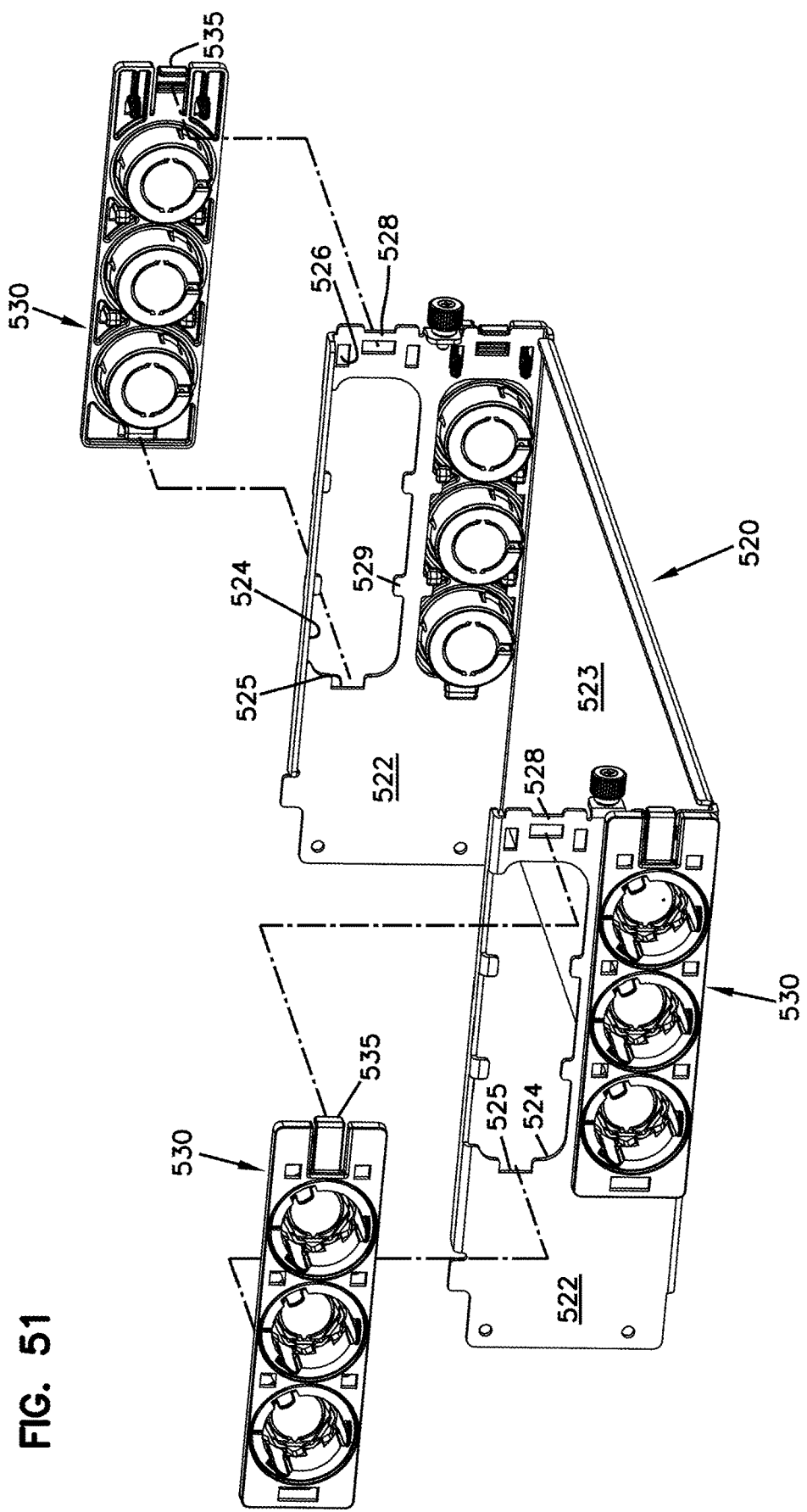
FIG. 51 is a perspective view of an example cable manager with two port modules exploded away from sidewalls of the cable manager for ease in viewing.

Another example cable manager 520 is shown in FIG. 51. The example cable manager 520 includes a bottom panel 523 extending between two sidewalls 522. Each sidewall 522 defines an aperture 524. In certain examples, each sidewall 522 defines a plurality of apertures 524. In the example shown, each sidewall 522 defines two apertures 524. In some implementations, the apertures 524 define the cable ports. In other implementations, port modules 530 can be mounted to the sidewalls 522 over the apertures 524.

Figure 52:
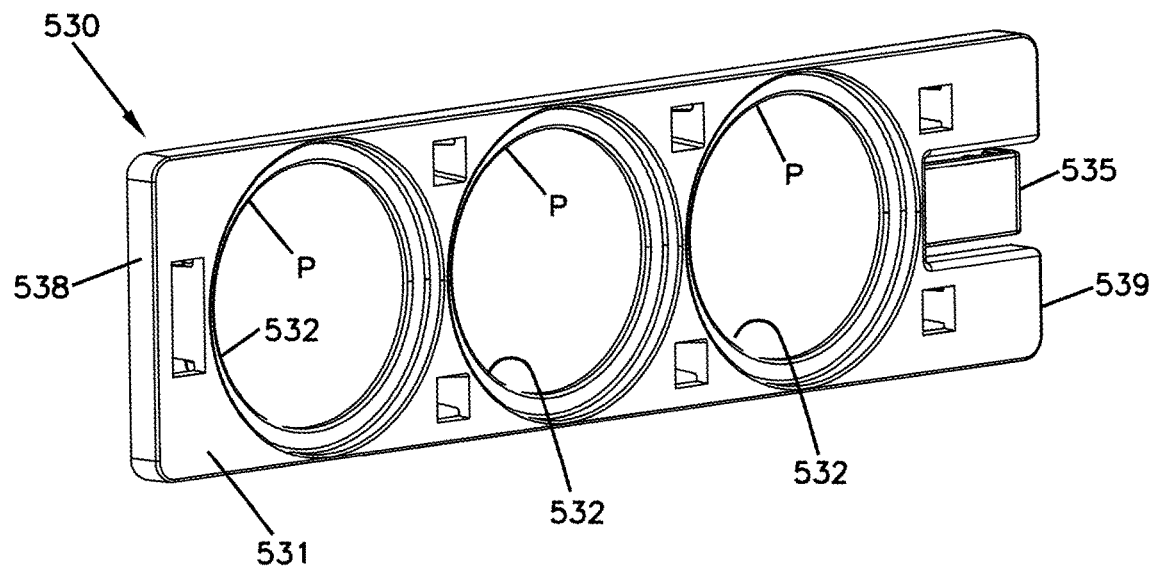
FIG. 52 is a perspective view of one of the port modules of FIG. 51.
Figure 53:
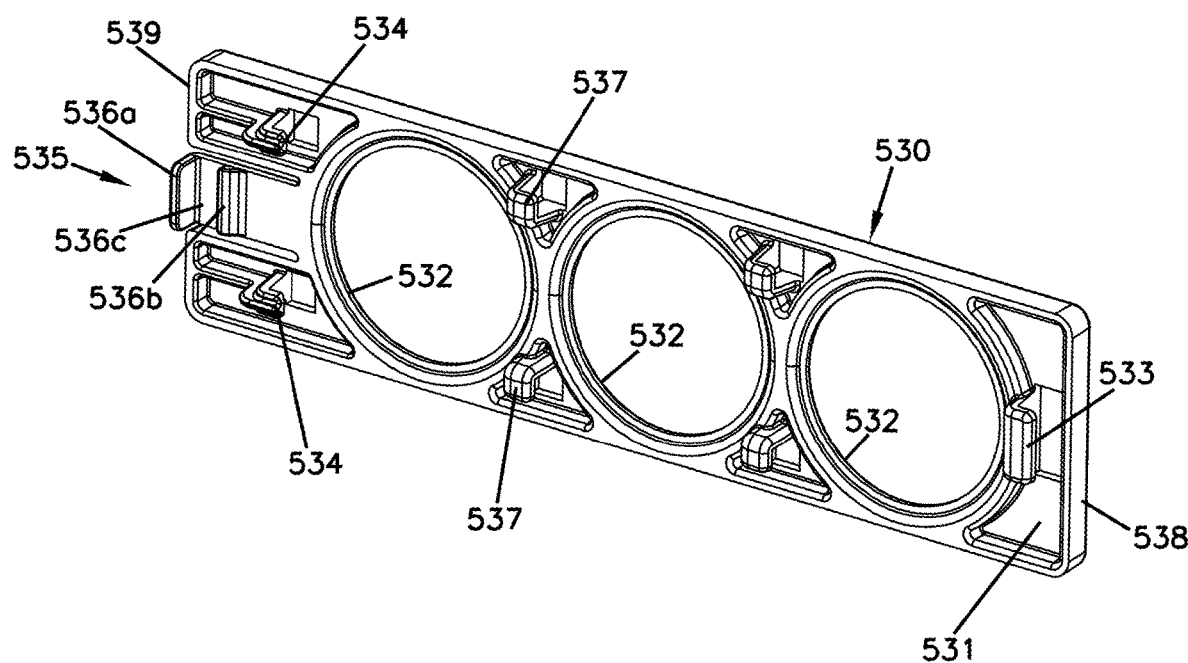
FIG. 53 is another perspective view of the port module of FIG. 52.

FIGS. 52 and 53 illustrate one example port module 530 configured to mount to one of the sidewalls 522 across one of the apertures 524. Each port module 530 defines one or more cable ports P. The port module 530 includes a panel 531 defining one or more apertures 532. Each aperture 532 either defines a cable port P or is configured to receive a gland, adapter, or other structure that defines the cable port P. In the example shown, the port module 530 defines three apertures 532. In other examples, the port modules 530 can have any desired number of apertures (e.g., one, two, four, six, etc.).

In certain implementations, the port module 530 is elongated between a first end 538 and a second end 539. In certain examples, the apertures 532 are disposed in a row extending between the first and second ends 538, 539. In certain examples, the apertures 532 may be arranged in two rows. In certain examples, the apertures 532 may be arranged in staggered rows. In other examples, the apertures 532 may be arranged in any desired configuration.

The port module 530 is configured to removably secure to a sidewall 522 of the cable manager 520. In certain implementations, fastening structure is disposed at the first and second ends 538, 539 of the port module 530. In some implementations, a first tab 533 is disposed at the first end 538 of the panel 531 and a second tab 535 is disposed at the second end 539 of the panel 531. In certain examples, the second tab 535 is more flexible than the first tab 533. In certain examples, the second tab 535 includes a first stop 536a, a second stop 536b, and a space 536c defined therebetween.

In certain examples, fingers 534 also can be disposed towards the second end 539 of the port module 530. The fingers 534 are more rigid than the second tab 535. In certain examples, abutment members 537 also can be disposed on the panel 531. In the example shown, the abutment members 537 are located between the fingers 534 and the first tab 533.

As shown in FIG. 51, the first tab 533 of the port module 530 can be inserted into a notch 525 defined at the aperture 524. The second tab 535 couples to the sidewall 522 to removably secure the port module 530 to the sidewall 522. For example, the second tab flexes to receive a webbing 528 in the space 536c between the first and second stop members 536a, 536b. In certain examples, the sidewall 522 defines a notch to accommodate the first stop member 536a and an opening in which to receive the second stop member 536b. The portion of the sidewall 522 between the notch and the opening forms the webbing 528.

In certain examples, the sidewall 522 also defines apertures 526 sized to receive the fingers 534. For example, the fingers 534 can extend through the apertures 526 to hook onto the sidewall 522. In certain examples, the sidewall 522 includes tabs 529 that extend into each aperture 524. The abutment members 537 of the port module 530 can engage the tabs 529 to further secure the port module 530 at the aperture 524 of the sidewall 522.

In an example, the port module 530 is aligned with the aperture 524 so that the first tab 533 aligns with the notch 525, the fingers 534 align with the apertures 526, and the abutment members 537 are located to one side of the tabs 529. The port module 530 is moved relative to the sidewall 522 so that the first tab 533 presses against the notch 525, the fingers 534 hook over the sidewall 522 at the apertures 526, the abutment members 537 engage the tabs 529, and the second tab 535 snaps over the webbing 528.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A termination panel system comprising:
a chassis defining an interior, the chassis extending laterally between opposite first and second sidewalls and having a depth extending between a front and a rear;
a tray configured to fit within the interior of the chassis, the tray having a second width extending between opposite first and second sides, the first side facing the first sidewall and the second side facing the second sidewall when the tray is disposed within the chassis, the tray being configured to move along the depth of the chassis between a first position and a second position;
a latching arrangement carried by the tray at the first side, the latching arrangement including:
a plurality of stop members disposed along the depth of the chassis, each of the stop members being resiliently biased outwardly from the tray to an extended position, each of the stop members defining a first part of a respective camming arrangement; and
an actuator bar that extends over the tray along the depth of the chassis and extends forwardly of the tray to define a handle, the actuator bar being movable relative to the tray along the depth of the chassis between a neutral position and an actuated position that is forward of the neutral position, the actuator bar being biased to the neutral position, the actuator bar defining a second part of the camming arrangement of each stop member, wherein movement of the actuator bar from the neutral position to the actuated position retracts a first of the stop members via the respective camming arrangement and does not retract a second of the stop members.

2. The termination panel system of claim 1, wherein the actuated position is a forward actuated position, wherein the actuator bar also is configured to move relative to the tray along the depth of the chassis between the neutral position and a rearward actuated position, and wherein movement of the actuator bar from the neutral position to the rearward actuated position retracts the second stop member via the respective camming arrangement.

3. The termination panel system of claim 2, wherein the movement of the actuator bar from the neutral position to the rearward actuated position also retracts the first stop member.

4. The termination panel system of claim 1, wherein the first stop member is located rearward of the second stop member along the depth of the chassis.

5. The termination panel system of claim 1, wherein one of the first and second parts of each camming arrangement includes a cam track and the other of the first and second parts of each camming arrangement includes a cam follower.

6. The termination panel system of claim 5, wherein each second part of the camming arrangements includes the respective cam track and wherein each first part of the camming arrangements includes the respective cam follower that rides along the respective cam track.

7. The termination panel system of claim 1, wherein the actuator bar is biased to the neutral position by a first spring separate from the resilient bias of the stop members.

8. The termination panel system of claim 1, wherein the latching arrangement includes a lower surface and an upper surface disposed on the tray, wherein the stop members are disposed between the lower and upper surfaces.

9. The termination panel system of claim 1, wherein the actuator bar defines an elongate opening through which a fastener extends.

10. The termination panel system of claim 1, wherein the first stop member has a different shape than the second stop member.

11. The termination panel system of claim 1, wherein the first stop member is a separate piece from the second stop member.

12. The termination panel system of claim 1, wherein a guide arrangement is supported by the first sidewall, the guide arrangement defining first and second cavities, wherein the first cavity aligns with the first stop member and the second cavity aligns with the second stop member when the tray is disposed within the chassis at the first position.

13. The termination panel system of claim 12, wherein the first cavity includes a forwardly-extending ramp.

14. The termination panel system of claim 12, wherein the first and second cavities form a first set of a plurality of sets of cavities disposed at the first sidewall of the chassis, each of the sets of cavities being configured to receive a respective latching arrangement of a respective tray mounted within the chassis.

15. The termination panel system of claim 12, wherein the tray and the latching arrangement form a tray arrangement that engages with the guide arrangement along a rail and track mechanism that extends along the depth of the chassis.

16. The termination panel system of claim 15, wherein the guide arrangement includes the rail and the tray arrangement carries the track.

17. The termination panel system of claim 1, wherein the actuator bar has a rearward end spaced forwardly from a rearward end of the tray.

18. The termination panel system of claim 1, wherein the tray carries a plurality of optical adapters when the tray moves relative to the chassis.

19. The termination panel system of claim 18, wherein the optical adapters are part of an adapter module having a multi-fiber rear adapter and a plurality of front adapters.

20. The termination panel system of claim 1, further comprising a plurality of fiber retainer members extending forwardly of the tray in a row, wherein the handle is aligned with the row.

* * * * *